(12) United States Patent
Yoshii et al.

(10) Patent No.: US 11,822,240 B2
(45) Date of Patent: Nov. 21, 2023

(54) RESIST COMPOSITION AND METHOD OF FORMING RESIST PATTERN

(71) Applicant: TOKYO OHKA KOGYO CO., LTD., Kawasaki (JP)

(72) Inventors: Yasuhiro Yoshii, Kawasaki (JP); Yosuke Suzuki, Kawasaki (JP); Yoichi Hori, Kawasaki (JP); Takahiro Kojima, Kawasaki (JP); Mari Murata, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 121 days.

(21) Appl. No.: 17/121,130

(22) Filed: Dec. 14, 2020

(65) Prior Publication Data
US 2021/0191262 A1    Jun. 24, 2021

(30) Foreign Application Priority Data

Dec. 19, 2019 (JP) .................................. 2019-229771

(51) Int. Cl.
*G03F 7/004* (2006.01)
*G03F 7/039* (2006.01)
*G03F 7/038* (2006.01)

(52) U.S. Cl.
CPC .......... *G03F 7/0045* (2013.01); *G03F 7/0382* (2013.01); *G03F 7/0397* (2013.01)

(58) Field of Classification Search
CPC .................................................. G03F 7/0045
See application file for complete search history.

(56) References Cited

U.S. PATENT DOCUMENTS

| | | | | |
|---|---|---|---|---|
| 5,736,296 A | * | 4/1998 | Sato ...................... | G03F 7/0045 430/905 |
| 5,817,444 A | * | 10/1998 | Sato ...................... | G03F 7/0045 430/170 |
| 5,928,837 A | * | 7/1999 | Sato ...................... | G03F 7/0045 430/921 |
| 5,948,589 A | * | 9/1999 | Sato ........................ | G03F 7/039 430/905 |
| 2005/0170276 A1 | * | 8/2005 | Nitta ...................... | G03F 7/0392 430/270.1 |
| 2016/0108250 A1 | * | 4/2016 | Tamura ................... | B32B 27/20 522/42 |
| 2018/0239255 A1 | * | 8/2018 | Hirano ...................... | G03F 7/36 |

FOREIGN PATENT DOCUMENTS

| JP | A-09-006002 | 1/1997 |
|---|---|---|
| JP | 2017-198999 A | 11/2017 |

* cited by examiner

*Primary Examiner* — Chanceity N Robinson
*Assistant Examiner* — Anna Malloy
(74) *Attorney, Agent, or Firm* — Knobbe, Martens, Olson & Bear LLP

(57) ABSTRACT

A resist composition that generates an acid upon exposure and whose solubility in a developing solution is changed by action of an acid, the resist composition containing a base material component whose solubility in a developing solution is changed by action of an acid, and a compound represented by General Formula (e1) in which $Rd^{01}$ represents a monovalent organic group and $Rd^{02}$ represents a single bond or a divalent linking group (e1)

$$Rd^{01}-C\equiv C-Rd^{02}-\underset{\underset{O}{\parallel}}{C}-OH$$

6 Claims, No Drawings

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2019-229771, filed on Dec. 19, 2019, the content of which is incorporated herein by reference.

Description of Related Art

In recent years, in the production of semiconductor elements and liquid crystal display elements, with advances in lithography techniques, rapid progress in the field of pattern miniaturization has been achieved. Typically, these miniaturization techniques involve shortening the wavelength (increasing the energy) of the light source for exposure.

Resist materials for use with these types of light sources for exposure require lithography characteristics such as a high resolution capable of reproducing patterns of minute dimensions, and a high level of sensitivity to these types of light sources for exposure.

As a resist material that satisfies these requirements, a chemical amplification-type resist composition which contains a base material component whose solubility in a developing solution is changed by action of an acid, and an acid generator component that generates an acid upon exposure has been conventionally used.

In the chemical amplification-type resist composition, it has been proposed to add an organic carboxylic acid such as salicylic acid for the purpose of improving lithography characteristics and the like.

For example, Japanese Unexamined Patent Application, First Publication No. 2017-198999 discloses a resist composition containing a resin component whose solubility is changed in a developing solution by action of an acid, an acid generator component, an acid diffusion-controlling agent, a fluorine additive component, and salicylic acid.

SUMMARY OF THE INVENTION

Recently, with further advances in lithography techniques, rapid progress in the field of pattern miniaturization is being achieved together with the expansion of application fields. Along with this progress, in a case of manufacturing a semiconductor element or the like, a technique is required which is capable of forming a fine pattern having a pattern width dimension of less than 100 nm in a good shape. As the resist pattern dimensions become smaller as described above, the resist composition is required to have further improved lithography characteristics such as roughness and a pattern shape. However, in the conventional resist composition as disclosed in Japanese Unexamined Patent Application, First Publication No. 2017-198999, there is room for improvement in lithography characteristics.

The present invention has been made in consideration of the above circumstances, and an object of the present invention is to provide a resist composition excellent in lithography characteristics such as roughness and a pattern shape, and a method of forming a resist pattern by using the resist composition.

In order to achieve the above-described object, the present invention employs the following configurations.

That is, the first aspect of the present invention is a resist composition which generates an acid upon exposure and whose solubility in a developing solution is changed by action of an acid, the resist composition containing a base material component (A) whose solubility in a developing solution is changed by action of an acid, and a compound (E1) represented by General Formula (e1).

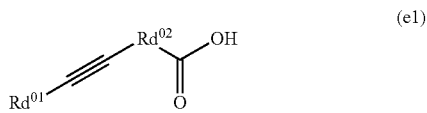

[In the formula, $Rd^{01}$ represents a monovalent organic group, $Rd^{02}$ represents a single bond or a divalent linking group.]

The second aspect of the present invention is a method of forming a resist pattern, including a step of forming a resist film on a support using the resist composition according to the first aspect, a step of exposing the resist film, and a step of developing the exposed resist film to form a resist pattern.

According to the present invention, it is possible to provide a resist composition excellent in lithography characteristics such as roughness and a pattern shape, and a method of forming a resist pattern by using the resist composition.

DETAILED DESCRIPTION OF THE INVENTION

In the present specification and the scope of the present patent claims, the term "aliphatic" is a relative concept used with respect to the term "aromatic" and defines a group or compound that has no aromaticity.

The term "alkyl group" includes a monovalent saturated hydrocarbon group that is linear, branched, or cyclic, unless otherwise specified. The same applies to the alkyl group in an alkoxy group.

The term "alkylene group" includes a divalent saturated hydrocarbon group that is linear, branched, or cyclic, unless otherwise specified.

Examples of the "halogen atom" include a fluorine atom, a chlorine atom, a bromine atom, and an iodine atom. The term "constitutional unit" means a monomer unit (monomeric unit) that contributes to the formation of a high-molecular-weight compound (a resin, a polymer, or a copolymer).

In a case where "may have a substituent" is described, both of a case where a hydrogen atom (—H) is substituted by a monovalent group and a case where a methylene (—CH$_2$—) group is substituted by a divalent group are included.

The term "exposure" is used as a general concept that includes irradiation with any form of radiation.

The term "acid-decomposable group" indicates a group in which at least a part of a bond in the structure of the acid-decomposable group can be cleaved by action of an acid.

Examples of the acid-decomposable group having a polarity which is increased by action of an acid include groups which are decomposed by action of an acid to generate a polar group.

Examples of the polar group include a carboxy group, a hydroxyl group, an amino group, and a sulfo group (—SO$_3$H).

More specific examples of the acid-decomposable group include a group in which the above-described polar group has been protected with an acid-dissociable group (such as a group in which a hydrogen atom of the OH-containing polar group has been protected with an acid-dissociable group).

The "acid-dissociable group" indicates both (i) a group in which a bond between the acid-dissociable group and an atom adjacent to the acid-dissociable group can be cleaved by action of an acid; and (ii) a group in which a part of bonds are cleaved by action of an acid, and then a decarboxylation reaction occurs, thereby cleaving the bond between the acid-dissociable group and the atom adjacent to the acid-dissociable group.

It is necessary that the acid-dissociable group that constitutes the acid-decomposable group be a group which exhibits a lower polarity than the polar group generated by the dissociation of the acid-dissociable group. Thus, in a case where the acid-dissociable group is dissociated by action of an acid, a polar group exhibiting a higher polarity than the acid-dissociable group is generated, thereby increasing the polarity. As a result, the polarity of the entire component (A1) is increased. By the increase in the polarity, the solubility in a developing solution relatively changes. The solubility in a developing solution is increased in a case where the developing solution is an alkali developing solution, whereas the solubility in an organic developing solution is decreased in a case where the developing solution is an alkali developing solution.

The "base material component" is an organic compound having a film-forming ability. The organic compounds used as the base material component are roughly classified into a non-polymer and a polymer. As the non-polymer, those having a molecular weight of 500 or more and less than 4,000 are usually used. Hereinafter, a "low-molecular-weight compound" refers to a non-polymer having a molecular weight of 500 or more and less than 4,000. As the polymer, those having a molecular weight of 1,000 or more are usually used. Hereinafter, a "resin", a "high-molecular-weight compound", or a "polymer" refers to a polymer having a molecular weight of 1,000 or more. As the molecular weight of the polymer, a polystyrene-equivalent mass-average molecular weight determined by gel permeation chromatography (GPC) is used.

A "constitutional unit derived from" means a constitutional unit that is formed by the cleavage of a multiple bond between carbon atoms, for example, an ethylenic double bond.

In the "acrylic acid ester", the hydrogen atom bonded to the carbon atom at the α-position may be substituted with a substituent. The substituent ($R^{\alpha x}$) that is substituted for the hydrogen atom bonded to the carbon atom at the α-position is an atom other than a hydrogen atom or a group. Further, itaconic acid diester in which the substituent (Ra) is substituted with a substituent having an ester bond or α-hydroxy-acryl ester in which the substituent (Ra) is substituted with a hydroxyalkyl group or a group obtained by modifying a hydroxyl group thereof can be mentioned as an acrylic acid ester. A carbon atom at the α-position of acrylic acid ester indicates the carbon atom bonded to the carbonyl group of acrylic acid, unless otherwise specified.

Hereinafter, acrylic acid ester in which the hydrogen atom bonded to the carbon atom at the α-position is substituted with a substituent is also referred to as α-substituted acrylic acid ester".

The term "derivative" includes a compound in which the hydrogen atom at the α-position of the object compound has been substituted with another substituent such as an alkyl group or a halogenated alkyl group; and derivatives thereof. Examples of the derivatives thereof include: a derivative in which the hydrogen atom of the hydroxyl group of the object compound in which the hydrogen atom at the α-position may be substituted with an organic group; and a derivative in which a substituent other than a hydroxyl group is bonded to the object compound in which the hydrogen atom at the α-position may be substituted with a substituent. The α-position refers to the first carbon atom adjacent to the functional group unless otherwise specified.

Examples of the substituent that is substituted for the hydrogen atom at the α-position of hydroxystyrene include the same group as $R^{\alpha x}$.

In the present specification and the scope of the present patent claims, asymmetric carbons may be present or enantiomers or diastereomers may be present depending on the structures of the chemical formula. In that case, these isomers are represented by one chemical formula. These isomers may be used alone or in the form of a mixture.

(Resist Composition)

The resist composition according to the present embodiment is a resist composition which generates an acid upon exposure and whose solubility in a developing solution is changed by action of an acid.

Such a resist composition contains a base material component (A) (hereinafter, also referred to as a "component (A)") whose solubility in a developing solution is changed by action of an acid, and a compound (E1) (hereinafter, also referred to as a "component (E1)") represented by General Formula (e1).

In a case where a resist film is formed using the resist composition according to the present embodiment and the formed resist film is subjected to selective exposure, an acid is generated at the exposed portion of the resist film, and the generated acid acts on the component (A) to change the solubility of the component (A) in a developing solution, whereas the solubility of the component (A) in a developing solution is not changed at the unexposed portion, thereby generating the difference in solubility in the developing solution between the exposed portion and the unexposed portion of the resist film. Therefore, by subjecting the resist film to development, the exposed portion of the resist film is dissolved and removed to form a positive-tone resist pattern in a case where the resist composition is a positive-tone type, whereas the unexposed portion of the resist film is dissolved and removed to form a negative-tone resist pattern in a case where the resist composition is a negative-tone type.

In the present specification, a resist composition which forms a positive-tone resist pattern by dissolving and removing the exposed portion of the resist film is called a positive-tone resist composition, and a resist composition which forms a negative-tone resist pattern by dissolving and removing the unexposed portion of the resist film is called a negative-tone resist composition. The resist composition according to the present embodiment may be a positive-tone resist composition or a negative-tone resist composition. Further, in the formation of a resist pattern, the resist composition according to the present embodiment can be applied to an alkali developing process using an alkali developing solution in the developing treatment, or a solvent developing process using a developing solution containing an organic solvent (organic developing solution) in the developing treatment.

The resist composition according to the present embodiment has a function of generating an acid upon exposure, the component (A) may generate an acid upon exposure, and an additive component that is separately blended from the component (A) may generate an acid upon exposure.

Specifically, the resist composition according to the present embodiment may (1) further contain an acid generator component (B) (hereinafter, referred to as a "component (B)") that generates an acid upon exposure; (2) have a component (A) that generates an acid upon exposure; and (3) have a component (A) that generates an acid upon exposure and further contains component (B). That is, in the cases of (2) and (3) described above, the component (A) becomes a "base material component which generates an acid upon exposure and has solubility in a developing solution, which is changed by action of an acid". In a case where the component (A) is a base material component which generates an acid upon exposure and has solubility in a developing solution, which is changed by action of an acid, it is preferable that the component (A1) described below be a high-molecular-weight compound which generates an acid upon exposure and has solubility in a developing solution, which is changed by action of an acid. As such a high-molecular-weight compound, a resin having a constitutional unit that generates an acid upon exposure can be used. As the constitutional unit that generates an acid upon exposure, a conventionally known constitutional unit can be used. Among them, the resist composition according to the present embodiment is particularly preferably the case of the above (1).

<Component (A)>

As the component (A) of the resist composition according to the present embodiment, a resin component (A1) (hereinafter, also referred to as a "component (A1)") whose solubility in a developing solution is changed by action of an acid, can be included. In the alkali developing process and the solvent developing process, since the polarity of the base material component before and after the exposure is changed by using the component (A1), an excellent development contrast can be obtained.

As the component (A), at least the component (A1) is used, and another high-molecular-weight compound and/or a low-molecular-weight compound may be used in combination with the component (A1).

In a case of applying an alkali developing process, a base material component containing the component (A1) is substantially insoluble in an alkali developing solution prior to exposure, but in a case where an acid is generated from the component (B) upon exposure, the action of this acid causes an increase in the polarity of the base material component, thereby increasing the solubility of the base material component in an alkali developing solution. Therefore, in the formation of a resist pattern, by performing selective exposure of a resist film formed by applying the resist composition onto a support, the exposed portion of the resist film changes from an insoluble state to a soluble state in an alkali developing solution, whereas the unexposed portion of the resist film remains insoluble in an alkali developing solution, and thus a positive-tone resist pattern is formed by alkali developing.

Meanwhile, in a case of a solvent developing process, the base material component containing the component (A1) exhibits high solubility in an organic developing solution prior to exposure, and in a case where an acid is generated from the component (B) upon exposure, the polarity of the component (A1) is increased by the action of the generated acid, thereby decreasing the solubility of the component (A1) in an organic developing solution. Therefore, in the formation of a resist pattern, by performing selective exposure of a resist film formed by applying the resist composition onto a support, the exposed portion of the resist film changes from a soluble state to an insoluble state in an organic developing solution, whereas the unexposed portion of the resist film remains soluble and does not change, thereby a contrast between the exposed portion and the unexposed portion can be obtained, and thus a negative-tone resist pattern is formed by developing in the organic developing solution.

In the resist composition according to the present embodiment, the component (A) may be used alone or in a combination of two or more kinds thereof.

In regard to component (A1) The component (A1) is a resin component whose solubility in a developing solution is changed by action of an acid. The component (A1) preferably has a constitutional unit (a1) that includes an acid-decomposable group having a polarity which is increased by action of an acid.

The component (A1) may have other constitutional units as necessary in addition to the constitutional unit (a1).

<<Constitutional Unit (a1)>>

The constitutional unit (a1) is a constitutional unit that contains an acid-decomposable group having a polarity which is increased by action of an acid.

Examples of the acid-dissociable group are the same as those which have been proposed as acid-dissociable groups for the base resin for a chemical amplification-type resist composition.

Specific examples of acid-dissociable groups of the base resin for a conventional chemical amplification-type resist composition contains an "acetal-type acid-dissociable group", a "tertiary alkyl ester-type acid-dissociable group", and a "tertiary alkyloxycarbonyl acid-dissociable group" described below.

Acetal-Type Acid-Dissociable Group:

Examples of the acid-dissociable group for protecting a carboxy group or a hydroxyl group as a polar group include the acid-dissociable group represented by General Formula (a1-r-1) shown below (hereinafter, also referred to as an "acetal-type acid-dissociable group").

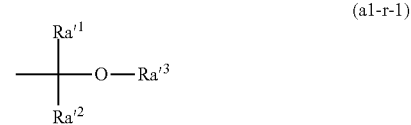

(a1-r-1)

[In the formula, $Ra'^1$ to $Ra'^2$ represent hydrogen atoms or alkyl groups. $Ra'^3$ represents a hydrocarbon group, and $Ra'^3$ may be bonded to $Ra'^1$ or $Ra'^2$ to form a ring.]

In Formula (a1-r-1), it is preferable that at least one of $Ra'^1$ and $Ra'^2$ represent a hydrogen atom and more preferable that both of $Ra'^1$ and $Ra'^2$ represent hydrogen atoms.

In a case where $Ra'^1$ or $Ra'^2$ represents an alkyl group, examples of the alkyl group include the same alkyl group as that mentioned as the substituent which may be bonded to the carbon atom at the α-position in the description on the α-substituted acrylic acid ester, and the alkyl group preferably has 1 to 5 carbon atoms. Specific examples thereof preferably include a linear or branched alkyl group. More specific examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In Formula (a1-r-1), examples of the hydrocarbon group as $Ra^{t3}$ include a linear or branched alkyl group and a cyclic hydrocarbon group.

The linear alkyl group preferably has 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group preferably has 3 to 10 carbon atoms and more preferably 3 to 5 carbon atoms. Specific examples thereof include an isopropyl group, an isobutyl group, a tert-butyl group, an isopentyl group, a neopentyl group, a 1,1-diethylpropyl group, and a 2,2-dimethylbutyl group. Among these, an isopropyl group is preferable.

In a case where $Ra^{t3}$ represents a cyclic hydrocarbon group, the cyclic hydrocarbon group may be an aliphatic hydrocarbon group or an aromatic hydrocarbon group and may be a polycyclic group or a monocyclic group.

The aliphatic hydrocarbon group which is a monocyclic group is preferably a group in which one hydrogen atom has been removed from a monocycloalkane. The monocycloalkane preferably has 3 to 6 carbon atoms, and specific examples thereof include cyclopentane and cyclohexane.

The aliphatic hydrocarbon group which is a polycyclic group is preferably a group in which one hydrogen atom has been removed from a polycycloalkane. The polycycloalkane preferably has 7 to 12 carbon atoms, and specific examples thereof include adamantane, norbornane, isobornane, tricyclodecane, and tetracyclododecane.

In a case where the cyclic hydrocarbon group as $Ra^{t3}$ is an aromatic hydrocarbon group, the aromatic hydrocarbon group is a hydrocarbon group having at least one aromatic ring.

The aromatic ring is not particularly limited as long as it is a cyclic conjugated system having (4n+2) 1 electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon ring have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group as $Ra^{t3}$ include a group in which one hydrogen atom has been removed from the above-described aromatic hydrocarbon ring or aromatic heterocyclic ring (an aryl group or a heteroaryl group); a group in which one hydrogen atom has been removed from an aromatic compound having two or more aromatic rings (biphenyl, fluorene or the like); and a group in which one hydrogen atom of the above-described aromatic hydrocarbon ring or aromatic heterocyclic ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic heterocyclic ring is preferably in a range of 1 to 4, more preferably 1 or 2, and particularly preferably 1.

The cyclic hydrocarbon group in $Ra^{t3}$ may have a substituent. Examples of the substituent include $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$, and $-R^{P2}-COOH$ (hereinafter, these substituents are also collectively referred to as "$Ra^{x5}$"). Here, $R^{P1}$ represents a monovalent chain-like saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. In addition, $R^{P2}$ represents a single bond, a divalent chain-like saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. However, part or all of the hydrogen atoms included in the chain-like saturated hydrocarbon group, the aliphatic cyclic saturated hydrocarbon group, and the aromatic hydrocarbon group of $R^{P1}$ and $R^{P2}$ may be substituted with fluorine atoms. In the aliphatic cyclic hydrocarbon group, one or more of the above-described substituents may be included as a single kind, or one or more of the above-described substituents may be included as a plurality of kinds.

Examples of the monovalent chain-like saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include: monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo[5.2.1.02,6]decanyl group, a tricyclo [3.3.1.13,7]decanyl group, a tetracyclo [6.2.1.13,6.02,7]dodecanyl group, and an adamantyl group.

Examples of the monovalent aromatic hydrocarbon group having 6 to 30 carbon atoms include a group in which one hydrogen atom has been removed from an aromatic hydrocarbon ring such as benzene, biphenyl, fluorene, naphthalene, anthracene, or phenanthrene.

In a case where $Ra^{t3}$ is bonded to $Ra^{t1}$ or $Ra^{t2}$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester-Type Acid-Dissociable Group:

Examples of the acid-dissociable group for protecting the carboxy group as a polar group include the acid-dissociable group represented by General Formula (a1-r-2) shown below.

Among the acid-dissociable groups represented by Formula (a1-r-2), for convenience, a group which is constituted of alkyl groups is referred to as a "tertiary alkyl ester-type acid-dissociable group".

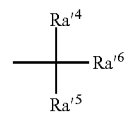

(a1-r-2)

[In the formula, $Ra^{r4}$ to $Ra^{r6}$ each represents a hydrocarbon group, and $Ra^{r5}$ and $Ra^{r6}$ may be bonded to each other to form a ring.]

Examples of the hydrocarbon group as $Ra^{r4}$ include a linear or branched alkyl group, a chain-like or cyclic alkenyl group, or a cyclic hydrocarbon group.

The linear or branched alkyl group and the cyclic hydrocarbon group (an aliphatic hydrocarbon group which is a monocyclic group, an aliphatic hydrocarbon group which is a polycyclic group, or an aromatic hydrocarbon group) as $Ra^{r4}$ are the same as those mentioned as $Ra^{r3}$ described above.

The chain-like or cyclic alkenyl group as $Ra^{r4}$ is preferably an alkenyl group having 2 to 10 carbon atoms.

Examples of the hydrocarbon group as $Ra^{r5}$ or $Ra^{r6}$ are the same as those mentioned above as $Ra^{r3}$.

In a case where $Ra^{r5}$ to $Ra^{r6}$ are bonded to each other to form a ring, groups represented by General Formula (a1-r2-1), General Formula (a1-r2-2), and General Formula (a1-r2-3) can be suitably mentioned.

Meanwhile, in a case where $Ra^{r4}$ to $Ra^{r6}$ are not bonded to each other and represent an independent hydrocarbon group, a group represented by General Formula (a1-r2-4) can be suitably mentioned.

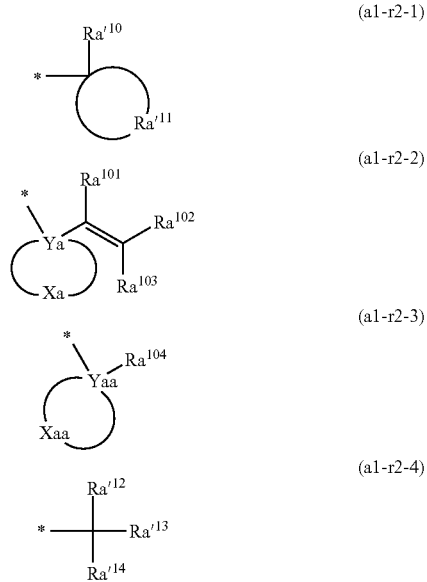

[In Formula (a1-r2-1), $Ra'^{10}$ represents a linear or branched alkyl group having 1 to 12 carbon atoms, a part of which may be substituted with a halogen atom or a hetero atom-containing group. $Ra'^{11}$ represents a group that forms an aliphatic cyclic group together with a carbon atom to which $Ra'^{10}$ is bonded. In Formula (a1-r2-2), Ya represents a carbon atom. Xa is a group that forms a cyclic hydrocarbon group together with Ya. Part or all of the hydrogen atoms which the cyclic hydrocarbon group has may be substituted. $Ra^{101}$ to $Ra^{103}$ each independently represents a hydrogen atom, a monovalent chain-like saturated hydrocarbon group having 1 to 10 carbon atoms, or a monovalent aliphatic cyclic saturated hydrocarbon group having 3 to 20 carbon atoms. Part or all of the hydrogen atoms which the chain-like saturated hydrocarbon group and the aliphatic cyclic saturated hydrocarbon group have may be substituted. Two or more of $Ra^{10}$ to $Ra^{103}$ may be bonded to each other to form a cyclic structure. In Formula (a1-r2-3), Yaa represents a carbon atom. Xaa is a group that forms an aliphatic cyclic group together with Yaa. $Ra^{104}$ represents an aromatic hydrocarbon group which may have a substituent. In Formula (a1-r2-4), $Ra'^{12}$ and $Ra'^{13}$ each independently represents a monovalent chain-like saturated hydrocarbon group having 1 to 10 carbon atoms or a hydrogen atom. Part or all of the hydrogen atoms which the chain-like saturated hydrocarbon group has may be substituted. $Ra'^{14}$ represents a hydrocarbon group which may have a substituent. * represents a bond.]

In Formula (a1-r2-1), $Ra'^{10}$ represents a linear or branched alkyl group having 1 to 12 carbon atoms, a part of which may be substituted with a halogen atom or a hetero atom-containing group.

The linear alkyl group as $Ra'^{10}$ has 1 to 12 carbon atoms, and preferably has 1 to 10 carbon atoms and particularly preferably 1 to 5 carbon atoms.

Examples of the branched alkyl group as $Ra'^{10}$ are the same as those mentioned above as $Ra^{r3}$.

A part of the alkyl group as $Ra^{10}$ may be substituted with a halogen atom or a hetero atom-containing group. For example, a part of the hydrogen atoms constituting the alkyl group may be substituted with a group containing a halogen atom or a hetero atom. Further, a part of carbon atoms (such as methylene group) constituting the alkyl group may be substituted with a hetero atom-containing group.

Examples of the hetero atom mentioned here include an oxygen atom, a sulfur atom, and a nitrogen atom. Examples of the hetero atom-containing group include —O—, —C(=O)—O—, —O—C(=O)—, —C(=O)—, —O—C(=O)—O—, —C(=O)—NH—, —NH—, —S—, —S(=O)$_2$—, and —S(=O)$_2$—O—.

In Formula (a1-r2-1), $Ra'^{11}$ (an aliphatic cyclic group that is formed together with the carbon atom to which $Ra'^{10}$ is bonded) is preferably the group mentioned as the aliphatic hydrocarbon group (alicyclic hydrocarbon group) which is a monocyclic group or a polycyclic group as $Ra^{r3}$ in Formula (a1-r-1). Among them, a monocyclic alicyclic hydrocarbon group is preferable, and specifically, a cyclopentyl group and a cyclohexyl group are more preferable, and a cyclopentyl group is still more preferable.

In Formula (a1-r2-2), examples of the cyclic hydrocarbon groups formed by Xa together with Ya include, for example, a group in which one or more hydrogen atoms are further removed from a cyclic monovalent hydrocarbon group (an aliphatic hydrocarbon group) as $Ra^{r3}$ in Formula (a1-r-1).

The cyclic hydrocarbon group which is formed by Xa together with Ya may have a substituent. Examples of these substituents include the same groups as the substituents which the cyclic hydrocarbon group as $Ra^{r3}$ may have.

In Formula (a1-r2-2), as $Ra^{101}$ to $Ra^{103}$, examples of the monovalent chain-like saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms, as $Ra^{101}$ to $Ra^{103}$, include: monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo[5.2.1.0²,⁶]decanyl group, a tricyclo[3.3.1.1³,⁷]decanyl group, a tetracyclo[6.2.1.1³,⁶.0²,⁷]dodecanyl group, and an adamantyl group.

Among them, $Ra^{101}$ to $Ra^{103}$ are preferably a hydrogen atom or a monovalent chain-like saturated hydrocarbon group having 1 to 10 carbon atoms, and among them, a hydrogen atom, a methyl group, and an ethyl group are more preferable, and a hydrogen atom is particularly preferable from the viewpoint of ease of synthesis.

Examples of the substituent which the chain-like saturated hydrocarbon group or the aliphatic cyclic saturated hydrocarbon group as $Ra^{101}$ to $Ra^{103}$ may have include the same groups as $Ra^{x5}$ described above.

Examples of the group including a carbon-carbon double bond generated by forming a cyclic structure, in which two or more of $Ra^{101}$ to $Ra^{103}$ are bonded to each other, include a cyclopentenyl group, a cyclohexenyl group, a methylcyclopentenyl group, a methylcyclohexenyl group, a cyclopentylideneethenyl group, and a cyclohexylideneethenyl group. Among these, a cyclopentenyl group, a cyclohexenyl group, and a cyclopentylideneethenyl group are preferable from the viewpoint of ease of synthesis.

In Formula (a1-r2-3), an aliphatic cyclic group that is formed by Xaa together with Yaa is preferably the group mentioned as the aliphatic hydrocarbon group which is a monocyclic group or a polycyclic group as $Ra^{r3}$ in Formula (a1-r-1).

In Formula (a1-r2-3), examples of the aromatic hydrocarbon group as $Ra^{104}$ include a group in which one or more hydrogen atoms have been removed from an aromatic hydrocarbon ring having 5 to 30 carbon atoms. Among them, $Ra^{104}$ is preferably a group obtained by removing one or more hydrogen atoms from an aromatic hydrocarbon ring having 6 to 15 carbon atoms, more preferably a group obtained by removing one or more hydrogen atoms from benzene, naphthalene, anthracene, or phenanthrene, still more preferably a group obtained by removing one or more hydrogen atoms from benzene, naphthalene, or anthracene, particularly preferably a group obtained by removing one or more hydrogen atoms from benzene or naphthalene, and most preferably a group obtained by removing one or more hydrogen atoms from benzene.

Examples of the substituent which $Ra^{104}$ in Formula (a1-r2-3) may have include a methyl group, an ethyl group, propyl group, a hydroxy group, a carboxy group, a halogen atom, an alkoxy group (a methoxy group, an ethoxy group, a propoxy group, a butoxy group, and the like), and an alkyloxycarbonyl group.

In Formula (a1-r2-4), $Ra^{r12}$ and $Ra^{r13}$ each independently represents a monovalent chain-like saturated hydrocarbon group having 1 to 10 carbon atoms or a hydrogen atom. Examples of the monovalent chain-like saturated hydrocarbon group having 1 to 10 carbon atoms as $Ra^{r12}$ and $Ra^{r13}$ include the same monovalent chain-like saturated hydrocarbon groups as those having 1 to 10 carbon atoms as $Ra^{101}$ to $Ra^{103}$ as described above. Part or all of the hydrogen atoms which the chain-like saturated hydrocarbon group has may be substituted.

Among them, $Ra^{r12}$ and $Ra^{r13}$ are preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon groups represented by $Ra^{r12}$ and $Ra^{r13}$ are substituted, examples of the substituent include the same group as $Ra^{x5}$ described above.

In Formula (a1-r2-4), $Ra^{r14}$ represents a hydrocarbon group which may have a substituent. Examples of the hydrocarbon group as $Ra^{r14}$ include a linear or branched alkyl group and a cyclic hydrocarbon group.

The linear alkyl group as $Ra^{r14}$ preferably has 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $Ra^{r14}$ preferably has 3 to 10 carbon atoms and more preferably 3 to 5 carbon atoms. Specific examples thereof include an isopropyl group, an isobutyl group, a tert-butyl group, an isopentyl group, a neopentyl group, a 1,1-diethylpropyl group, and a 2,2-dimethylbutyl group. Among these, an isopropyl group is preferable.

In a case where $Ra^{r14}$ represents a cyclic hydrocarbon group, the cyclic hydrocarbon group may be an aliphatic hydrocarbon group or an aromatic hydrocarbon group and may be a polycyclic group or a monocyclic group.

The aliphatic hydrocarbon group which is a monocyclic group is preferably a group in which one hydrogen atom has been removed from a monocycloalkane. The monocycloalkane preferably has 3 to 6 carbon atoms, and specific examples thereof include cyclopentane and cyclohexane.

The aliphatic hydrocarbon group which is a polycyclic group is preferably a group in which one hydrogen atom has been removed from a polycycloalkane. The polycycloalkane preferably has 7 to 12 carbon atoms, and specific examples thereof include adamantane, norbornane, isobornane, tricyclododecane, and tetracyclododecane.

As the aromatic hydrocarbon group as $Ra^{r14}$, the same group as the aromatic hydrocarbon group as $R^{104}$ can be mentioned. Among them, $Ra^{r14}$ is preferably a group obtained by removing one or more hydrogen atoms from an aromatic hydrocarbon ring having 6 to 15 carbon atoms, more preferably a group obtained by removing one or more hydrogen atoms from benzene, naphthalene, anthracene, or phenanthrene, still more preferably a group obtained by removing one or more hydrogen atoms from benzene, naphthalene, or anthracene, particularly preferably a group obtained by removing one or more hydrogen atoms from naphthalene or anthracene, and most preferably a group obtained by removing one or more hydrogen atoms from naphthalene.

As the substituent which may be included in $Ra^{r14}$, the same group as the substituent which may be included in $Ra^{104}$ can be mentioned.

In a case where $Ra^{r14}$ in Formula (a1-r2-4) is a naphthyl group, the position at which the tertiary carbon atom in Formula (a1-r2-4) is bonded is any of the 1-position and the 2-position of the naphthyl group.

In a case where $Ra^{r14}$ in Formula (a1-r2-4) is an anthryl group, the position at which the tertiary carbon atom in Formula (a1-r2-4) is bonded is any of the 1-position, the 2-position, or the 9-position of the anthryl group.

Specific examples of the group represented by Formula (a1-r2-1) are shown below.

(r-pr-m1)

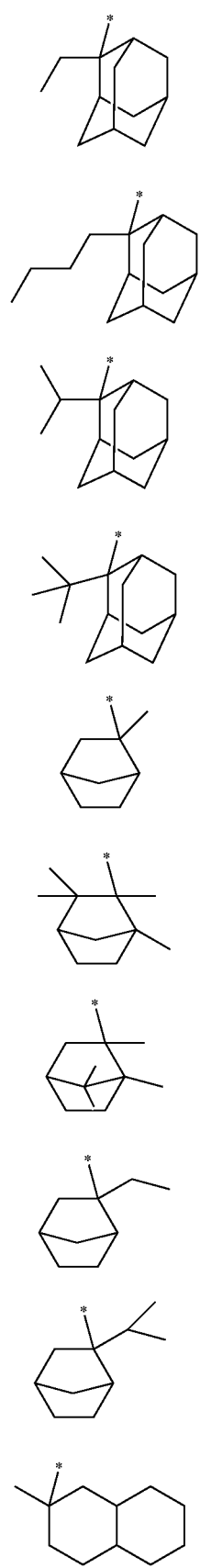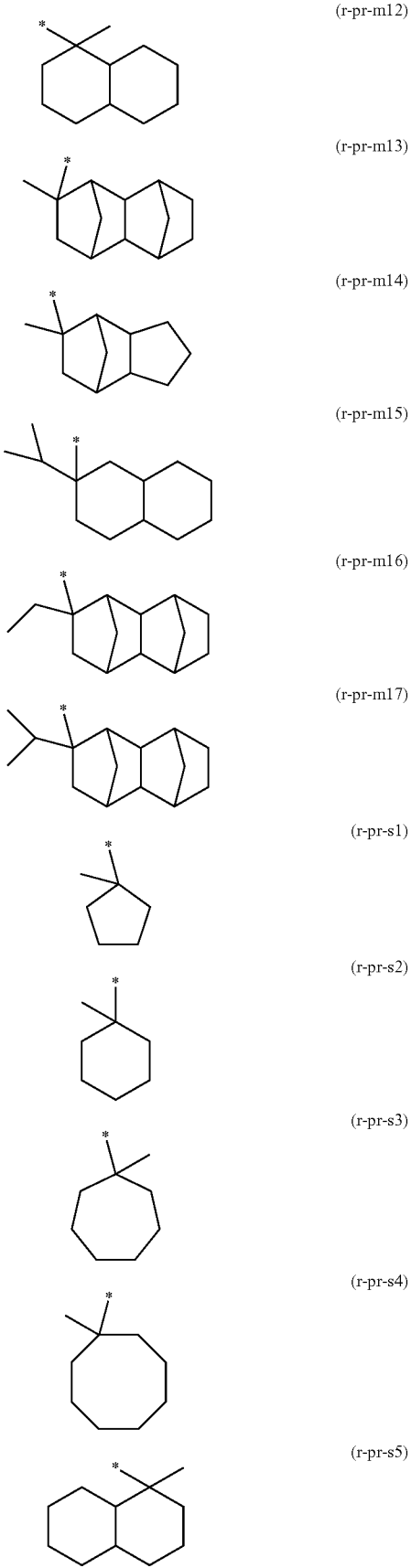

-continued
(r-pr-s6)
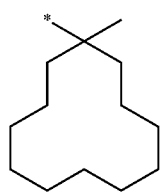
(r-pr-s7)
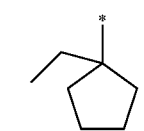
(r-pr-s8)
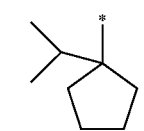
(r-pr-s9)
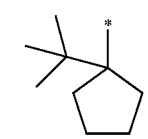
(r-pr-s10)
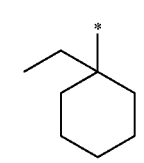
(r-pr-s11)
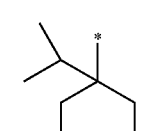
(r-pr-s12)
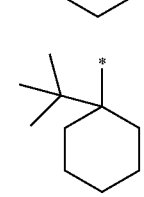
(r-pr-s13)
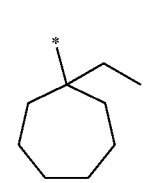
(r-pr-s14)
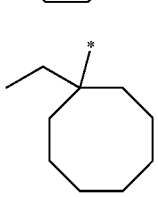
(r-pr-s15)
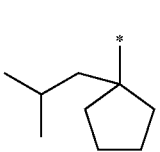
-continued
(r-pr-s16)
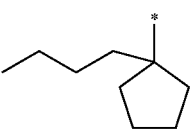
(r-pr-s17)
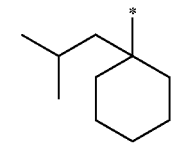
(r-pr-s18)
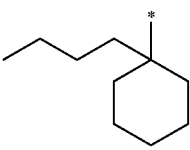
(r-pr-s19)
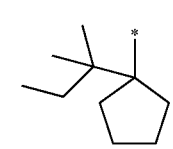
(r-pr-s20)
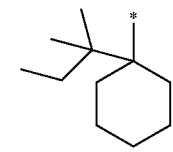
(r-pr-sp1)
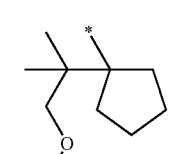
(r-pr-sp2)
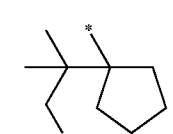
(r-pr-sp3)
(r-pr-sp4)
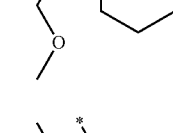

-continued
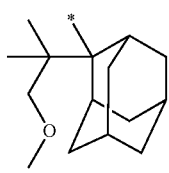 (r-pr-mp1)
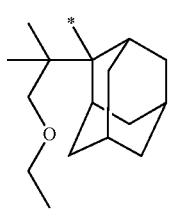 (r-pr-mp2)
Specific examples of the group represented by Formula (a1-r2-2) are shown below.
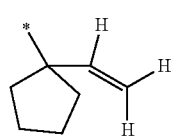 (r-pr-sv1)
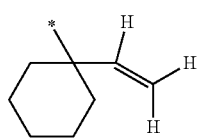 (r-pr-sv2)
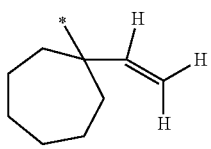 (r-pr-sv3)
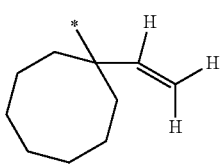 (r-pr-sv4)
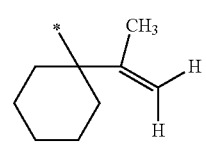 (r-pr-sv5)
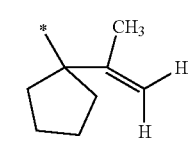 (r-pr-sv6)
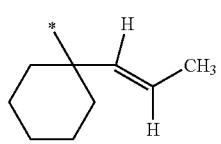 (r-pr-sv7)
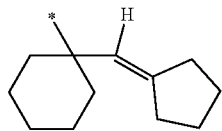 (r-pr-sv8)
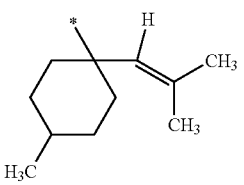 (r-pr-sv9)
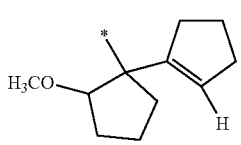 (r-pr-sv10)
 (r-pr-sv11)
 (r-pr-sv12)
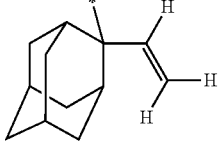 (r-pr-mv1)
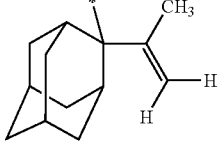 (r-pr-mv2)
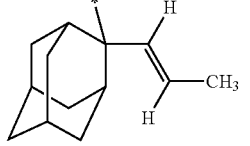 (r-pr-mv3)
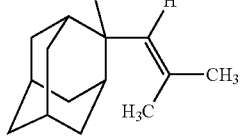 (r-pr-mv4)
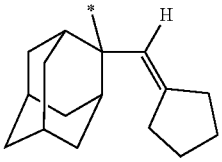 (r-pr-mv5)

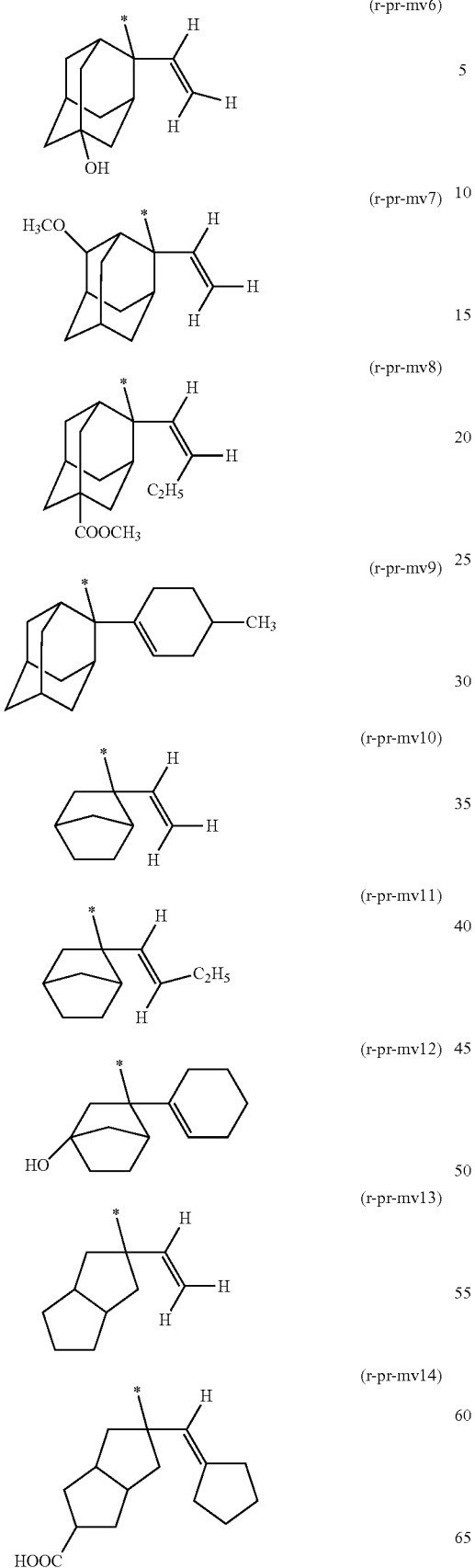
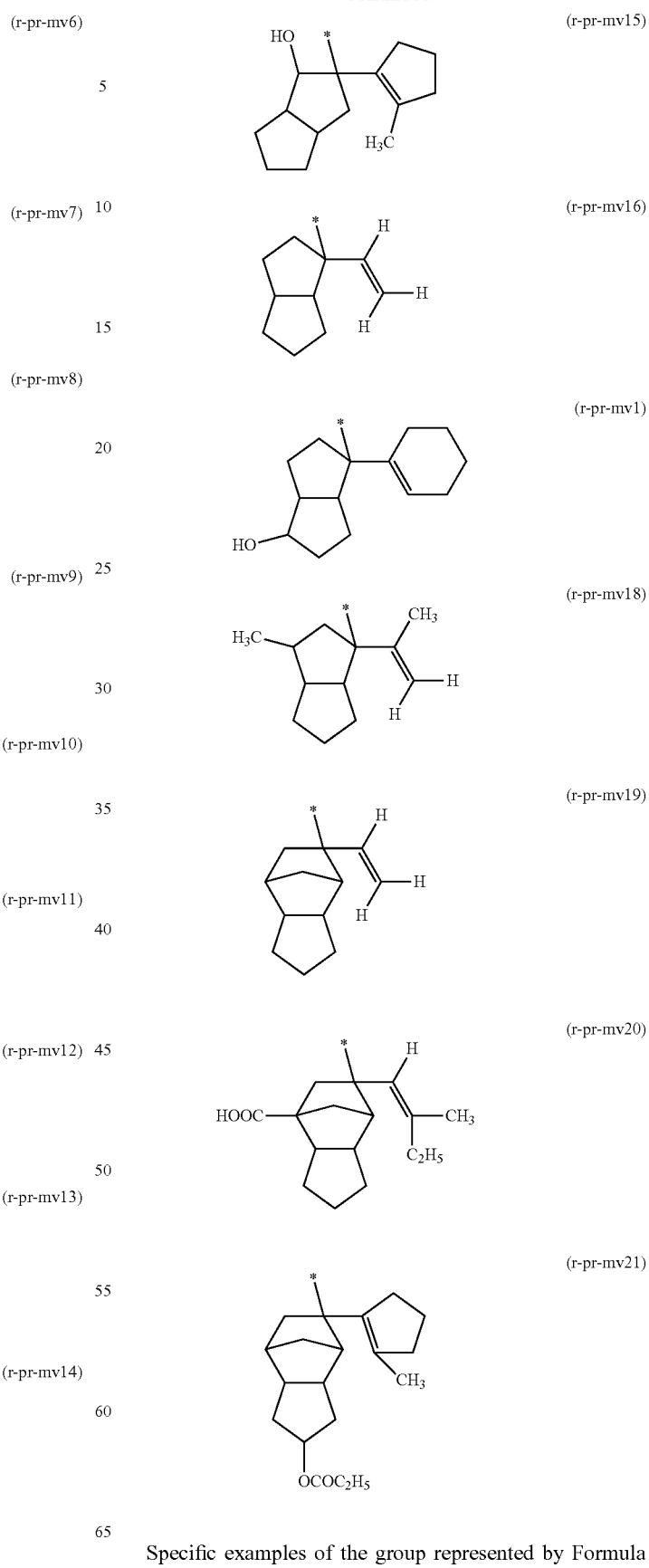
Specific examples of the group represented by Formula (a1-r2-3) are shown below.

(r-pr-sa1) 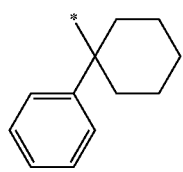
(r-pr-sa2) 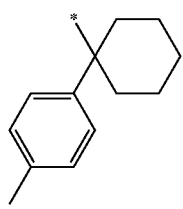
(r-pr-sa3) 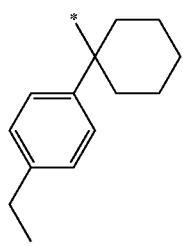
(r-pr-sa4) 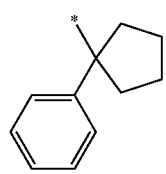
(r-pr-sa5) 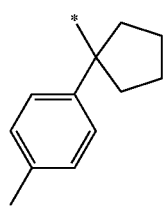
(r-pr-sa6) 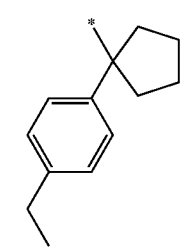
(r-pr-sa7) 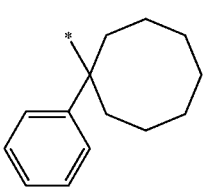
(r-pr-sa8) 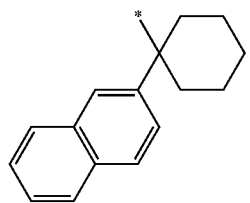
(r-pr-sa9) 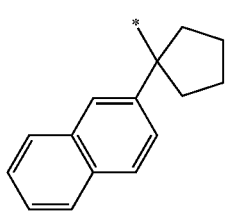
(r-pr-ma1) 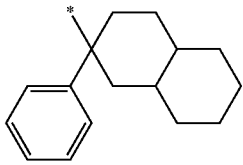
(r-pr-ma2) 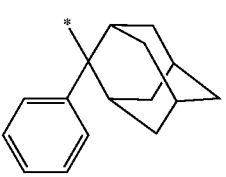
Specific examples of the group represented by Formula (a1-r2-4) are shown below.
(r-pr-cm1) 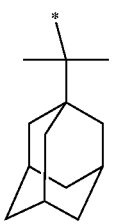
(r-pr-cm2) 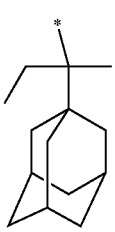
(r-pr-cm3) 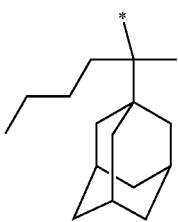

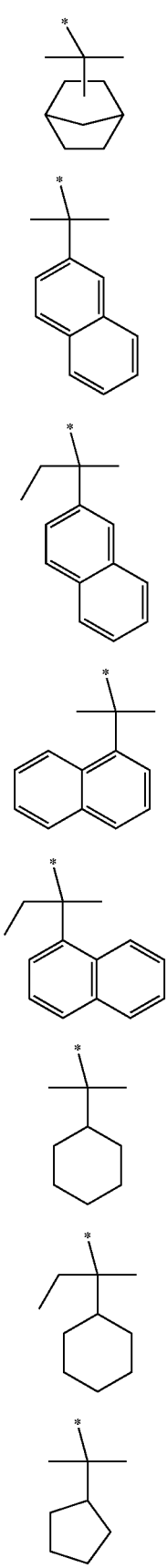

(r-pr-cm4)

(r-pr-cm5)

(r-pr-cm6)

(r-pr-cm7)

(r-pr-cm8)

(r-pr-cs1)

(r-pr-cs2)

(r-pr-cs3)

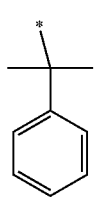 (r-pr-cs4)

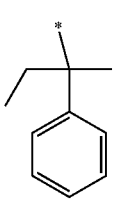 (r-pr-cs5)

 (r-pr-c1)

 (r-pr-c2)

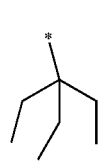 (r-pr-c3)

Tertiary Alkyloxycarbonyl Acid-Dissociable Group:

Examples of the acid-dissociable group for protecting a hydroxyl group as a polar group include an acid-dissociable group (hereinafter, for convenience, also referred to as a "tertiary alkyloxycarbonyl acid-dissociable group") represented by General Formula (a1-r-3) shown below.

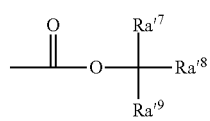

(a1-r-3)

[In the formula, $Ra'^7$ to $Ra'^9$ each represents an alkyl group.]

In Formula (a1-r-3), $Ra'^7$ to $Ra'^9$ each independently preferably represents an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least a part of hydrogen atoms in a hydroxyl group of a constitutional unit derived from hydroxystyrene or a hydroxystyrene derivative are protected by the substituent including an acid-decomposable group; and a constitutional unit in which a part of hydrogen atoms in —C(=O)—OH of a constitutional unit derived from vinylbenzoic acid or a vinylbenzoic acid derivative are protected by the substituent including an acid-decomposable group.

Among the above, as the constitutional unit (a1), a constitutional unit derived from acrylic acid ester in which the hydrogen atom bonded to the carbon atom at the α-position may be substituted with a substituent is preferable. Preferred specific examples of such a constitutional unit (a1) include constitutional units represented by General Formula (a1-1) or (a1-2).

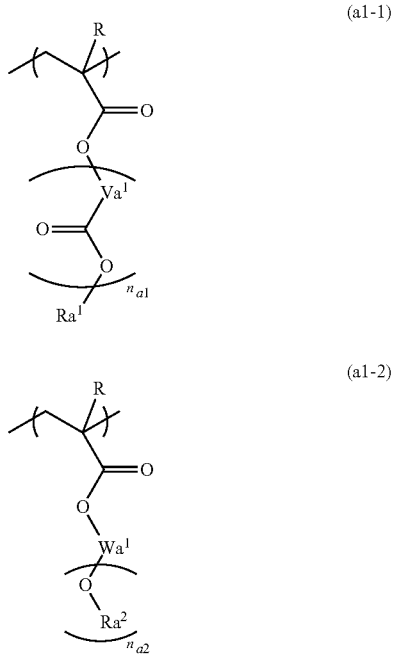

[In the formula, R represents a hydrogen atom, an alkyl group having 1 to 5 carbon atoms, or a halogenated alkyl group having 1 to 5 carbon atoms. $Va^1$ represents a divalent hydrocarbon group which may have an ether bond. $n_{a1}$ represents an integer of 0 to 2. $Ra^1$ is an acid-dissociable group represented by General Formula (a1-r-1) or (a1-r-2). $Wa^1$ represents a ($n_{a2}$+1)-valent hydrocarbon group, $n_{a2}$ represents an integer of 1 to 3, and $Ra^2$ represents an acid-dissociable group represented by General Formula (a1-r-1) or (a1-r-3).]

In Formula (a1-1), as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which part or all of hydrogen atoms in the alkyl group having 1 to 5 carbon atoms have been substituted with halogen atoms. The halogen atom is particularly preferably a fluorine atom.

As R, a hydrogen atom, an alkyl group having 1 to 5 carbon atoms, or a fluorinated alkyl group having 1 to 5 carbon atoms is preferable, and a hydrogen atom or a methyl group is most preferable in terms of industrial availability.

In Formula (a1-1), the divalent hydrocarbon group as $Va^1$ may be an aliphatic hydrocarbon group or an aromatic hydrocarbon group.

The aliphatic hydrocarbon group as the divalent hydrocarbon group as $Va^1$ may be saturated or unsaturated.

In general, it is preferable that the aliphatic hydrocarbon group be saturated.

Specific examples of the aliphatic hydrocarbon group include a linear or branched aliphatic hydrocarbon group, and an aliphatic hydrocarbon group containing a ring in the structure thereof.

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms. The linear aliphatic hydrocarbon group is preferably a linear alkylene group, and specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—]. The branched aliphatic hydrocarbon group described above preferably has 2 to 10 carbon atoms, more preferably 3 to 6 carbon atoms, still more preferably 3 or 4 carbon atoms, and most preferably 3 carbon atoms. As the branched aliphatic hydrocarbon group, a branched alkylene group is preferred, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the linear or branched aliphatic hydrocarbon group, and a group in which the alicyclic hydrocarbon group is interposed in the linear or branched aliphatic hydrocarbon group. The linear or branched aliphatic hydrocarbon group is the same as that defined for the above-described linear aliphatic hydrocarbon group or the above-described branched aliphatic hydrocarbon group.

The alicyclic hydrocarbon group preferably has 3 to 20 carbon atoms and more preferably 3 to 12 carbon atoms.

The alicyclic hydrocarbon group may be monocyclic or polycyclic. The monocyclic alicyclic hydrocarbon group is preferably a group in which two hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which two hydrogen atoms have been removed from a polycycloalkane, and the polycycloalkane is preferably a group having 7 to 12 carbon atoms. Specific examples of the polycycloalkane include adamantane, norbornane, isobornane, tricyclodecane, and tetracyclododecane.

The aromatic hydrocarbon group as the divalent hydrocarbon group as $Va^1$ is a hydrocarbon group having an aromatic ring.

The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, the number of carbon atoms in a substituent is not included in the number of carbon atoms. Specific examples of the aromatic ring which the aromatic hydrocarbon group has include aromatic hydrocarbon rings such as benzene, biphenyl, fluorene, naphthalene, anthracene, and phenanthrene; and aromatic heterocyclic rings in which a part of carbon atoms constituting the above-described aromatic hydrocarbon rings have been substituted with hetero atoms. Examples of the hetero atom in the aromatic heterocyclic rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (a group formed by removing one more hydrogen atoms from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

In Formula (a1-1), $Ra^1$ is an acid-dissociable group represented by Formula (a1-r-1) or (a1-r-2).

In Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity and may be saturated or unsaturated.

In general, it is preferable that the aliphatic hydrocarbon group be saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. The valency of $n_{a2}+1$ is preferably divalent, trivalent, or tetravalent, and divalent or trivalent is more preferable.

In General Formula (a1-2), $Ra^2$ is an acid-dissociable group represented by Formula (a1-r-1) or (a1-r-3).

Specific examples of the constitutional unit represented by Formula (a1-1) are shown below. In the formulae shown below, Ra represents a hydrogen atom, a methyl group, or a trifluoromethyl group.

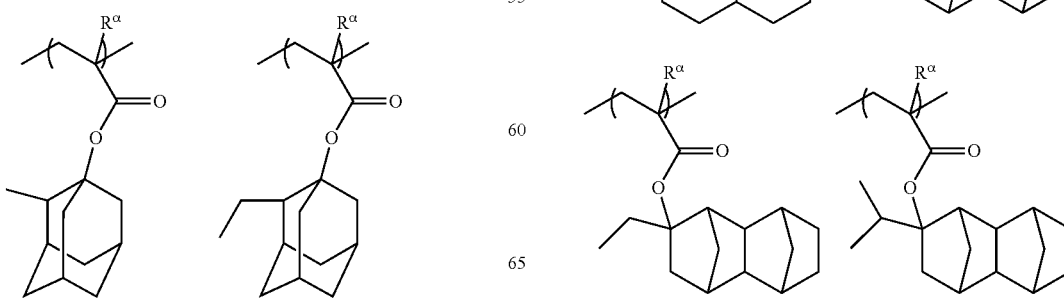

-continued

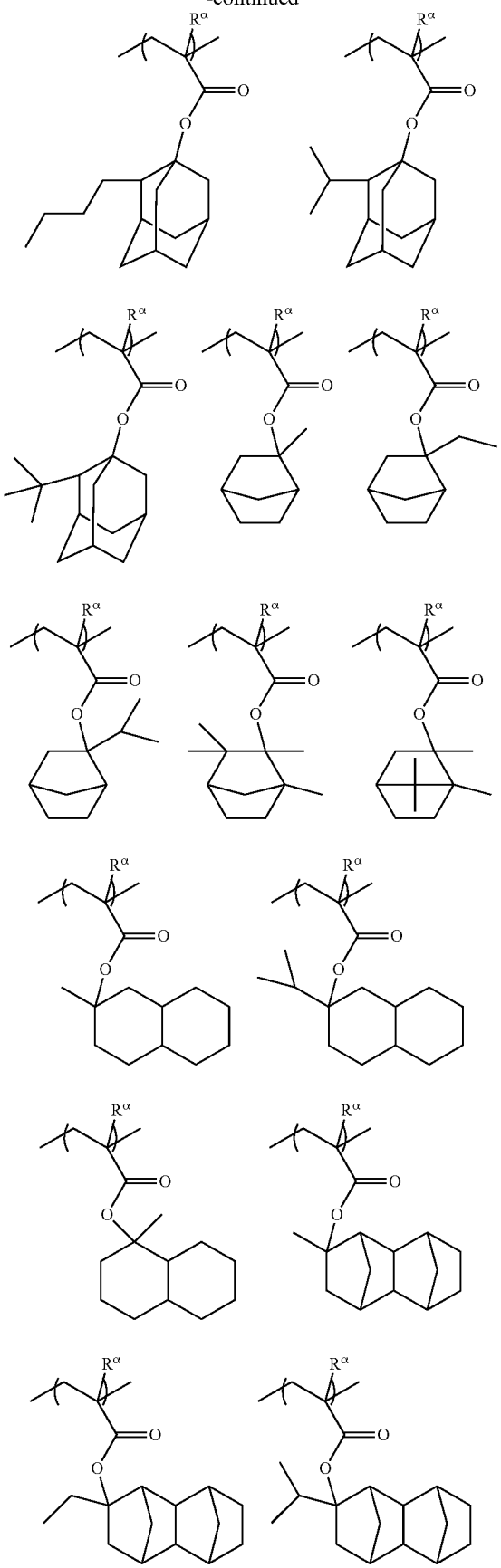

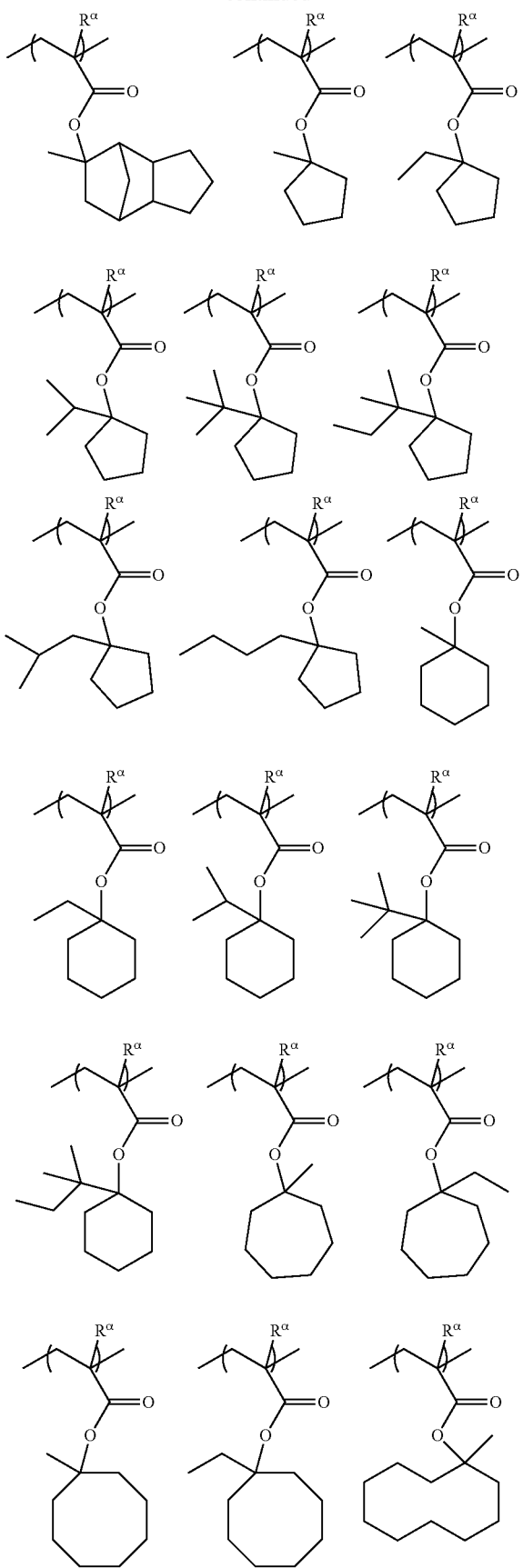
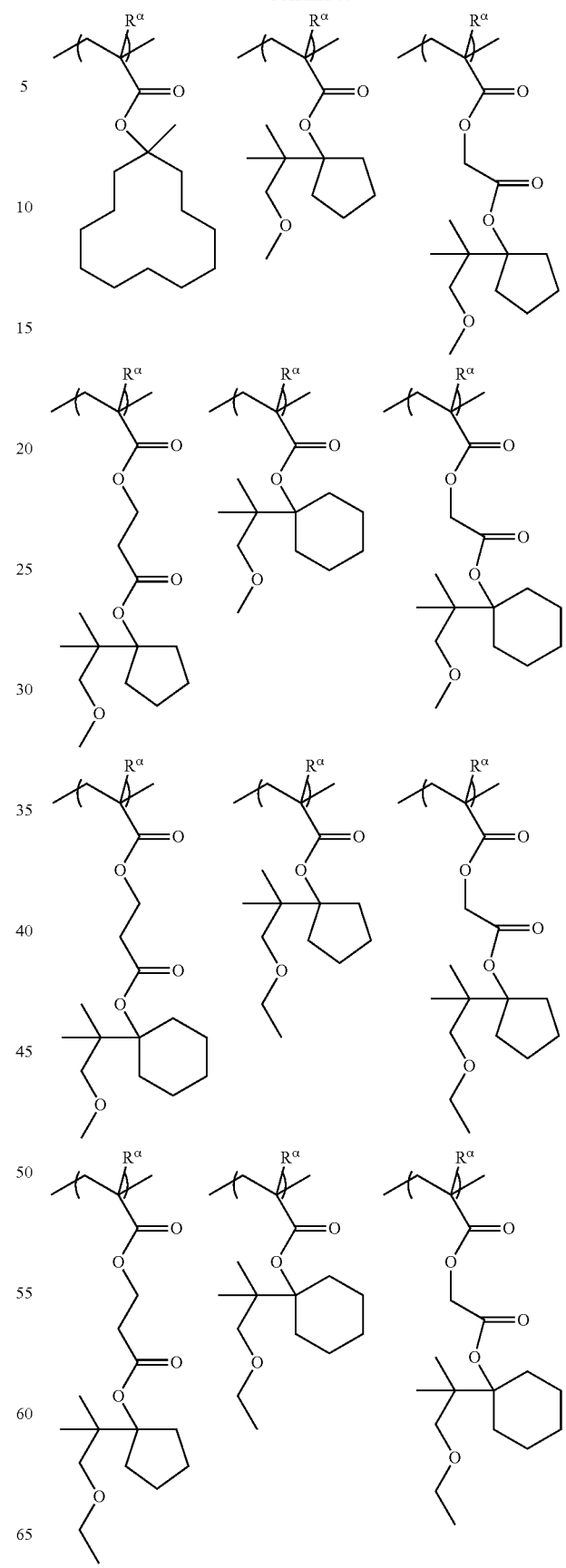

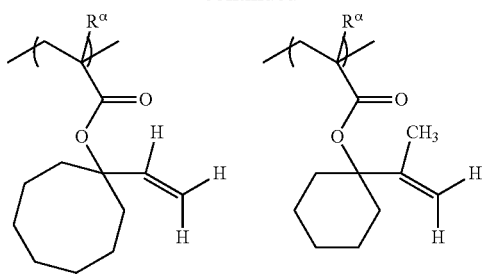
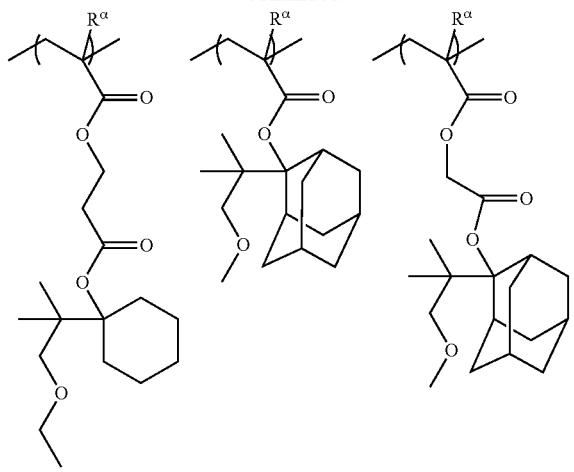
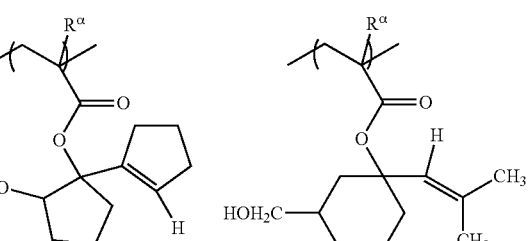
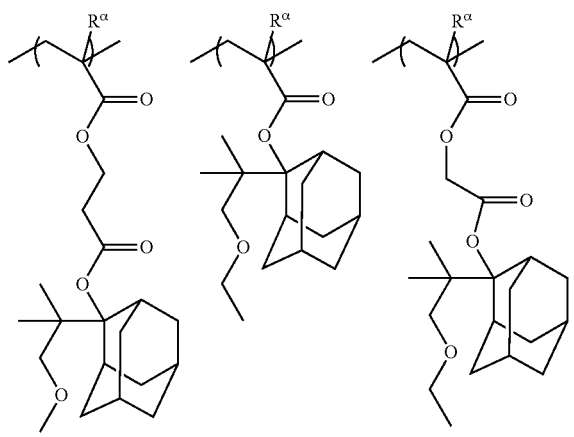
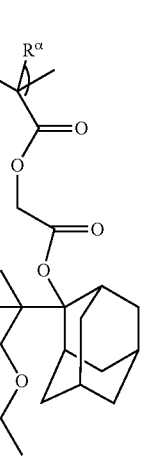
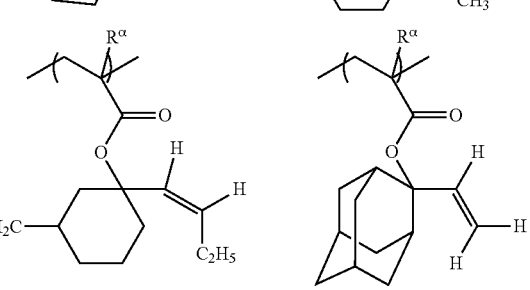
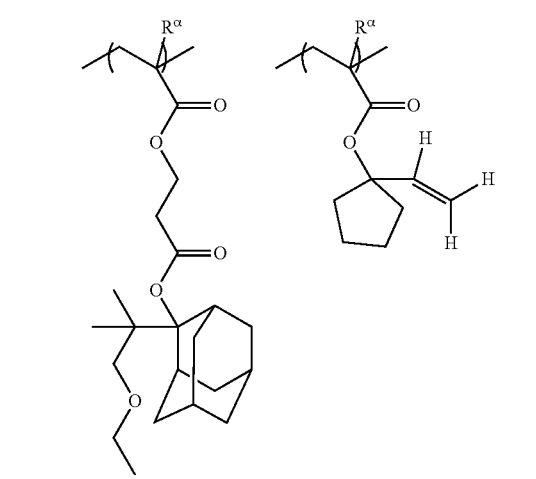
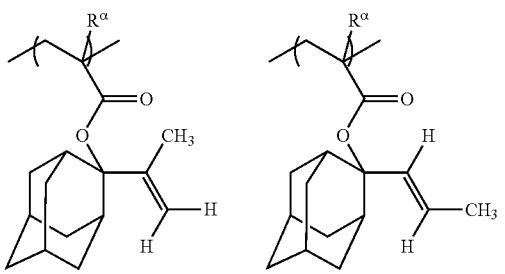
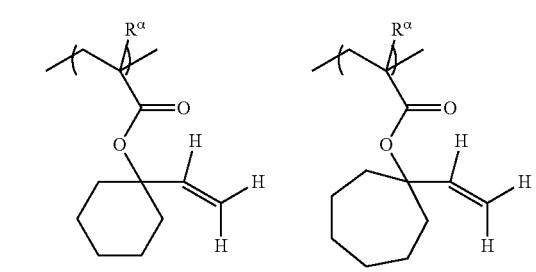

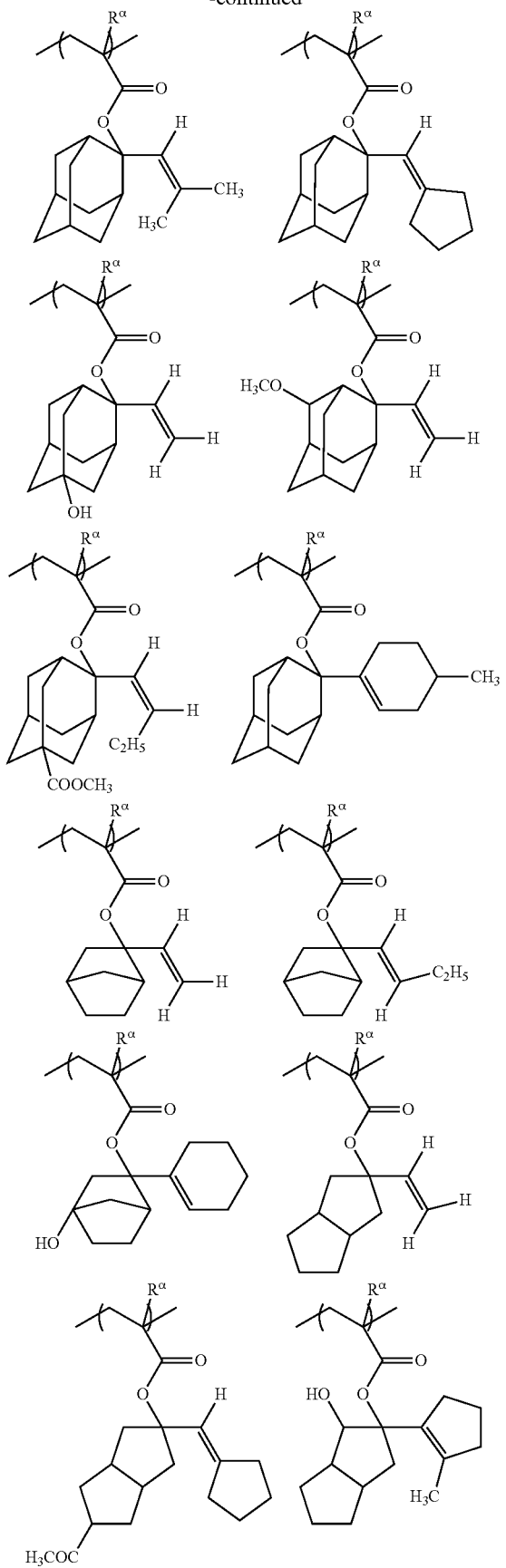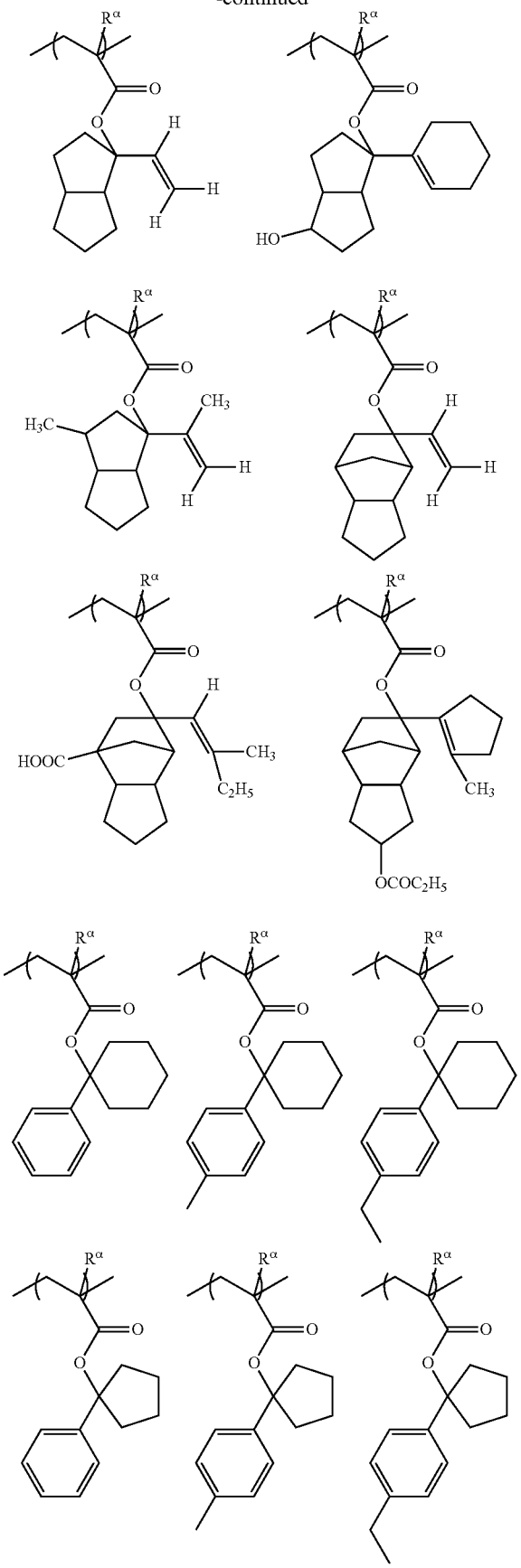

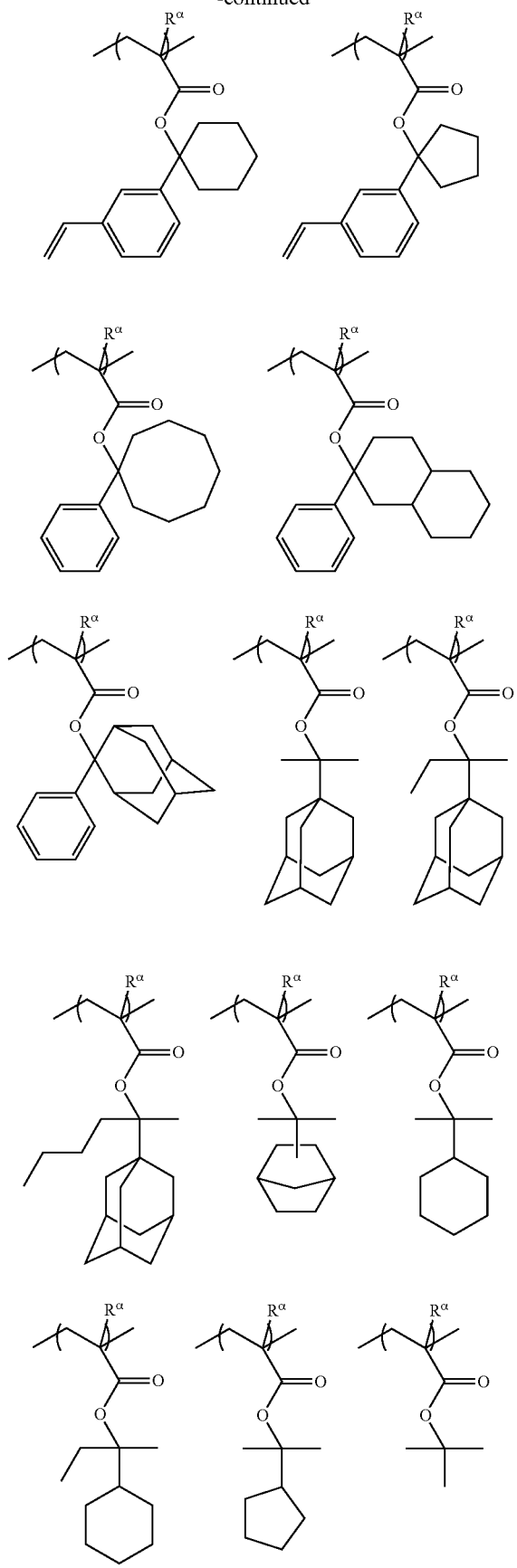

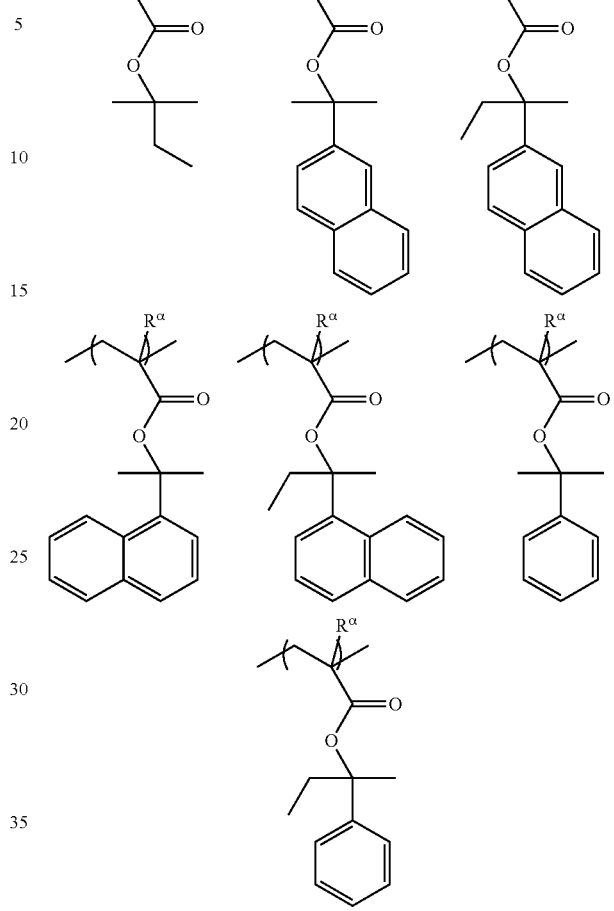

The constitutional unit (a1) which the component (A1) has may be one kind or may be two or more kinds.

The constitutional unit (a1) is more preferably a constitutional unit represented by Formula (a1-1) since lithography characteristics (sensitivity, shape, and the like) in lithography depending on an electron beam or EUV can be more easily increased.

Among them, the constitutional unit (a1) particularly preferably includes a constitutional unit represented by General Formula (a1-1-1) shown below.

(a1-1-1)

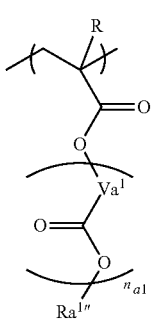

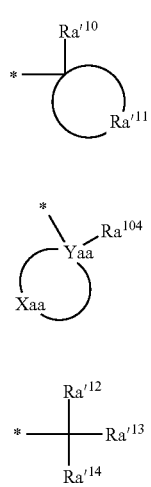

(a1-r2-1)

(a1-r2-3)

(a1-r2-4)

[In the formula, Ra$^{1'''}$ is an acid-dissociable group represented by General Formula (a1-r2-1), (a1-r2-3), or (a1-r2-4).]

[In Formula (a1-1-1), R, Va$^1$, and n$_{a1}$ are respectively the same as R, Va$^1$, and n$_{a1}$ in Formula (a1-1).

The description for the acid-dissociable group represented by General Formula (a1-r2-1), (a1-r2-3), or (a1-r2-4) is as described above. Among them, it is preferable to select a group in which the acid-dissociable group is a cyclic group since the reactivity can be increased, which is suitable for EB or EUV.

The proportion of the constitutional unit (a1) in the component (A1) is preferably in a range of 5% to 80% by mole, more preferably in a range of 10% to 75% by mole, still more preferably in a range of 30% to 70% by mole, and particularly preferably in a range of 40% to 60% by mole, with respect to the total amount (100% by mole) of all constitutional units constituting the component (A1).

In a case where the proportion of the constitutional unit (a1) is set within the preferred range described above, the efficiency of the deprotection reaction and the solubility of the developing solution can be appropriately ensured, and thus the effects of the present invention can be more easily obtained.

<<Other Constitutional Units>>

The component (A1) may have other constitutional units as necessary in addition to the constitutional unit (a1) described above.

Examples of other constitutional units include: a constitutional unit (a10) represented by General Formula (a10-1) described later; a constitutional unit (a2) containing a lactone-containing cyclic group, a —SO$_2$-containing cyclic group, or a carbonate-containing cyclic group; and a constitutional unit (a3) containing a polar group-containing aliphatic hydrocarbon group; a constitutional unit (a4) containing an acid non-dissociable aliphatic cyclic group; and a constitutional unit (st) derived from styrene or a derivative thereof.

In Regard to Constitutional Unit (a10):

The constitutional unit (a10) is a constitutional unit derived from a compound represented by General Formula (a10-1).

(a10-1)

[In the formula, W represents a polymerizable group-containing group. However, the polymerizable group-containing group as W does not contain an oxygen atom. Ya$^{x1}$ represents a single bond or a divalent linking group. Wax represents an aromatic hydrocarbon group which may have a substituent. n$_{ax1}$ represents an integer of 1 or greater.]

In Formula (a10-1), W represents a polymerizable group-containing group.

The "polymerizable group" in W is a group that enables a compound having the polymerizable group to be polymerized by radical polymerization or the like, and includes a group containing a multiple bond between carbon atoms, such as an ethylenic double bond.

In the constitutional unit (a10), the multiple bond in the polymerizable group of the compound represented by General Formula (a10-1) is cleaved to form the main chain.

Examples of the polymerizable group include a vinyl group, an allyl group, a fluorovinyl group, a difluorovinyl group, a trifluorovinyl group, a difluorotrifluoromethylvinyl group, a trifluoroallyl group, a perfluoroallyl group, a styryl group, and a vinylnaphthyl group, a fluorine-containing styryl group, a fluorine-containing vinylnaphthyl group, a norbornyl group, a fluorine-containing norbornyl group, and a silyl group.

The polymerizable group-containing group may be a group composed of only a polymerizable group, or a group composed of a polymerizable group and a group other than the polymerizable group. Examples of the group other than the polymerizable group include a divalent hydrocarbon group which may have a substituent and a divalent linking group containing a hetero atom (excluding an oxygen atom). However, the polymerizable group-containing group as W does not contain an oxygen atom.

Suitable examples of W include a group represented by a chemical formula: $C(R^{X11})(R^{X12})=C(R^{X13})-$.

In the chemical formula, $R^{X11}$, $R^{X12}$, and $R^{X13}$ each independently represents a hydrogen atom, an alkyl group having 1 to 5 carbon atoms, or a halogenated alkyl group having 1 to 5 carbon atoms.

In the chemical formula, the alkyl group having 1 to 5 carbon atoms as $R^{X11}$, $R^{X12}$, and $R^{X13}$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which part or all of hydrogen atoms in the alkyl group having 1 to 5 carbon atoms have been substituted with halogen atoms. The halogen atom is particularly preferably a fluorine atom.

Among these, $R^{X11}$ and $R^{X12}$ are each preferably a hydrogen atom, an alkyl group having 1 to 5 carbon atoms, or a fluorinated alkyl group having 1 to 5 carbon atoms, and in terms of industrial availability, a hydrogen atom or a methyl group is more preferable, and a hydrogen atom is particularly preferable.

In addition, $R^{x13}$ is preferably a hydrogen atom, an alkyl group having 1 to 5 carbon atoms, or a fluorinated alkyl group having 1 to 5 carbon atoms, and in terms of industrial availability, a hydrogen atom or a methyl group is more preferable.

In Formula (a10-1), $Ya^{x1}$ represents a single bond or a divalent linking group.

In the chemical formula described above, the divalent linking group as $Ya^{x1}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{x1}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x1}$

The aliphatic hydrocarbon group indicates a hydrocarbon group that has no aromaticity. The aliphatic hydrocarbon group may be saturated or unsaturated.

In general, it is preferable that the aliphatic hydrocarbon group be saturated. Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group preferably has 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)_2CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be mentioned.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group in which two hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which two hydrogen atoms have been removed from a polycycloalkane, and the polycycloalkane is preferably a group having 7 to 12 carbon atoms. Specific examples thereof include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

In the cyclic aliphatic hydrocarbon group, a part of carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group as $Ya^{x1}$

The aromatic hydrocarbon group is a hydrocarbon group having at least one aromatic ring.

The aromatic ring is not particularly limited as long as it is a cyclic conjugated system having (4n+2) 1 electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon ring have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group in which two hydrogen atoms have been removed from the above-described aromatic hydrocarbon ring or aromatic heterocyclic ring (an arylene group or a heteroarylene group); a group in which two hydrogen atoms have been removed from an aromatic compound having two or more aromatic rings (such as biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group obtained by further removing one hydrogen atom from an aryl group in arylalkyl groups such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aryl group or the heteroaryl group is preferably in a range of 1 to 4, more preferably 1 or 2, and particularly preferably 1.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is most preferable.

As the alkoxy group, the halogen atom, and the halogenated alkyl group as the substituents, the same groups as the above-described substituents for substituting a hydrogen atom which the cyclic aliphatic hydrocarbon group has can be mentioned.

Divalent Linking Group Containing Hetero Atom

In a case where $Ya^{x1}$ represents a divalent linking group containing a hetero atom, preferred examples of the linking group include —O—, —C(=O)—O—, —O—C(=O)—, —C(=O)—, —O—C(=O)—O— —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula: —$Y^{21}$—O—$Y^{22}$—, —$Y^{21}$—O—, —$Y^{21}$—C(=O)—O—, —C(=O)—O—$Y^{21}$—, —$Y^{21}$—C(=)—O]m2, —$Y^{21}$—O—C(=O)—$Y^{22}$— or —$Y^{21}$—S(=O)$_2$—O—$Y^{22}$— [in the formulae, $Y^{21}$ and $Y^{22}$ each independently represents a divalent hydrocarbon group which may have a substituent, 0 represents an oxygen atom, and m'' represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In General Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_m$—$Y^{22}$, —$Y^{21}$—C(=)—$Y^{22}$—, or —$Y^{21}$—S(=O)$_2$—O—$Y^{22}$—, $Y^{21}$, and $Y^{22}$ each independently represents a divalent hydrocarbon group which may have a substituent. Examples of the divalent hydrocarbon group include those (mentioned as the divalent hydrocarbon group which may have a substituent) in the description of the above-described divalent linking group as $Ya^{x1}$.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[$Y^{21}$—C(=O)—O]$_{m''}$—$Y^{22}$—, m'' represents an integer of 0 to 3, preferably an integer of 0 to 2, more preferably 0 or 1, and particularly preferably 1. In other words, it is particularly preferable that the group represented by Formula —[$Y^{21}$—C(=O)—O]$_{m''}$—$Y^{22}$— represent a group represented by Formula —$Y^{21}$—C(=O)—O—$Y^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among the above, $Ya^{x1}$ is preferably a single bond, an ester bond [—C(=O)—O—, —O—C(=O)—], an ether bond (—O—), a linear or branched alkylene group, or a combination thereof, and more preferably a single bond or an ester bond [—C(=O)—O—, —O—C(=O)—].

In Formula (a10-1), $Wa^{x1}$ represents an aromatic hydrocarbon group which may have a substituent.

Examples of the aromatic hydrocarbon group as $Wa^{x1}$ include a group in which ($n_{ax1}$+1) hydrogen atoms have been removed from an aromatic ring which may have a substituent. The aromatic ring is not particularly limited as long as it is a cyclic conjugated system having (4n+2) 1 electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic heterocyclic rings in which a part of carbon atoms constituting the above-described aromatic hydrocarbon rings have been substituted with hetero atoms. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Examples of the aromatic hydrocarbon group as $Wa^{x1}$ also include a group in which ($n_{ax1}$+1) hydrogen atoms have been removed from an aromatic compound including an aromatic ring (for example, biphenyl and fluorene) which may have two or more substituents.

The aromatic hydrocarbon group as $Wa^{x1}$ may be a group in which $n_{ax1}$ or fewer hydrogen atoms are substituted with an alkylene group or a halogenated alkylene group, from the group in which one hydrogen atom has been removed from the aromatic hydrocarbon ring or the aromatic heterocyclic ring. The alkylene group and the halogenated alkylene group may be bonded to $Ya^{x1}$ in Formula (a10-1) or may be bonded to OH in Formula (a10-1). When the OH in Formula (a10-1) is not bonded to the alkylene group and the halogenated alkylene group, the OH is directly bonded to the aromatic hydrocarbon ring or the aromatic heterocyclic ring. The alkylene in the alkylene group or the halogenated alkylene group preferably has 1 to 4 carbon atoms and more preferably 1 to 3 carbon atoms.

Among the above, $Wa^{x1}$ is preferably a group obtained by removing $(n_{ax1}+1)$ hydrogen atoms from benzene, naphthalene, anthracene, or biphenyl, more preferably a group obtained by removing $(n_{ax1}+1)$ hydrogen atoms from benzene or naphthalene, and still more preferably a group obtained by removing $(n_{ax1}+1)$ hydrogen atoms from benzene.

The aromatic hydrocarbon group as $Wa^{x1}$ may or may not have a substituent. Examples of the substituent include an alkyl group, an alkoxy group, a halogen atom, and a halogenated alkyl group. Examples of the alkyl groups, the alkoxy groups, the halogen atoms, and the halogenated alkyl groups as the substituent include the same groups which are mentioned as the above-described substituents of the cyclic aliphatic hydrocarbon group as $Ya^{x1}$. The substituent is preferably a linear or branched alkyl group having 1 to 5 carbon atoms, more preferably a linear or branched alkyl group having 1 to 3 carbon atoms, still more preferably an ethyl group or a methyl group, and particularly preferably a methyl group. The aromatic hydrocarbon group as $Wa^{x1}$ preferably has no substituent.

$Wa^{x1}$ may form a condensed ring together with $Ya^{x1}$ and W. When $Wa^{x1}$, $Ya^{x1}$, and W form a condensed ring, examples of the ring structure of the condensed ring include a condensed ring of an alicyclic hydrocarbon and an aromatic hydrocarbon ring. The condensed ring formed by $Wa^{x1}$, $Ya^{x1}$, and W may have a hetero atom.

The alicyclic hydrocarbon moiety in the condensed ring formed by W, $Ya^{x1}$, and $Wa^{x1}$ may be a monocyclic ring or a polycyclic ring. Examples of the condensed ring formed by W, $Ya^{x1}$, and $Wa^{x1}$ include a condensed ring formed by a polymerizable group in W in a case where $Ya^{x1}$ is a single bond and by $Wa^{x1}$, and a condensed ring formed by $Ya^{x1}$ and $Wa^{x1}$.

The condensed ring formed by W, $Ya^{x1}$, and $Wa^{x1}$ may have a substituent. Examples of this substituent include a methyl group, an ethyl group, propyl group, a hydroxy group, a hydroxyalkyl group, a carboxy group, a halogen atom, an alkoxy group (a methoxy group, an ethoxy group, a propoxy group, a butoxy group, and the like), an acyl group, an alkyloxycarbonyl group, and an alkyloxycarbonyloxy group.

Specific examples of the condensed ring formed by W, $Ya^{x1}$, and $Wa^{x1}$ are shown below. $W^{\alpha 1}$ represents a polymerizable group. ** represents a bond to a hydroxy group $(-(OH)_{n01})$.

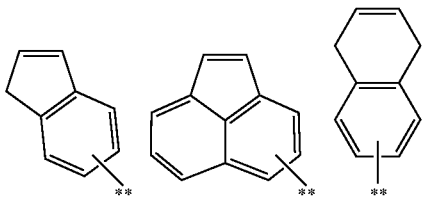

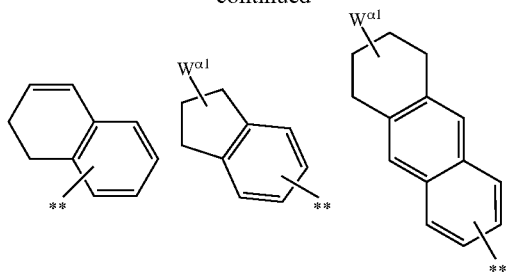

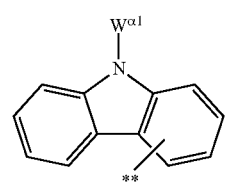

In Formula (a10-1), $n_{ax1}$ represents an integer of 1 or greater, preferably an integer of 1 to 10, more preferably an integer of 1 to 5, still more preferably 1, 2, or 3, and particularly preferably 1 or 2.

The constitutional unit (a10) is preferably a constitutional unit represented by General Formula (a10-1-1).

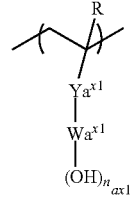

(a10-1-1)

[In the formula, R represents a hydrogen atom, an alkyl group having 1 to 5 carbon atoms, or a halogenated alkyl group having 1 to 5 carbon atoms. $Ya^{x1}$ represents a single bond or a divalent linking group. $Wa^{x1}$ represents an aromatic hydrocarbon group which may have a substituent. $na^{x1}$ represents an integer of 1 or greater.]

In Formula (a10-1-1), R represents a hydrogen atom, an alkyl group having 1 to 5 carbon atoms, or a halogenated alkyl group having 1 to 5 carbon atoms. Examples of R in Formula (a10-1-1) include the same group as that mentioned in R in General Formula (a1-1), and the same is applied to the preferred examples.

$Ya^{x1}$, $Wa^{x1}$, and $na^{x1}$ in Formula (a10-1-1) are respectively the same as $Ya^{x1}$, $Wa^{x1}$, and $na^{x1}$ in Formula (a10-1).

Specific examples of the constitutional unit (a10) represented by Formula (a10-1) are shown below.

In the formulae shown below, Ra represents a hydrogen atom, a methyl group, or a trifluoromethyl group.

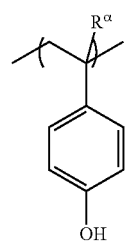 (a10-1-11)
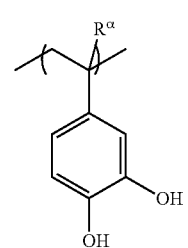 (a10-1-12)
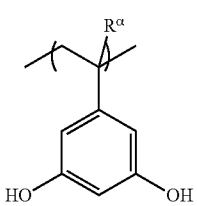 (a10-1-13)
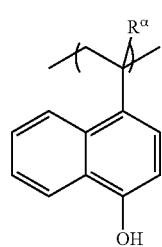 (a10-1-14)
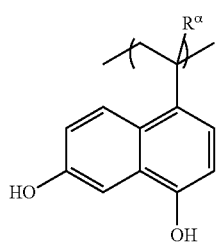 (a10-1-15)
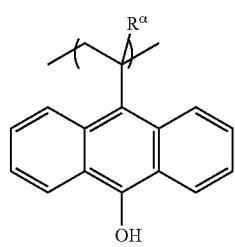 (a10-1-16)
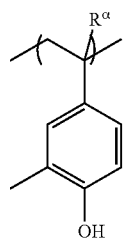 (a10-1-17)
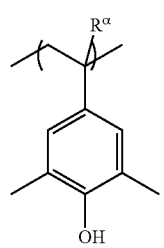 (a10-1-18)
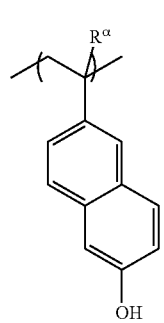 (a10-1-21)
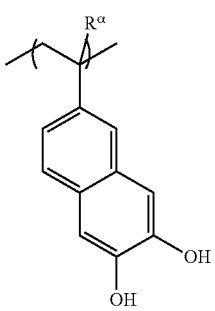 (a10-1-22)
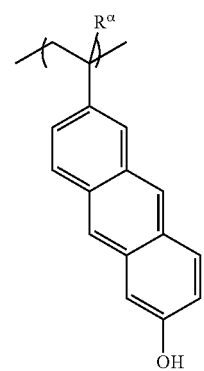 (a10-1-23)

(a10-1-24)
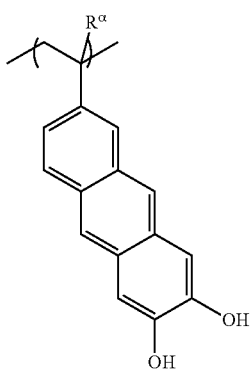
(a10-1-31)
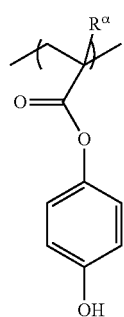
(a10-1-32)
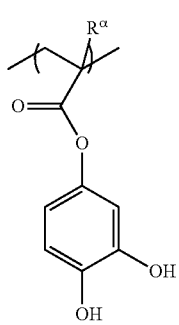
(a10-1-33)
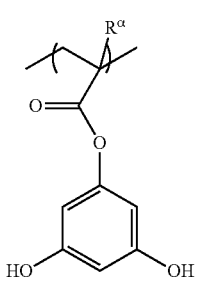
(a10-1-34)
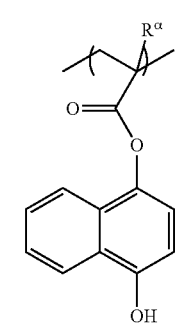
(a10-1-35)
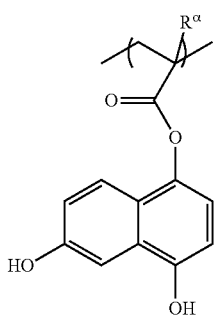
(a10-1-36)
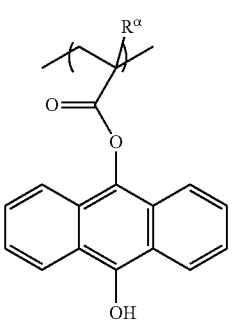
(a10-1-41)
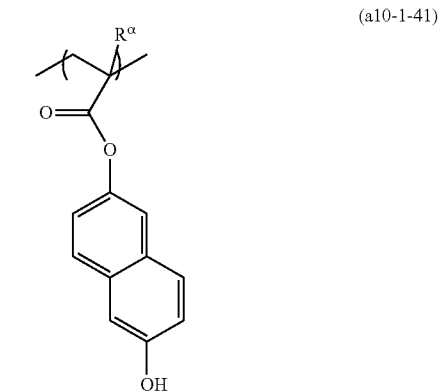
(a10-1-42)
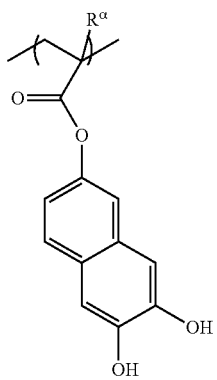

(a10-1-43)

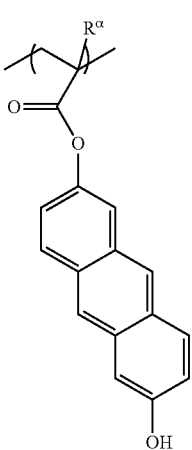

(a10-1-44)

(a10-1-45)

(a10-1-46)

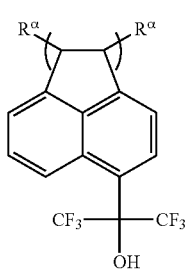

The constitutional unit (a10) which the component (A1) has may be one kind or may be two or more kinds.

In a case where the component (A1) has the constitutional unit (a10), the proportion of the constitutional unit (a10) in the component (A1) is preferably in a range of 5% to 80% by mole, more preferably in a range of 10% to 75% by mole, still more preferably in a range of 30% to 70% by mole, and particularly preferably 40% to 60% by mole, with respect to the total amount (100% by mole) of all constitutional units constituting the component (A1).

In a case where the proportion of the constitutional unit (a10) is set within the preferred range described above, the efficiency of supplying protons in the resist film can be improved and the solubility of the developing solution can be appropriately ensured, and thus the effects of the present invention can be more easily obtained.

In regard to constitutional unit (a2): The component (A1) may further have, as necessary, a constitutional unit (a2) (provided that a group having the constitutional unit (a1) is excluded) containing a lactone-containing cyclic group, a —SO$_2$-containing cyclic group, or a carbonate-containing cyclic group, in addition to the constitutional unit (a1).

In a case where the component (A1) is used for forming a resist film, the lactone-containing cyclic group, the —SO$_2$-containing cyclic group, or the carbonate-containing cyclic group in the constitutional unit (a2) is effective for improving the adhesiveness of the resist film to the substrate. Further, due to having the constitutional unit (a2), lithography characteristics can be improved, for example, by the effects obtained by appropriately adjusting the acid diffusion length, increasing the adhesiveness of the resist film to the substrate, and appropriately adjusting the solubility during development.

The term "lactone-containing cyclic group" indicates a cyclic group that contains a ring (lactone ring) containing a —O—C(=O)— in the ring skeleton. In a case where the lactone ring is counted as the first ring and the group contains only the lactone ring, the group is referred to as a monocyclic group.

Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and any lactone-containing may be used. Specific examples thereof include groups each represented by General Formulae (a2-r-1) to (a2-r-7) shown below.

(a2-r-1)

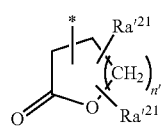

(a2-r-2)

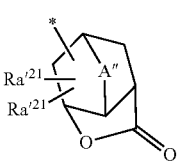

(a2-r-3)

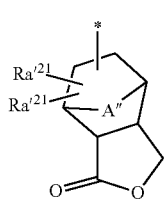

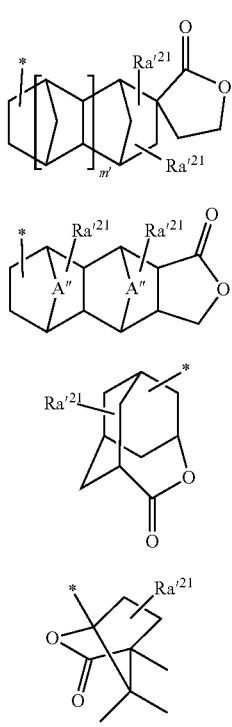

(a2-r-4)

(a2-r-5)

(a2-r-6)

(a2-r-7)

[In the formulae, each Ra'$^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; A" represents an oxygen atom, a sulfur atom, or an alkylene group having 1 to 5 carbon atoms, which may contain an oxygen (—O—) atom or a sulfur atom (—S—); and n' represents an integer of 0 to 2, and m' is 0 or 1.]

In General Formulae (a2-r-1) to (a2-r-7), the alkyl group as Ra'$^{21}$ is preferably an alkyl group having 1 to 6 carbon atoms. The alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

The alkoxy group as Ra'$^{21}$ is preferably an alkoxy group having 1 to 6 carbon atoms. Further, the alkoxy group is preferably a linear or branched alkoxy group. Specific examples of the alkoxy groups include a group formed by linking the above-described alkyl group mentioned as the alkyl group as Ra'$^{21}$ to an oxygen atom (—O—).

The halogen atom as Ra'$^{21}$ is preferably a fluorine atom.

Examples of the halogenated alkyl group as Ra'$^{21}$ include groups in which part or all of hydrogen atoms in the above-described alkyl group as Ra'$^{21}$ have been substituted with the above-described halogen atoms. As the halogenated alkyl group, a fluorinated alkyl group is preferable, and a perfluoroalkyl group is particularly preferable.

In —COOR" and —OC(=O)R" as Ra'$^{21}$, R" represents a hydrogen atom, an alkyl group, a lactone-containing cyclic group, a carbonate-containing cyclic group, or a —SO$_2$-containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" represents a cyclic alkyl group, the number of carbon atoms thereof is preferably in a range of 3 to 15, more preferably in a range of 4 to 12, and particularly preferably in a range of 5 to 10. Specific examples thereof include a group in which one or more hydrogen atoms have been removed from a monocycloalkane, which may or may not be substituted with a fluorine atom or a fluorinated alkyl group; and a group in which one or more hydrogen atoms have been removed from polycycloalkanes such as bicycloalkane, tricycloalkane, or tetracycloalkane. More specific examples thereof include a group in which one or more hydrogen atoms have been removed from a monocycloalkane such as cyclopentane or cyclohexane; and a group in which one or more hydrogen atoms have been removed from a polycycloalkane such as adamantane, norbornane, isobornane, tricyclodecane, or tetracyclododecane.

Examples of the lactone-containing cyclic group as R" include the same groups as those each represented by General Formulae (a2-r-1) to (a2-r-7).

The carbonate-containing cyclic group as R" has the same definition as that for the carbonate-containing cyclic group described below.

Specific examples of the carbonate-containing cyclic group include groups each represented by General Formulae (ax3-r-1) to (ax3-r-3).

The —SO$_2$-containing cyclic group as R" has the same definition as that for the —SO$_2$-containing cyclic group described below. Specific examples of the —SO$_2$-containing cyclic group include groups each represented by General Formulae (a5-r-1) to (a5-r-4).

The hydroxyalkyl group as Ra'$^{21}$ preferably has 1 to 6 carbon atoms, and specific examples thereof include a group in which at least one hydrogen atom in the alkyl group as Ra'$^{21}$ has been substituted with a hydroxyl group.

In General Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Specific examples of the alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. As A", an alkylene group having 1 to 5 carbon atoms or —O— is preferable, an alkylene group having 1 to 5 carbon atoms is more preferable, and a methylene group is most preferable.

Specific examples of the groups each represented by General Formulae (a2-r-1) to (a2-r-7) are shown below.

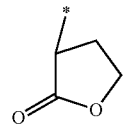

(r-Ic-1-1)

-continued
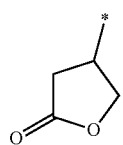 (r-Ic-1-2)
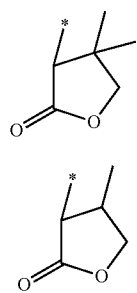 (r-Ic-1-3)
(r-Ic-1-4)
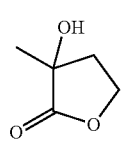 (r-Ic-1-5)
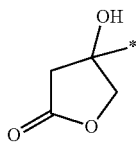 (r-Ic-1-6)
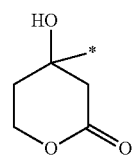 (r-Ic-1-7)
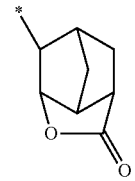 (r-Ic-2-1)
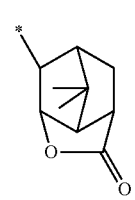 (r-Ic-2-2)
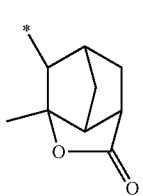 (r-Ic-2-3)
-continued
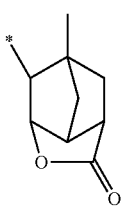 (r-Ic-2-4)
 (r-Ic-2-5)
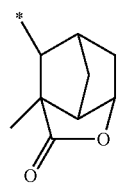 (r-Ic-2-6)
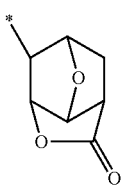 (r-Ic-2-7)
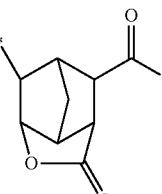 (r-Ic-2-8)
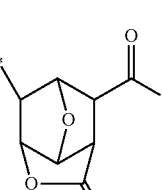 (r-Ic-2-9)
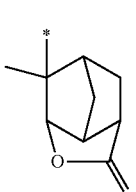 (r-Ic-2-10)
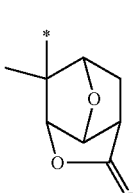 (r-Ic-2-11)

-continued
(r-Ic-2-12)
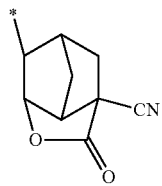
(r-Ic-2-13)
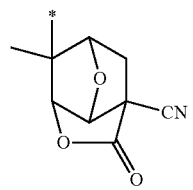
(r-Ic-2-14)
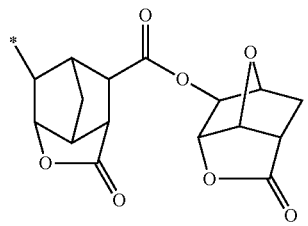
(r-Ic-2-15)
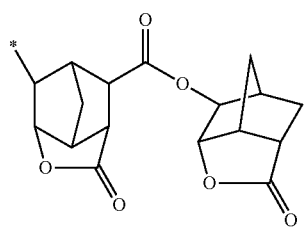
(r-Ic-2-16)
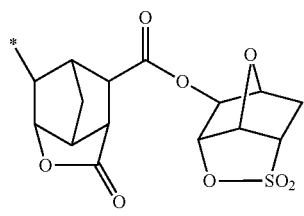
(r-Ic-2-17)
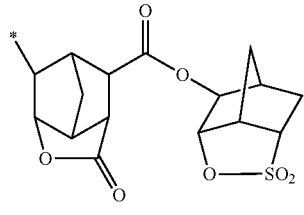
(r-Ic-2-18)
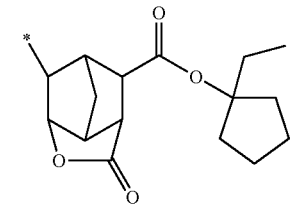
-continued
(r-Ic-3-1)
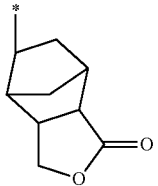
(r-Ic-3-2)
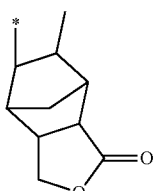
(r-Ic-3-3)
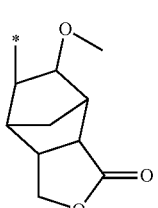
(r-Ic-3-4)
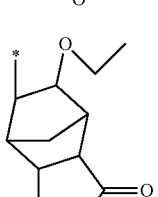
(r-Ic-3-5)
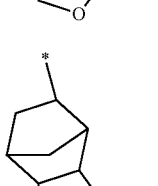
(r-Ic-4-1)
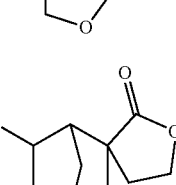
(r-Ic-4-2)
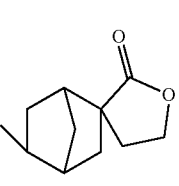
(r-Ic-4-3)
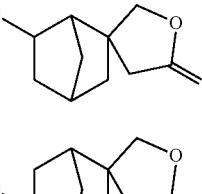
(r-Ic-4-4)

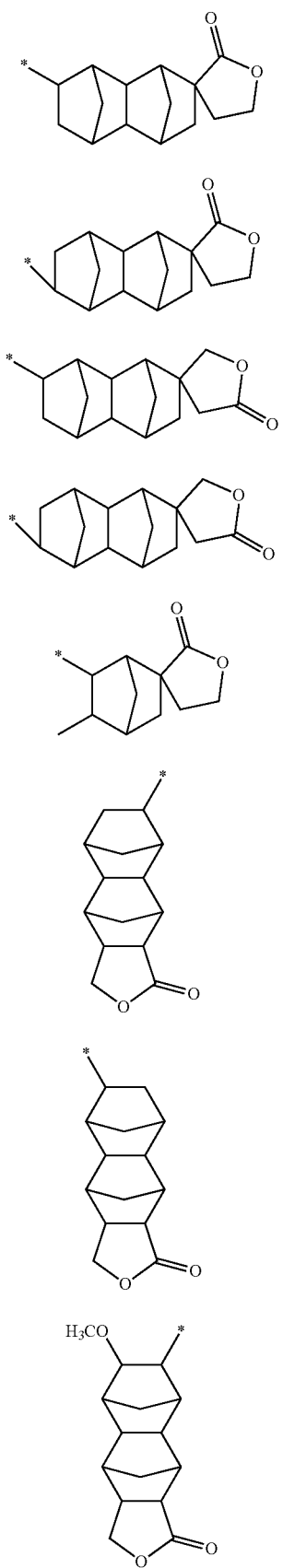
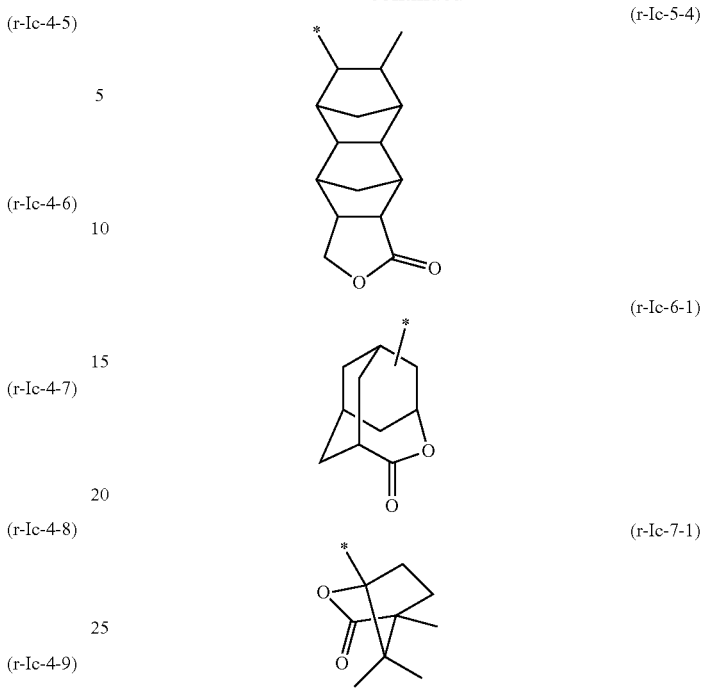

The "—SO$_2$-containing cyclic group" indicates a cyclic group having a ring containing —SO$_2$— in the ring skeleton thereof.

Specifically, the —SO$_2$-containing cyclic group is a cyclic group in which the sulfur atom (S) in —SO$_2$— forms a part of the ring skeleton of the cyclic group. In a case where the ring containing —SO$_2$— in the ring skeleton thereof is counted as the first ring and the group contains only the ring, the group is referred to as a monocyclic group. Further, in a case where the group has other ring structures, the group is referred to as a polycyclic group regardless of the structures. The —SO$_2$-containing cyclic group may be a monocyclic group or a polycyclic group. As the —SO$_2$-containing cyclic group, a cyclic group containing —O—SO$_2$— in the ring skeleton thereof, in other words, a cyclic group containing a sultone ring in which —O—S— in the —O—SO$_2$— group forms a part of the ring skeleton thereof is particularly preferable.

More specific examples of the —SO$_2$-containing cyclic group include groups each represented by General Formulae (a5-r-1) to (a5-r-4) shown below.

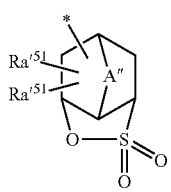

(a5-r-1)

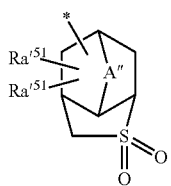

(a5-r-2)

-continued

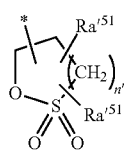
(a5-r-3)

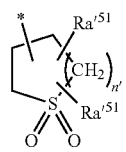
(a5-r-4)

[In the formulae, each Ra'⁵¹ independently represents a hydrogen atom, an alkyl group, an alkoxy group, a halogen atom, a halogenated alkyl group, a hydroxyl group, —COOR″, —OC(=O)R″, a hydroxyalkyl group, or a cyano group; R″ represents a hydrogen atom, an alkyl group, a lactone-containing cyclic group, a carbonate-containing cyclic group, or a —SO₂-containing cyclic group; A″ represents an oxygen atom, a sulfur atom, or an alkylene group having 1 to 5 carbon atoms, which may contain an oxygen atom or a sulfur atom; and n' represents an integer of 0 to 2.]

In General Formulae (a5-r-1) and (a5-r-2), A″ has the same definition as that for A″ in General Formulae (a2-r-2), (a2-r-3) and (a2-r-5).

Examples of the alkyl group, the alkoxy group, the halogen atom, the halogenated alkyl group, —COOR″, —OC(=O)R″, and the hydroxyalkyl group as Ra' include the same groups as those described above in the explanation of Ra'²¹ in General Formulae (a2-r-1) to (a2-r-7).

Specific examples of the groups each represented by General Formulae (a5-r-1) to (a5-r-4) are shown below. In the formulae shown below, "Ac" represents an acetyl group.

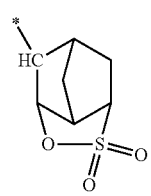
(r-s1-1-1)

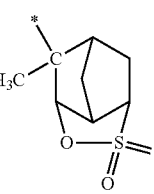
(r-s1-1-2)

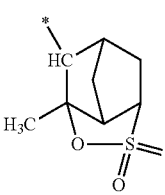
(r-s1-1-3)

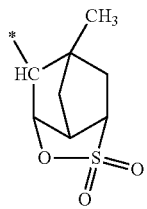
(r-s1-1-4)

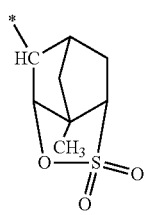
(r-s1-1-5)

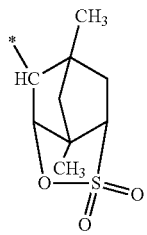
(r-s1-1-6)

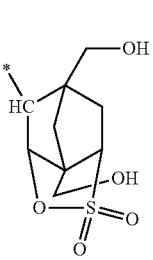
(r-s1-1-7)

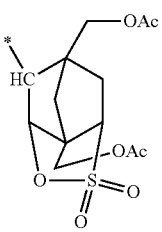
(r-s1-1-8)

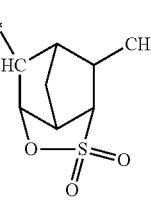
(r-s1-1-9)

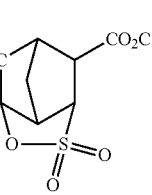
(r-s1-1-10)

(r-s1-1-11)
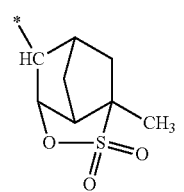
(r-s1-1-12)
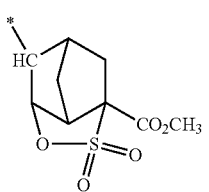
(r-s1-1-13)
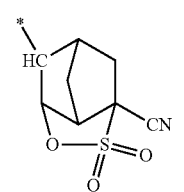
(r-s1-1-14)
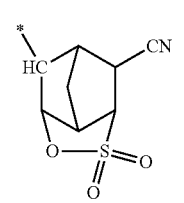
(r-s1-1-15)
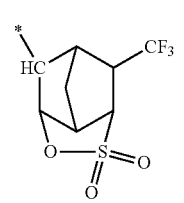
(r-s1-1-16)
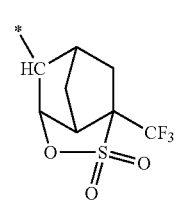
(r-s1-1-17)
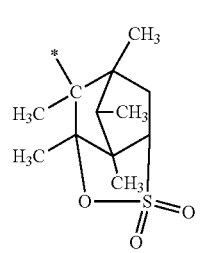
(r-s1-1-18)
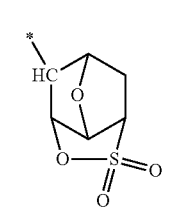
(r-s1-1-19)
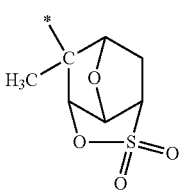
(r-s1-1-20)
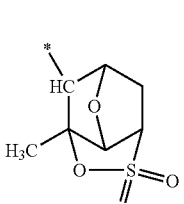
(r-s1-1-21)
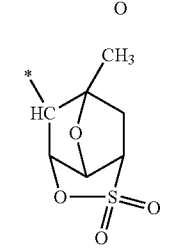
(r-s1-1-22)
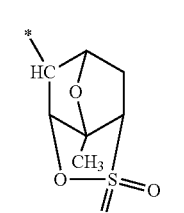
(r-s1-1-23)
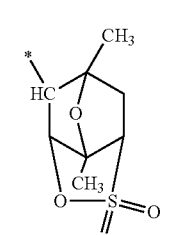
(r-s1-1-24)
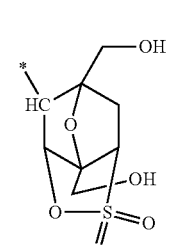
(r-s1-1-25)
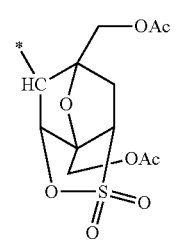

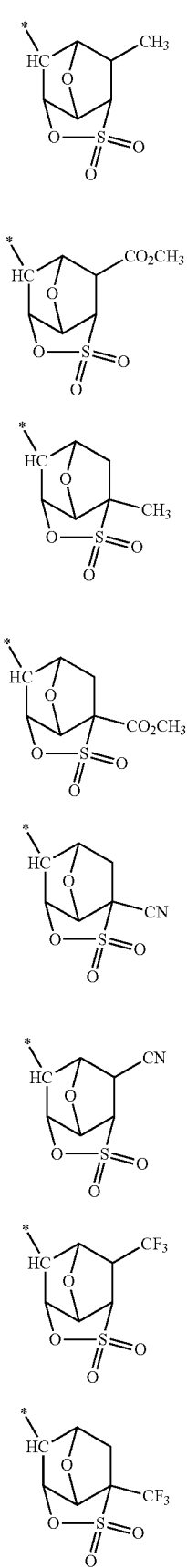

(r-s1-1-26)
(r-s1-1-27)
(r-s1-1-28)
(r-s1-1-29)
(r-s1-1-30)
(r-s1-1-31)
(r-s1-1-32)
(r-s1-1-33)

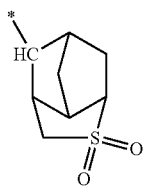

(r-s1-2-1)

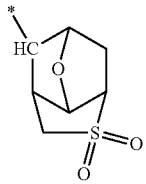

(r-s1-2-2)

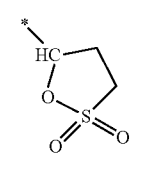

(r-s1-3-1)

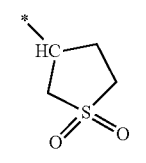

(r-s1-4-1)

The "carbonate-containing cyclic group" indicates a cyclic group having a ring (a carbonate ring) containing —O—C(=O)—O— in the ring skeleton thereof. In a case where the carbonate ring is counted as the first ring and the group contains only the carbonate ring, the group is referred to as a monocyclic group.

Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and any carbonate ring-containing cyclic group may be used. Specific examples thereof include groups each represented by General Formulae (ax3-r-1) to (ax3-r-3) shown below.

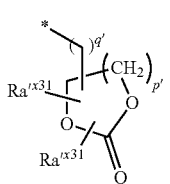

(ax3-r-1)

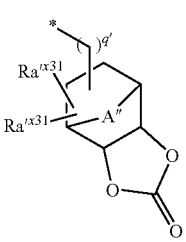

(ax3-r-2)

(ax3-r-3)

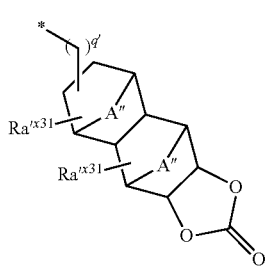

[In the formulae, each $Ra'^{x31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; A" represents an oxygen atom, a sulfur atom, or an alkylene group having 1 to 5 carbon atoms, which may contain an oxygen atom or a sulfur atom; and p' represents an integer of 0 to 3, and q' is 0 or 1.]

In General Formulae (ax3-r-2) and (ax3-r-3), A" has the same definition as that for A" in General Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as $Ra'^{31}$ include the same groups as those described above in the explanation of $Ra'^{21}$ in General Formulae (a2-r-1) to (a2-r-7).

Specific examples of the groups each represented by General Formulae (ax3-r-1) to (ax3-r-3) are shown below.

(r-cr-1-1)

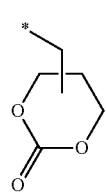

(r-cr-1-2)

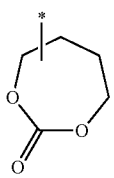

(r-cr-1-3)

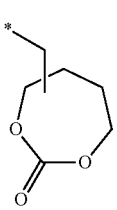

(r-cr-1-4)

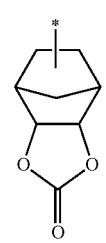

(r-cr-1-5)

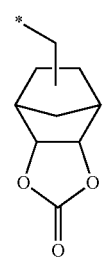

(r-cr-1-6)

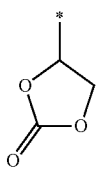

(r-cr-1-7)

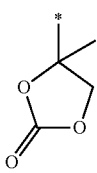

(r-cr-2-1)

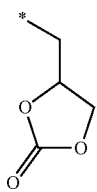

(r-cr-2-2)

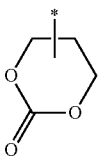

(r-cr-2-3)

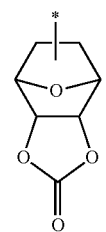

(r-cr-2-4)

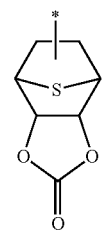

-continued (r-cr-3-1)

(r-cr-3-2)
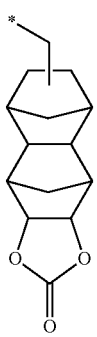

(r-cr-3-3)

(r-cr-3-4)
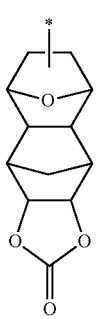

(r-cr-3-5)
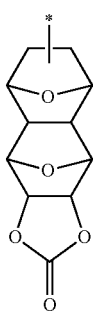

As the constitutional unit (a2), a constitutional unit derived from acrylic acid ester in which the hydrogen atom bonded to the carbon atom at the α-position may be substituted with a substituent is preferable.

The constitutional unit (a2) is preferably a constitutional unit represented by General Formula (a2-1).

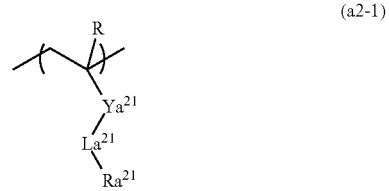
(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—, and R' represents a hydrogen atom or a methyl group. However, in a case where $La^{21}$ represents —O—, $Ya^{21}$ does not represent —CO—. $Ra^{21}$ represents a lactone-containing cyclic group, a carbonate-containing cyclic group, or a —$SO_2$-containing cyclic group.]

In Formula (a2-1), R has the same definition as described above. As R, a hydrogen atom, an alkyl group having 1 to 5 carbon atoms, or a fluorinated alkyl group having 1 to 5 carbon atoms is preferable, and a hydrogen atom or a methyl group is particularly preferable in terms of industrial availability.

In Formula (a2-1), the divalent linking group as $Ya^{21}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{21}$ represents a divalent hydrocarbon group which may have a substituent, the hydrocarbon group may be an aliphatic hydrocarbon group or an aromatic hydrocarbon group.

Aliphatic Hydrocarbon Group as $Ya^{21}$

The aliphatic hydrocarbon group indicates a hydrocarbon group that has no aromaticity. The aliphatic hydrocarbon group may be saturated or unsaturated.

In general, it is preferable that the aliphatic hydrocarbon group be saturated. Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group preferably has 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$) (CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$) CH$_2$CH$_2$CH$_2$—, and —CH$_2$CH(CH$_3$)CH$_2$CH$_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be mentioned.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group in which two hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which two hydrogen atoms have been removed from a polycycloalkane, and the polycycloalkane is preferably a group having 7 to 12 carbon atoms. Specific examples thereof include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

In the cyclic aliphatic hydrocarbon group, a part of carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group as Ya[21]

The aromatic hydrocarbon group is a hydrocarbon group having at least one aromatic ring.

The aromatic ring is not particularly limited as long as it is a cyclic conjugated system having (4n+2) 1 electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon ring have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group in which two hydrogen atoms have been removed from the above-described aromatic hydrocarbon ring or aromatic heterocyclic ring (an arylene group or a heteroarylene group); a group in which two hydrogen atoms have been removed from an aromatic compound having two or more aromatic rings (such as biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group obtained by further removing one hydrogen atom from an aryl group in arylalkyl groups such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aryl group or the heteroaryl group is preferably in a range of 1 to 4, more preferably 1 or 2, and particularly preferably 1.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is most preferable.

As the alkoxy group, the halogen atom, and the halogenated alkyl group as the substituents, the same groups as the above-described substituents for substituting a hydrogen atom which the cyclic aliphatic hydrocarbon group has can be mentioned.

Divalent Linking Group Containing Hetero Atom

In a case where $Ya^{21}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=)—O]m, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, 0 represents an oxygen atom, and m″ represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In General Formula —Y$^{21}$—O—Y$^{22}$—, —Y$^{21}$—, —Y$^{21}$—C(=O)—O—, —C(=O)—O—Y$^{21}$—, —[Y$^{21}$—C(=O)—O]$_{m''}$—Y$^{22}$, —Y$^{21}$—C(=)—Y$^{22}$—, or —Y$^{21}$—S(=O)$_2$—O—Y$^{22}$—, Y$^{21}$, and Y$^{22}$ each independently represents a divalent hydrocarbon group which may have a substituent. Examples of the divalent hydrocarbon group include those (mentioned as the divalent hydrocarbon group which may have a substituent) in the description of the above-described divalent linking group as Ya$^{21}$.

As Y$^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y$^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m″ represents an integer of 0 to 3, preferably an integer of 0 to 2, more preferably 0 or 1, and particularly preferably 1. In other words, it is particularly preferable that the group represented by Formula —[Y$^{21}$—C(=O)—O]$_{m''}$—Y$^{22}$— represent a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among the above, as Ya$^{21}$, a single bond, an ester bond [—C(=O)—O—], an ether bond (—O—), a linear or branched alkylene group, or a combination of these is preferable.

In Formula (a2-1), Ra$^{21}$ represents a lactone-containing cyclic group, a —SO$_2$— containing cyclic group, or a carbonate-containing cyclic group.

Suitable examples of the lactone-containing cyclic group, the —SO$_2$-containing cyclic group, and the carbonate-containing cyclic group as Ra$^{21}$ include groups each represented by General Formulae (a2-r-1) to (a2-r-7), groups each represented by General Formulae (a5-r-1) to (a5-r-4), and groups each represented by General Formulae (ax3-r-1) to (ax3-r-3) described above.

Among them, a lactone-containing cyclic group or a —SO$_2$-containing cyclic group is preferable, and groups each represented by General Formula (a2-r-1), (a2-r-2), (a2-r-6), or (a5-r-1) are more preferable. Specifically, groups each represented by any of Chemical Formulae (r-1c-1-1) to (r-1c-1-7), (r-1c-2-1) to (r-1c-2-18), (r-1c-6-1), (r-s1-1-1), and (r-s1-1-18) are more preferable.

The constitutional unit (a2) which the component (A1) has may be one kind or may be two or more kinds.

In a case where the component (A1) has the constitutional unit (a2), the proportion of the constitutional unit (a2) in the component (A1) is preferably in a range of 5% to 60% by mole, more preferably in a range of 10% to 60% by mole, still more preferably in a range of 20% to 55% by mole, and particularly preferably in a range of 30% to 50% by mole, with respect to the total amount (100% by mole) of all constitutional units constituting the component (A1).

In a case where the proportion of the constitutional unit (a2) is equal to or greater than the lower limit of the above-described preferred range, the effect obtained by allowing the component (A1) to contain the constitutional unit (a2) can be sufficiently achieved by the effect described above. In a case where the proportion of the constitutional unit (a2) is equal to or lower than the upper limit of the above-described preferred range, balance with other constitutional units can be obtained, and various lithography characteristics are improved.

In Regard to Constitutional Unit (a3):

The component (A1) may further have, as necessary, a constitutional unit (a3) (provided that a constitutional unit corresponding to the constitutional unit (a1) or the constitutional unit (a2) is excluded) containing an aliphatic hydrocarbon group having a polar group, in addition to the constitutional unit (a1). In a case where the component (A1) has the constitutional unit (a3), the hydrophilicity of the component (A) is increased, which contributes to an improvement in resolution. Further, acid diffusion length can be appropriately adjusted.

Examples of the polar group include a hydroxyl group, a cyano group, a carboxy group, or a hydroxyalkyl group in which a part of hydrogen atoms of the alkyl group have been substituted with fluorine atoms, and the polar group is particularly preferably a hydroxyl group.

Examples of the aliphatic hydrocarbon group include linear or branched hydrocarbon groups (preferably alkylene groups) having 1 to 10 carbon atoms, and cyclic aliphatic hydrocarbon groups (cyclic groups). The cyclic group may be a monocyclic group or a polycyclic group. For example, these cyclic groups can be suitably selected from a large number of groups that have been proposed in resins for a resist composition for ArF excimer lasers.

In a case where the cyclic group is a monocyclic group, the monocyclic group preferably has 3 to 10 carbon atoms. Among them, a constitutional unit derived from an acrylic acid ester that includes an aliphatic monocyclic group containing a hydroxyl group, cyano group, carboxy group, or a hydroxyalkyl group in which a part of hydrogen atoms of the alkyl group have been substituted with fluorine atoms is particularly preferable. Examples of the monocyclic group include a group in which two or more hydrogen atoms have been removed from a monocycloalkane. Specific examples of the monocyclic group include a group in which two or more hydrogen atoms have been removed from a monocycloalkane such as cyclopentane, cyclohexane, or cyclooctane. Among these monocyclic groups, a group in which two or more hydrogen atoms have been removed from cyclopentane or a group in which two or more hydrogen atoms have been removed from cyclohexane are industrially preferable.

In a case where the cyclic group is a polycyclic group, the polycyclic group preferably has 7 to 30 carbon atoms. Among them, a constitutional unit derived from an acrylic acid ester that includes an aliphatic polycyclic group containing a hydroxyl group, cyano group, carboxy group, or a hydroxyalkyl group in which a part of hydrogen atoms of the alkyl group have been substituted with fluorine atoms is particularly preferable. Examples of the polycyclic group include groups in which two or more hydrogen atoms have been removed from a bicycloalkane, tricycloalkane, tetracycloalkane, or the like. Specific examples thereof include a group in which two or more hydrogen atoms have been removed from a polycycloalkane such as adamantane, norbornane, isobornane, tricyclodecane, or tetracyclododecane. Among these polycyclic groups, groups in which two or more hydrogen atoms have been removed from adamantane, groups in which two or more hydrogen atoms have been removed from norbornane or groups in which two or more hydrogen atoms have been removed from tetracyclododecane are industrially preferable.

The constitutional unit (a3) is not particularly limited, and any constitutional unit may be used as long as the constitutional unit contains a polar group-containing aliphatic hydrocarbon group.

The constitutional unit (a3) is a constitutional unit derived from acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the aliphatic hydrocarbon group containing a polar group is a linear or branched hydrocarbon group having 1 to 10 carbon atoms, the constitutional unit (a3) is preferably a constitutional unit derived from a hydroxyethyl ester of acrylic acid.

Further, as the constitutional unit (a3), in a case where the hydrocarbon group in the aliphatic hydrocarbon group containing a polar group is a polycyclic group, a constitutional unit represented by Formula (a3-1), a constitutional unit represented by Formula (a3-2), and a constitutional unit represented by Formula (a3-3) are preferable, and in a case where the hydrocarbon group is a monocyclic group, a constitutional unit represented by Formula (a3-4) is preferable.

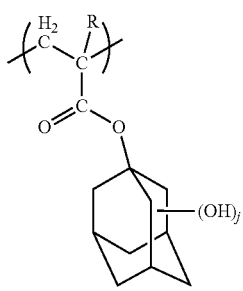

(a3-1)

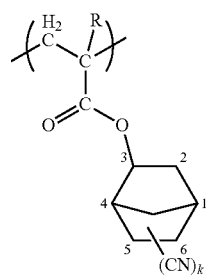

(a3-2)

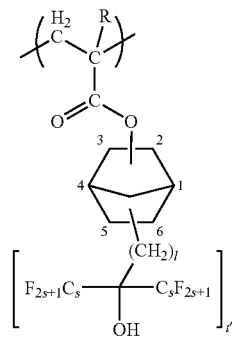

(a3-3)

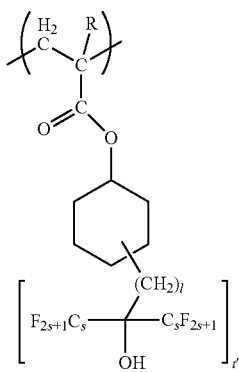

(a3-4)

[In the formulae, R has the same definition as described above, j represents an integer of 1 to 3, k represents an integer of 1 to 3, C represents an integer of 1 to 3, l represents an integer of 0 to 5, and s represents an integer of 1 to 3.]

In Formula (a3-1), j preferably represents 1 or 2 and more preferably 1. In a case where j represents 2, it is preferable that the hydroxyl groups be bonded to the 3- and the 5-positions of the adamantyl group. In a case where j represents 1, it is preferable that the hydroxyl group be bonded to the 3-position of the adamantyl group. It is preferable that j represent 1, and it is particularly preferable that the hydroxyl group be bonded to the 3-position of the adamantyl group.

In Formula (a3-2), k preferably represents 1. The cyano group is preferably bonded to the 5- or the 6-position of the norbornyl group.

In Formula (a3-3), it is preferable that t' represent 1. It is preferable that 1 represent 1. It is preferable that s represent 1. Further, it is preferable that a 2-norbornyl group or 3-norbornyl group be bonded to the terminal of the carboxy group of the acrylic acid. It is preferable that the fluorinated alkyl alcohol be bonded to the 5- or 6-position of the norbornyl group.

In Formula (a3-4), it is preferable that t' represent 1 or 2. It is preferable that l represent 0 or 1. It is preferable that s represent 1. It is preferable that the fluorinated alkyl alcohol be bonded to the 3- or 5-position of the cyclohexyl group.

The constitutional unit (a3) which the component (A1) has may be one kind or may be two or more kinds.

In a case where the component (A1) has the constitutional unit (a3), the proportion of the constitutional unit (a3) is preferably in a range of 1% to 30% by mole, more preferably in a range of 2% to 25% by mole, and still more preferably in a range of 5% to 20% by mole, with respect to the total amount (100% by mole) of all constitutional units constituting the component (A1).

In a case where the proportion of the constitutional unit (a3) is equal to or greater than the lower limit of the above-described preferred range, the effect obtained by allowing the component (A1) to contain the constitutional unit (a3) can be sufficiently achieved by the effect described above.

In a case where the proportion of the constitutional unit (a3) is equal to or lower than the upper limit of the above-described preferred range, balance with other constitutional units can be obtained, and various lithography characteristics are improved.

In regard to constitutional unit (a4):

The component (A1) may further have, in addition to the constitutional unit (a1), a constitutional unit (a4) containing an acid non-dissociable aliphatic cyclic group.

In a case where the component (A1) has the constitutional unit (a4), the dry etching resistance of the formed resist pattern is improved. Further, the hydrophobicity of the component (A) increases. The improvement in hydrophobicity contributes to the improvement in resolution, a resist pattern shape, and the like, particularly in the case of a solvent developing process. The "acid non-dissociable cyclic group" in the constitutional unit (a4) is a cyclic group that remains in the constitutional unit without being dissociated even when an acid acts in a case where the acid is generated in the resist composition by exposure (for example, in a case where an acid is generated from the constitutional unit generating an acid upon exposure or the component (B)).

Examples of the constitutional unit (a4) preferably include a constitutional unit derived from an acrylic acid ester including an acid non-dissociable aliphatic cyclic group. As the cyclic group, many cyclic groups conventionally known as cyclic groups used as a resin component of a resist composition for ArF excimer laser, KrF excimer laser (preferably ArF excimer laser), or the like can be used.

The cyclic group is particularly preferably at least one selected from a tricyclodecyl group, an adamantyl group, a tetracyclododecyl group, an isobornyl group, and a norbornyl group, from the viewpoint of industrial availability. These polycyclic groups may have, as a substituent, a linear or branched alkyl group having 1 to 5 carbon atoms.

Specific examples of the constitutional unit (a4) include constitutional units each represented by General Formulae (a4-1) to (a4-7).

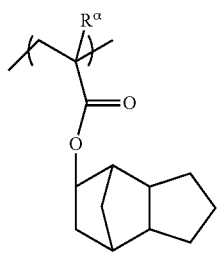

(a4-1)

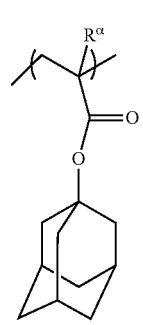

(a4-2)

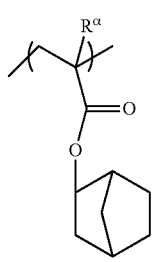

(a4-3)

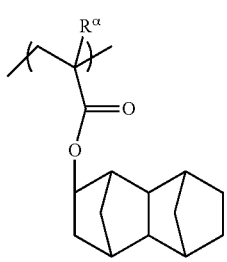

(a4-4)

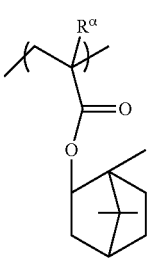

(a4-5)

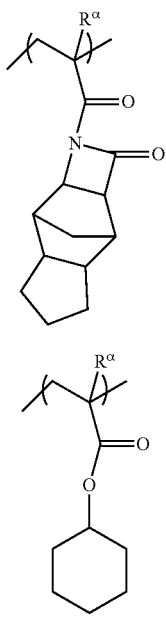

[In the formula, Ra is the same as above.]

The constitutional unit (a4) which the component (A1) has may be one kind or may be two or more kinds.

In a case where the component (A1) has the constitutional unit (a4), the proportion of the constitutional unit (a4) is preferably in a range of 1% to 40% by mole and more preferably in a range of 5% to 20% by mole, with respect to the total amount (100% by mole) of all constitutional units constituting the component (A1).

In a case where the proportion of the constitutional unit (a4) is equal to or greater than the lower limit of the preferred range, the effect obtained by allowing the component (A1) to contain the constitutional unit (a4) can be sufficiently achieved.

In a case where the proportion of the constitutional unit (a4) is equal to or lower than the upper limit of the preferred range, the balance with other constitutional units is obtained easily.

In Regard to Constitutional Unit (St):

The constitutional unit (st) is a constitutional unit derived from styrene or a styrene derivative. A "constitutional unit derived from styrene" means a constitutional unit that is formed by the cleavage of an ethylenic double bond of styrene. A "constitutional unit derived from a styrene derivative" means a constitutional unit (provided that a constitutional unit corresponding to the constitutional unit (a10) is excluded) formed by the cleavage of an ethylenic double bond of a styrene derivative.

The "styrene derivative" means a compound in which at least a part of hydrogen atoms of styrene are substituted with a substituent. Examples of the styrene derivative include a derivative in which the hydrogen atom at the α-position of styrene is substituted with a substituent, a derivative in which one or more hydrogen atoms of the benzene ring of styrene are substituted with a substituent, and a derivative in which a hydrogen atom at the α-position of styrene and one or more hydrogen atoms of the benzene ring are substituted with a substituent.

As the substituent for substituting the hydrogen atom at the α-position of styrene, an alkyl group having 1 to 5 carbon atoms or a halogenated alkyl group having 1 to 5 carbon atoms can be mentioned.

As the alkyl group having 1 to 5 carbon atoms, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is a group in which part or all of hydrogen atoms in the alkyl group having 1 to 5 carbon atoms have been substituted with halogen atoms. The halogen atom is particularly preferably a fluorine atom.

The substituent for substituting the hydrogen atom at the α-position of styrene is preferably an alkyl group having 1 to 5 carbon atoms or a fluorinated alkyl group having 1 to 5 carbon atoms, more preferably an alkyl group having 1 to 3 carbon atoms or a fluorinated alkyl group having 1 to 3 carbon atoms, and still more preferably a methyl group from the viewpoint of industrial availability.

Examples of the substituent for substituting the hydrogen atom of the benzene ring of styrene include an alkyl group, an alkoxy group, a halogen atom, and a halogenated alkyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

As the substituent for substituting the hydrogen atom of the benzene ring of styrene, an alkyl group having 1 to 5 carbon atoms is preferable, a methyl group or an ethyl group is more preferable, and a methyl group is still more preferable.

The constitutional unit (st) is preferably a constitutional unit derived from styrene or a constitutional unit derived from a styrene derivative in which the hydrogen atom at the α-position of styrene is substituted with an alkyl group having 1 to 5 carbon atoms or a halogenated alkyl group having 1 to 5 carbon atoms, more preferably a constitutional unit derived from styrene, or a constitutional unit derived from a styrene derivative in which the hydrogen atom at the α-position of styrene is substituted with a methyl group, and still more preferably a constitutional unit derived from styrene.

The constitutional unit (st) which the component (A1) has may be one kind or may be two or more kinds.

In a case where the component (A1) has the constitutional unit (st), the proportion of the constitutional unit (st) is preferably in a range of 1% to 30% by mole and more preferably in a range of 3% to 20% by mole with respect to the total amount (100% by mole) of all constitutional units constituting the component (A).

The component (A1) contained in the resist composition may be used alone or in a combination of two or more kinds thereof.

In the resist composition according to the present embodiment, the component (A1) contains a high-molecular-weight compound having a repeated structure of the constitutional unit (a1).

The preferred component (A1) contains a high-molecular-weight compound having a repeated structure of the constitutional unit (a1) and the constitutional unit (a10).

In this case, the proportion of the constitutional unit (a1) in the high-molecular-weight compound is preferably in a range of 5% to 80% by mole, more preferably in a range of 10% to 75% by mole, still more preferably in a range of 30% to 70% by mole, and particularly preferably in a range of 40% to 60% by mole, with respect to the total amount (100% by mole) of all constitutional units constituting the high-molecular-weight compound.

In addition, the proportion of the constitutional unit (a10) in the high-molecular-weight compound is preferably in a range of 5% to 80% by mole, more preferably in a range of 10% to 75% by mole, still more preferably in a range of 30% to 70% by mole, and particularly preferably in a range of 40% to 60% by mole, with respect to the total amount (100% by mole) of all constitutional units constituting the high-molecular-weight compound.

The molar ratio (constitutional unit (a1):constitutional unit (a10)) of the constitutional unit (a1) to the constitutional unit (a10) in the high-molecular-weight compound is preferably 2:8 to 8:2, more preferably 3:7 to 7:3, and still more preferably 4:6 to 6:4.

The component (A1) can be produced by dissolving, in a polymerization solvent, each monomer from which the constitutional unit is derived, adding thereto a radical polymerization initiator such as azobisisobutyronitrile (AIBN) or dimethyl azobisisobutyrate (for example, V-601) to perform polymerization.

Alternatively, the component (A1) can be produced by dissolving, in a polymerization solvent, a monomer from which the constitutional unit (a1) is derived and, as necessary, a monomer from which a constitutional unit other than the constitutional unit (a1) is derived, and adding thereto a radical polymerization initiator such as described above to perform polymerization and then performing a deprotection reaction.

Further, a —C(CF$_3$)$_2$—OH group may be introduced into the terminal of the component (A1) during the polymerization using a chain transfer agent such as HS—CH$_2$—CH$_2$—CH$_2$—C(CF$_3$)$_2$—OH in combination. As described above, a copolymer into which a hydroxyalkyl group, formed by substitution of a part of hydrogen atoms in the alkyl group with fluorine atoms, has been introduced is effective for reducing development defects and reducing line edge roughness (LER: uneven irregularities of a line side wall).

The weight-average molecular weight (Mw) (based on the polystyrene-equivalent value determined by gel permeation chromatography (GPC)) of the component (A1), which is not particularly limited, is preferably in a range of 1,000 to 50,000, more preferably in a range of 2,000 to 30,000, and still more preferably in a range of 3,000 to 20,000.

In a case where Mw of the component (A1) is equal to or lower than the upper limit of the above-described range, the resist composition exhibits sufficient solubility in a solvent for a resist such that the resist composition can be used as a resist composition. On the other hand, in a case where Mw of the component (A1) is equal to or greater than the lower limit of the above-described range, dry etching resistance and the cross-sectional shape of the resist pattern become excellent.

Further, the dispersity (Mw/Mn) of the component (A1) is not particularly limited, but is preferably in a range of 1.0 to 4.0, more preferably in a range of 1.0 to 3.0, and particularly preferably in a range of 1.0 to 2.0. Mn represents the number-average molecular weight.

In Regard to Component (A2)

In the resist composition according to the present embodiment, a base material component (hereinafter, referred to as a "component (A2)") whose solubility in a developing solution is changed by action of an acid, which does not correspond to the component (A1), may be used in combination as the component (A).

The component (A2) is not particularly limited and may be freely selected and used from a large number of conventionally known base material components for the chemical amplification-type resist composition.

As the component (A2), a high-molecular-weight compound or a low-molecular-weight compound may be used alone or in a combination of two or more kinds thereof.

The proportion of the component (A1) in the component (A) is preferably 25% by mass or greater, more preferably 50% by mass or greater, still more preferably 75% by mass or greater, and may be 100% by mass with respect to the total mass of the component (A). In a case where the proportion is 25% by mass or more, a resist pattern having various excellent lithography characteristics, such as high sensitivity, improvement in resolution or roughness can be easily formed.

The content of the component (A) in the resist composition according to the present embodiment may be adjusted depending on the resist film thickness to be formed and the like.

<Component (E1)>

The resist composition according to the present embodiment further contains the compound (E1) (component (E1)) represented by General Formula (e1) in addition to the component (A).

The component (E1) is a compound represented by General Formula (e1). In a case where the component (E1) is used, lithography characteristics such as roughness and a pattern shape can be improved.

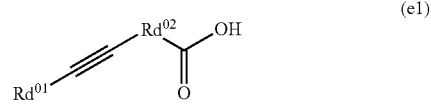

(e1)

In Formula (e1), $Rd^{01}$ represents a monovalent organic group. Examples of the monovalent organic group include a monovalent hydrocarbon group which may have a substituent. The monovalent hydrocarbon group preferably has 1 to 20 carbon atoms, more preferably 2 to 15 carbon atoms, and still more preferably 3 to 10 carbon atoms. Examples of the monovalent hydrocarbon group include a chain-like aliphatic hydrocarbon group which may have a substituent and a cyclic hydrocarbon group which may have a substituent.

Chain-Like Aliphatic Hydrocarbon Group which May have Substituent

The chain-like aliphatic hydrocarbon group may be linear or branched. The chain-like aliphatic hydrocarbon group may be saturated or unsaturated. Examples of the chain-like aliphatic hydrocarbon group include a linear or branched alkyl group, a linear or branched chain-like alkenyl group, and a linear or branched alkynyl group.

The linear alkyl group preferably has 1 to 20 carbon atoms, more preferably 2 to 15 carbon atoms, and still more preferably 3 to 10 carbon atoms.

The branched alkyl group preferably has 2 to 15 carbon atoms and more preferably 3 to 10 carbon atoms. Specific examples of the branched alkyl group include the same group as that mentioned in $Ra^{t3}$ in Formula (a1-r-1).

Among them, the linear or branched alkyl group is preferably an n-butyl group, an isobutyl group, an n-pentyl group, an isopentyl group, or a neopentyl group.

The linear alkenyl group preferably has 2 to 15 carbon atoms and more preferably 3 to 10 carbon atoms. The branched alkenyl group preferably has 3 to 15 carbon atoms and more preferably 3 to 10 carbon atoms. Examples of the linear alkenyl group include a vinyl group, a 1-propenyl group, a 2-propenyl group (an allyl group), and a butenyl group. Examples of the branched alkenyl group include a 1-methylvinyl group, a 1-methylpropenyl group, and a 2-methylpropenyl group.

The linear alkynyl group preferably has 2 to 15 carbon atoms and more preferably 3 to 10 carbon atoms. The branched alkynyl group preferably has 5 to 15 carbon atoms and more preferably 5 to 10 carbon atoms. Examples of the linear alkynyl group include an ethynyl group, a 1-propynyl group, a 2-propynyl group, a 1-butynyl group, and a 2-butynyl group. Examples of the branched alkynyl group include a 3-methyl-1-butynyl group, a 1-methyl-2-butynyl group, and a 1-methyl-3-butynyl group.

Among them, the linear or branched alkynyl group is preferably a 1-butenyl group or the like.

The chain-like aliphatic hydrocarbon group may have a substituent or may not have a substituent. Examples of the substituent which the chain-like aliphatic hydrocarbon group may have include an alkoxy group, a halogen atom, a halogenated alkyl group, a hydroxyl group, a carbonyl group, a nitro group, and an amino group.

Cyclic Hydrocarbon Group which May have Substituent

The cyclic hydrocarbon group may be an aromatic hydrocarbon group or an aliphatic hydrocarbon group. The aliphatic hydrocarbon group may be saturated or unsaturated but is preferably saturated.

The aromatic hydrocarbon group is a hydrocarbon group having an aromatic ring. The aromatic hydrocarbon group preferably has 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Examples of the aromatic ring which the aromatic hydrocarbon group has include benzene, fluorene, naphthalene, anthracene, phenanthrene, biphenyl, or an aromatic heterocyclic ring in which a part of carbon atoms constituting any of these aromatic rings have been substituted with hetero atoms. Examples of the hetero atom in the aromatic heterocyclic rings include an oxygen atom, a sulfur atom, and a nitrogen atom.

Examples of the aromatic hydrocarbon group include a group in which one hydrogen atom has been removed from the above-described aromatic ring (an aryl group such as a phenyl group or a naphthyl group) and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (the alkyl chain in the arylalkyl group) preferably has 1 to 4 carbon atoms and more preferably 1 or 2 carbon atoms.

Examples of the cyclic aliphatic hydrocarbon group include aliphatic hydrocarbon groups containing a ring in the structure thereof. Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of the linear branched aliphatic hydrocarbon group, and a group in which the alicyclic hydrocarbon group is interposed in the linear or branched aliphatic hydrocarbon group.

The alicyclic hydrocarbon group preferably has 3 to 20 carbon atoms, more preferably 5 to 12 carbon atoms, and still more preferably 5 to 10 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a polycycloalkane. The polycycloalkane preferably has 7 to 30 carbon atoms. Examples of the polycycloalkane include: a polycycloalkane having a bridged ring-based polycyclic skeleton, such as adamantane, norbornane, isobornane, tricyclodecane, or tetracyclododecane; and a polycycloalkane having a condensed ring-based polycyclic skeleton, such as a cyclic group having a steroid skeleton.

Among them, the cyclic aliphatic hydrocarbon group is preferably a group in which one or more hydrogen atoms have been removed from a monocycloalkane or a polycycloalkane, more preferably a group in which one hydrogen atom has been removed from a monocycloalkane, still more preferably a cyclopentyl group or a cyclohexyl group, and particularly preferably a cyclohexyl group.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms. The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group in the alkylalkylene group, a linear alkyl group having 1 to 5 carbon atoms is preferable.

The cyclic hydrocarbon group may contain a hetero atom such as a heterocyclic ring. Examples of the cyclic hydrocarbon group which contains a hetero atom include lactone-containing cyclic groups each represented by General Formulae (a2-r-1) to (a2-r-7), —SO₂-containing cyclic groups each represented by General Formulae (a5-r-1) to (a5-r-4), and other heterocyclic groups each represented by Chemical Formulae (r-hr-1) to (r-hr-16). In the formulas,* represents a bond that is bonded to a carbon atom of the triple bond in Formula (e1).

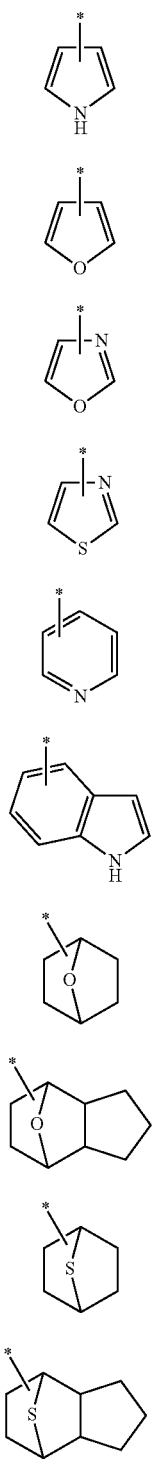

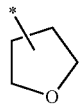

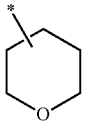

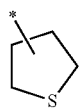

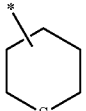

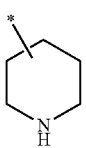

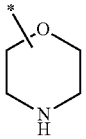

The cyclic hydrocarbon group may have a substituent or may not have a substituent. Examples of the substituent which the cyclic hydrocarbon group may have include an alkyl group, an alkoxy group, a halogen atom, a halogenated alkyl group, a hydroxyl group, a carbonyl group, and a nitro group.

The alkyl group as the substituent preferably has 1 to 5 carbon atoms. Specific examples thereof include a methyl group, an ethyl group, a propyl group, an n-butyl group, and a tert-butyl group. The alkoxy group as the substituent preferably has 1 to 5 carbon atoms. Specific examples thereof include a methoxy group, an ethoxy group, an n-propoxy group, an iso-propoxy group, an n-butoxy group, and a tert-butoxy group, and a methoxy group or an ethoxy group is preferable.

The halogen atom as the substituent is preferably a fluorine atom.

Examples of the halogenated alkyl group as the substituent include a group in which part or all of hydrogen atoms in the alkyl group having 1 to 5 carbon atoms have been substituted with the above-described halogen atoms.

The carbonyl group as the substituent is a group that is substituted for a methylene group (—CH₂—) constituting the cyclic hydrocarbon group.

The substituent which the cyclic hydrocarbon group may have is preferably an alkyl group, a halogen atom, or a halogenated alkyl group, more preferably a halogen atom, and still more preferably a fluorine atom.

The cyclic hydrocarbon group may be a condensed ring-type group containing a condensed ring in which an aliphatic hydrocarbon ring and an aromatic ring are condensed.

Examples of the condensed ring include a condensed ring in which one or more aromatic rings are condensed with a polycycloalkane having a bridged ring-based polycyclic skeleton. Specific examples of the bridged ring-based polycycloalkane include bicycloalkanes such as bicyclo[2.2.1]heptane (norbornane) and bicyclo[2.2.2]octane. The condensed ring type is preferably a group containing a condensed ring in which two or three aromatic rings are condensed with a bicycloalkane and more preferably a group containing a condensed ring in which two or three aromatic rings are condensed with bicyclo[2.2.2]octane. Specific examples of the condensed ring-type group include a group represented by Formulae (r-br-1) to (r-br-2). In the formulas, * represents a bond that is bonded to a carbon atom of the triple bond in Formula (e1).

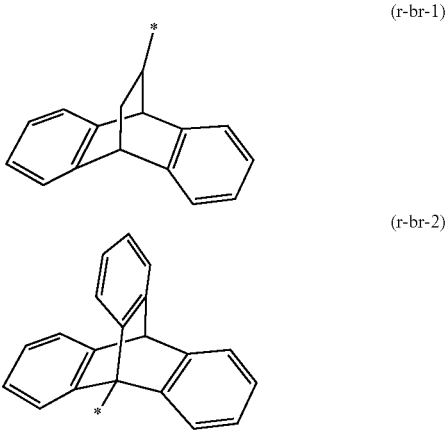

(r-br-1)

(r-br-2)

Examples of the substituent which the condensed ring-type group may have include an alkyl group, an alkoxy group, a halogen atom, a halogenated alkyl group, a hydroxyl group, a carbonyl group, a nitro group, an aromatic hydrocarbon group, and an alicyclic hydrocarbon group.

Examples of the alkyl group, the alkoxy group, the halogen atom, and the halogenated alkyl group as the substituent include the same substituent which is mentioned as the above-described substituent of the cyclic hydrocarbon group. Examples of the aromatic hydrocarbon group as the substituent of the condensed ring-type group include a group in which one hydrogen atom has been removed from the above-described aromatic ring (an aryl group, for example, a phenyl group and a naphthyl group), a group in which one hydrogen atom in the aromatic ring has been substituted with an alkylene group (for example, arylalkyl groups such as a benzyl group, a phenethyl group, a 1-naphthylmethyl group, a 2-naphthylmethyl group, 1-naphthylethyl group, and a 2-naphthylethyl group), and heterocyclic groups respectively represented by Formulae (r-hr-1) to (r-hr-6).

Examples of the alicyclic hydrocarbon group as the substituent of the condensed ring-type group include: a group in which one hydrogen atom has been removed from monocycloalkanes such as cyclopentane and cyclohexane; a group in which one hydrogen atom has been removed from polycycloalkanes such as adamantane, norbornane, isobornane, tricyclodecane, and tetracyclododecane; lactone-containing cyclic groups respectively represented by General Formulae (a2-r-1) to (a2-r-7); —$SO_2$— containing cyclic groups respectively represented by General Formulae (a5-r-1) to (a5-r-4); and heterocyclic groups respectively represented by Formulae (r-hr-7) to (r-hr-16).

Among them, $Rd^{o1}$ is preferably a cyclic hydrocarbon group. In a case where $Rd^{o1}$ is a cyclic hydrocarbon group, roughness and a pattern shape are further improved. $Rd^{o1}$ is preferably a monocyclic aliphatic hydrocarbon group or an aromatic hydrocarbon group and more preferably an aromatic hydrocarbon group. $Rd^{o1}$ is particularly preferably a phenyl group, a benzyl group, or a phenethyl group and most preferably a phenyl group.

In Formula (e1), $Rd^{o2}$ represents a single bond or a divalent linking group. Examples of the divalent linking group include a divalent hydrocarbon group which may have a substituent and a divalent linking group containing a hetero atom. Specific examples of the divalent linking group include the same divalent linking group as that mentioned in $Ya^{x1}$ in Formula (a10-1). The divalent linking group as $Rd^{o2}$ preferably has 1 to 20 carbon atoms, more preferably 1 to 10 carbon atoms, still more preferably 1 to 6 carbon atoms, particularly preferably 1 to 3 carbon atoms, and most preferably 1 or 2 carbon atoms.

Among them, the divalent linking group as $Rd^{o2}$ is preferably a divalent hydrocarbon group which may have a substituent, more preferably an aliphatic hydrocarbon group which may have a substituent, still more preferably a linear or branched aliphatic hydrocarbon group which may have a substituent, and particularly preferably a linear or branched alkylene group which may have a substituent.

The divalent hydrocarbon group may have a substituent or may not have a substituent. Examples of the substituent which the divalent hydrocarbon group may have include the same substituent as that mentioned in $Ya^{x1}$ in Formula (a10-1).

$Rd^{o2}$ is preferably a single bond or a linear or branched alkylene group, more preferably a single bond, a methylene group, an ethylene group, a propylene group, or an isopropylene group, still more preferably a single bond or a methylene group, and particularly preferably a single bond.

The component (E1) is preferably a compound represented by General Formula (e1-1).

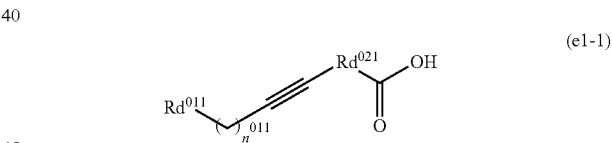

(e1-1)

[In the formula, $Rd^{o11}$ represents a cyclic hydrocarbon group which may have a substituent. $Rd^{o21}$ represents a single bond or a linear or branched alkylene group. $n^{o11}$ represents an integer of 0 to 3.]

In Formula (e1-1), $Rd^{o11}$ represents a cyclic hydrocarbon group which may have a substituent. Examples of the cyclic hydrocarbon group include the same hydrocarbon group as that mentioned in $Rd^{o1}$ in Formula (e1). The cyclic hydrocarbon group is preferably an aromatic hydrocarbon group and more preferably a phenyl group.

In Formula (e1-1), $Rd^{o21}$ represents a single bond or a linear or branched alkylene group. The linear or branched alkylene group more preferably has 1 to 10 carbon atoms, still more preferably 1 to 6 carbon atoms, particularly preferably 1 to 3 carbon atoms, and most preferably 1 or 2 carbon atoms.

$Rd^{o21}$ is preferably a single bond or a linear alkylene group having 1 to 6 carbon atoms, more preferably a single bond or a linear alkylene group having 1 to 3 carbon atoms, still more preferably a single bond or a methyl group, and particularly preferably a single bond.

In Formula (e1-1), $n^{o11}$ represents an integer of 0 to 3. $n^{o11}$ is preferably an integer of 0 to 2, more preferably 0 or 1, and still more preferably 0.

Preferred examples of the component (E1) are shown below but are not limited thereto.

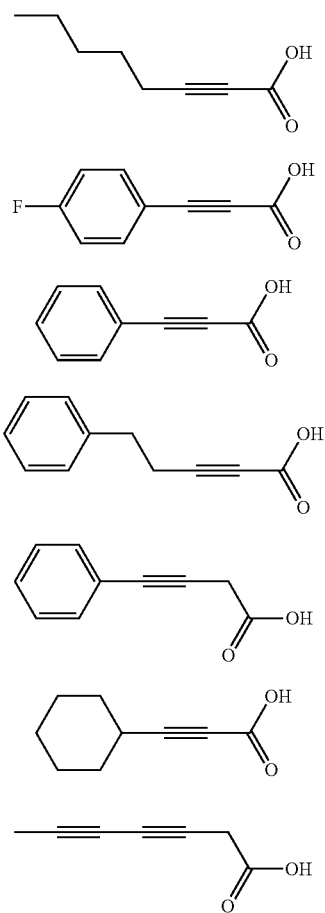

In the resist composition according to the present embodiment, the component (E1) may be used alone or in a combination of two or more kinds thereof.

The content of the component (E1) in the resist composition is preferably 0.01 to 20 parts by mass, more preferably 0.1 to 15 parts by mass, still more preferably 1 to 10 parts by mass, and particularly preferably 3 to 8 parts by mass, with respect to 100 parts by mass of the component (A).

In a case where the content of the component (E1) is set within the preferred range described above, roughness is more easily reduced, and thus a resist pattern having a better shape is easily formed.

<Optional Component>

The resist composition according to the present embodiment may further contain other components (optional components) in addition to the component (A) and the component (E1) described above. Examples of such optional components include a component (B), a component (D), a component (E) (provided that a component corresponding to the component (E1) is excluded), a component (F), and a component (S), which are described below.

<<Acid Generator Component (B)>>

The resist composition according to the present embodiment preferably contains an acid generator component (B) (hereinafter, referred to as a "component (B)"), in addition to the component (A) and the component (E1). The component (B) is not particularly limited, and examples thereof include onium salt-based acid generators such as an iodonium salt and a sulfonium salt, which have been proposed as an acid generator for the chemical amplification-type resist composition.

Examples of the component (B) include a compound represented by General Formula (b-1) (hereinafter, also referred to as a "component (b-1)"), a compound represented by General Formula (b-2) (hereinafter, also referred to as a "component (b-2)"), and a compound represented by General Formula (b-3) (hereinafter, also referred to as a "component (b-3)").

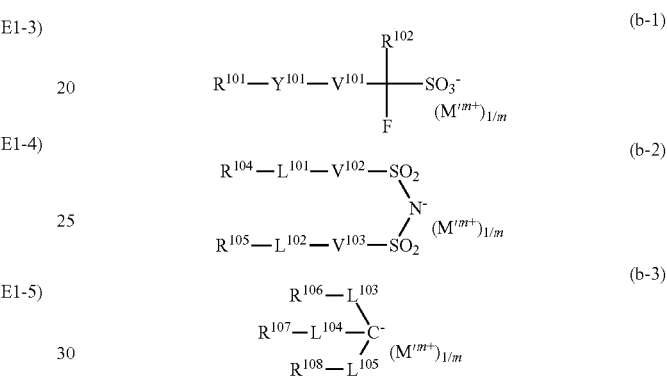

[In the formulae, $R^{101}$ and $R^{104}$ to $R^{108}$ each independently represents a cyclic group which may have a substituent, a chain-like alkyl group which may have a substituent, or a chain-like alkenyl group which may have a substituent. $R^{104}$ and $R^{105}$ may be bonded to each other to form a ring structure. $R^{102}$ represents a fluorinated alkyl group having 1 to 5 carbon atoms or a fluorine atom. $Y^{101}$ represents a divalent linking group containing an oxygen atom or a single bond. $V^{101}$ to $V^{103}$ each independently represents a single bond, an alkylene group, or a fluorinated alkylene group. $L^{101}$ and $L^{102}$ each independently represents a single bond or an oxygen atom. $L^{103}$ to $L^{105}$ each independently represents a single bond, —CO—, or —SO$_2$—. m represents an integer of 1 or greater, and $M'^{m+}$ represents an m-valent onium cation.]

{Anion Moiety}

Anion in Component (b-1)

In Formula (b-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated.

In general, it is preferable that the aliphatic hydrocarbon group be saturated. Examples of the cyclic hydrocarbon group as $R^{101}$ include the same cyclic hydrocarbon group as that mentioned in $Rd^{o1}$ in Formula (e1).

Chain-Like Alkyl Group which May have Substituent:

The chain-like alkyl group as $R^{101}$ may be linear or branched. The linear alkyl group preferably has 1 to 20 carbon atoms, more preferably 1 to 15 carbon atoms, and most preferably 1 to 10 carbon atoms. Examples of the chain-like alkyl group as $R^{101}$ include the same chain-like alkyl groups as those mentioned in $R'^{201}$ in Formula (ca-r-1) to (ca-r-7).

Chain-like alkenyl group which may have substituent:

A chain-like alkenyl group as $R^{101}$ may be linear or branched, and the number of carbon atoms thereof is preferably in a range of 2 to 10, more preferably in a range of 2 to 5, still more preferably in a range of 2 to 4, and particularly preferably 3. Examples of the chain-like alkenyl group as $R^{101}$ include the same chain-like alkenyl groups as those mentioned in $R'^{201}$ in Formula (ca-r-1) to (ca-r-7).

Examples of the substituent in the chain-like alkyl group or alkenyl group as $R^{101}$ include an alkoxy group, a halogen atom, a halogenated alkyl group, a hydroxyl group, a carbonyl group, a nitro group, an amino group, and a cyclic group as $R^{101}$.

Among the above, $R^{101}$ is preferably a cyclic group which may have a substituent and more preferably a cyclic hydrocarbon group which may have a substituent. More specific examples of the cyclic hydrocarbon group include a phenyl group, a naphthyl group, a group in which one or more hydrogen atoms have been removed from a polycycloalkane, lactone-containing cyclic groups each represented by any of General Formulae (a2-r-1) to (a2-r-7), and —$SO_2$-containing cyclic groups each represented by any of General Formulae (a5-r-1) to (a5-r-4).

In Formula (b-1), $Y^{101}$ represents a single bond or a divalent linking group containing an oxygen atom.

In a case where $Y^{101}$ represents a divalent linking group containing an oxygen atom, $Y^{101}$ may contain an atom other than an oxygen atom. Examples of atoms other than an oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—$SO_2$—) may be linked to the combination. Examples of divalent linking groups containing an oxygen atom include linking groups each represented by General Formulae (y-a1-1) to (y-a1-7) shown below.

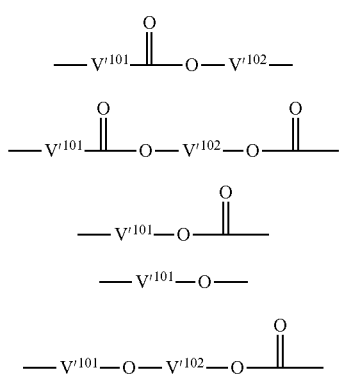

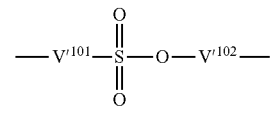

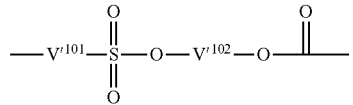

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, or —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2CH_2$—, or —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— or —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$—, or —$CH_2$CH($CH_3$)$CH_2CH_2$—; and a pentamethylene group [—$CH_2CH_2CH_2CH_2CH_2$—].

Further, a part of a methylene group in the alkylene group as $V'^{101}$ or $V'^{102}$ may be substituted with a divalent aliphatic cyclic group having 5 to 10 carbon atoms. The aliphatic cyclic group is preferably a divalent group in which one hydrogen atom has been removed from the cyclic aliphatic hydrocarbon group (a monocyclic aliphatic hydrocarbon group or a polycyclic aliphatic hydrocarbon group) as $Ra'^{3}$ in Formula (a1-r-1), and a cyclohexylene group, a 1,5-adamantylene group, or a 2,6-adamantylene group is more preferable.

$Y^{101}$ preferably represents a divalent linking group containing an ester bond or a divalent linking group containing an ether bond and more preferably linking groups each represented by Formulae (y-a1-1) to (y-a1-5).

In Formula (b-1), $V^{101}$ represents a single bond, an alkylene group, or a fluorinated alkylene group. The alkylene group and the fluorinated alkylene group as $V^{101}$ preferably have 1 to 4 carbon atoms. Examples of the fluorinated alkylene group as $V^{101}$ include a group in which part or all of hydrogen atoms in the alkylene group as $V^{101}$ have been substituted with fluorine atoms. Among these examples, as $V^{101}$, a single bond or a fluorinated alkylene group having 1 to 4 carbon atoms is preferable.

In Formula (b-1), $R^{102}$ represents a fluorine atom or a fluorinated alkyl group having 1 to 5 carbon atoms. $R^{102}$ preferably represents a fluorine atom or a perfluoroalkyl group having 1 to 5 carbon atoms and more preferably a fluorine atom.

As a specific example of the anion moiety represented by Formula (b-1), in a case where $Y^{101}$ represents a single bond, a fluorinated alkylsulfonate anion such as a trifluoromethanesulfonate anion or a perfluorobutanesulfonate anion can be mentioned; and in a case where $Y^{101}$ represents a divalent linking group containing an oxygen atom, anions represented by Formulae (an-1) to (an-3) shown below can be mentioned.

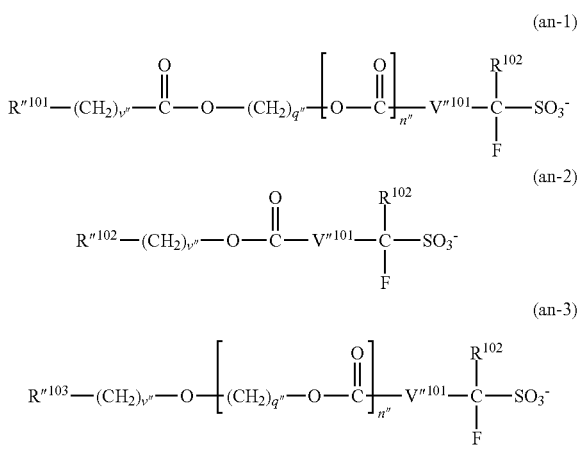

[In the formula, $R'''^{101}$ represents an aliphatic cyclic group which may have a substituent, monovalent heterocyclic groups respectively represented by Chemical Formulae (r-hr-1) to (r-hr-6), a condensed ring-type group represented by Formula (r-br-1) or (r-br-2), and a chain-like alkyl group which may have a substituent. $R'''^{102}$ is an aliphatic cyclic group which may have a substituent, a condensed ring-type group represented by Formula (r-br-1) or (r-br-2), lactone-containing cyclic groups respectively represented by General Formulae (a2-r-1), (a2-r-3) to (a2-r-7), or —SO$_2$-containing cyclic groups respectively represented by General Formulae (a5-r-1) to (a5-r-4). $R'''^{103}$ represents an aromatic cyclic group which may have a substituent, an aliphatic cyclic group which may have a substituent, or a chain-like alkenyl group which may have a substituent. $V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. v"s each independently represents an integer of 0 to 3, q"s each independently represents an integer of 0 to 20, and n" represents 0 or 1.]

As the aliphatic cyclic group as $R'''^{101}$, $R'''^{102}$, and $R'''^{103}$ which may have a substituent, the same groups as the cyclic aliphatic hydrocarbon group as $R^{101}$ in Formula (b-1) described above are preferable. As the substituent, the same group as the substituent which may substitute the cyclic aliphatic hydrocarbon group as $R^{101}$ in Formula (b-1) can be mentioned.

As the aromatic cyclic group as $R'''^{103}$, which may have a substituent, the same groups as the aromatic hydrocarbon group for the cyclic hydrocarbon group represented by $R^{101}$ in Formula (b-1) described above are preferable. As the substituent, the same groups as the substituents which may substitute the aromatic hydrocarbon group as $R^{101}$ in Formula (b-1) can be mentioned.

As the chain-like alkyl group as $R'''^{101}$ which may have a substituent, the same groups mentioned as the chain-like alkyl groups represented by $R^{101}$ in Formula (b-1) are preferable.

As the chain-like alkenyl group as $R'''^{103}$ which may have a substituent, the same groups mentioned as the chain-like alkenyl groups represented by $R^{101}$ in Formula (b-1) are preferable.

Anion in Component (b-2)

In Formula (b-2), $R^{104}$ and $R^{105}$ each independently represents a cyclic group which may have a substituent, a chain-like alkyl group which may have a substituent, or a chain-like alkenyl group which may have a substituent, and has the same definition as that for $R^{101}$ in Formula (b-1). $R^{104}$ and $R^{105}$ may be bonded to each other to form a ring.

$R^{104}$ and $R^{105}$ are preferably a chain-like alkyl group which may have a substituent and more preferably a linear or branched alkyl group or a linear or branched fluorinated alkyl group.

The chain-like alkyl group preferably has 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ be small because the solubility in a solvent for a resist is also excellent in this range of the number of carbon atoms. Further, in the chain-like alkyl group as $R^{104}$ and $R^{105}$, it is preferable that the number of hydrogen atoms substituted with fluorine atoms be as large as possible because the acid strength increases and the transparency to high energy radiation of 250 nm or less or electron beams is improved. The proportion of fluorine atoms in the chain-like alkyl group, that is, the fluorination ratio is preferably in a range of 70% to 100% and more preferably in a range of 90% to 100%, and it is most preferable that the chain-like alkyl group be a perfluoroalkyl group in which all hydrogen atoms are substituted with fluorine atoms.

In Formula (b-2), $V^{102}$ and $V^{103}$ each independently represents a single bond, an alkylene group, or a fluorinated alkylene group, and has the same definition as that for $V^{101}$ in Formula (b-1).

In Formula (b-2), $L^{101}$ and $L^{102}$ each independently represents a single bond or an oxygen atom.

Anion in Component (b-3)

In Formula (b-3), $R^{106}$ to $R^{108}$ each independently represents a cyclic group which may have a substituent, a chain-like alkyl group which may have a substituent, or a chain-like alkenyl group which may have a substituent, and has the same definition as that for $R^{101}$ in Formula (b-1).

In Formula (b-3), $L^{103}$ to $L^{105}$ each independently represents a single bond, —CO—, or —SO$_2$—.

Among the above, as the anion moiety of the component (B), an anion of the component (b-1) is preferable. Among these, an anion represented by anyone of General Formulae (an-1) to (an-3) is more preferable, an anion represented by any one of General Formula (an-1) or (an-2) is still more preferable, and an anion represented by General Formula (an-2) is particularly preferable.

{Cation Moiety}

In Formulae (b-1), (b-2), and (b-3), $M'^{m+}$ represents an m-valent onium cation. The onium cation is preferably a sulfonium cation or an iodonium cation. m represents an integer of 1 or greater.

Preferred examples of the cation moiety $((M'^{m+})_{1/m})$ include organic cations each represented by General Formulae (ca-1) to (ca-5).

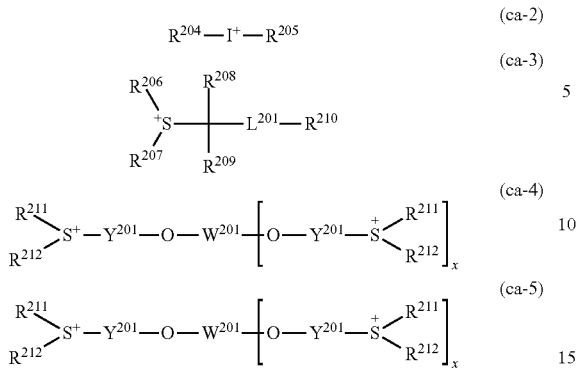

(ca-2)
(ca-3)
(ca-4)
(ca-5)

[In the formula, $R^{201}$ to $R^{207}$ and $R^{211}$ to $R^{212}$ each independently represents an aryl group, an alkyl group, or an alkenyl group, each of which may have a substituent. $R^{201}$ to $R^{203}$, $R^{206}$ to $R^{207}$, and $R^{211}$ to $R^{212}$ may be bonded to each other to form a ring together with the sulfur atoms in the formulae. $R^{208}$ and $R^{209}$ each independently represents a hydrogen atom or an alkyl group having 1 to 5 carbon atoms. $R^{210}$ represents an aryl group which may have a substituent, an alkyl group which may have a substituent, an alkenyl group which may have a substituent, or a —SO$_2$-containing cyclic group which may have a substituent. $L^{201}$ represents —C(=)— or —C(=O)—O—. $Y^{201}$s each independently represents an arylene group, an alkylene group, or an alkenylene group. x represents 1 or 2. $W^{201}$ represents an (x+1)-valent linking group.]

In General Formulae (ca-1) to (ca-5), examples of the aryl group as $R^{201}$ to $R^{207}$, $R^{211}$, and $R^{212}$ include an unsubstituted aryl group having 6 to 20 carbon atoms, and a phenyl group or a naphthyl group is preferable.

The alkyl group as $R^{201}$ to $R^{207}$, $R^{211}$, and $R^{212}$ is a chain-like or cyclic alkyl group, and the number of carbon atoms thereof is preferably in a range of 1 to 30.

The alkenyl group as $R^{201}$ to $R^{207}$, $R^{211}$, and $R^{212}$ preferably has 2 to 10 carbon atoms.

Examples of the substituent which may be included in $R^{201}$ to $R^{207}$ and $R^{210}$ to $R^{212}$ include an alkyl group, a halogen atom, a halogenated alkyl group, a carbonyl group, a cyano group, an amino group, an aryl group, and groups each represented by General Formulae (ca-r-1) to (ca-r-7) shown above.

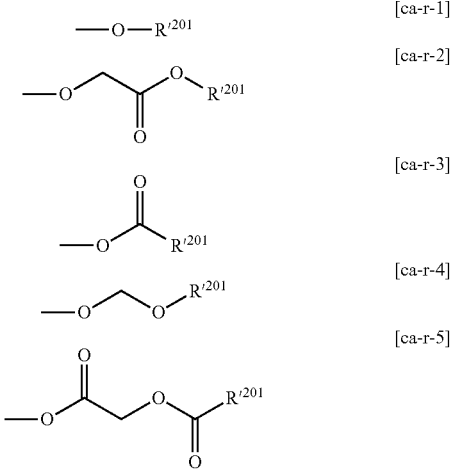

[ca-r-1]
[ca-r-2]
[ca-r-3]
[ca-r-4]
[ca-r-5]

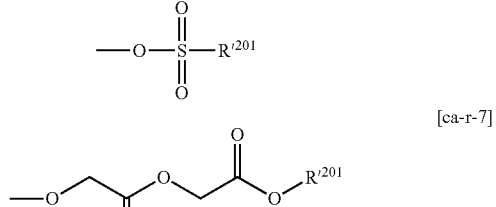

[ca-r-6]
[ca-r-7]

[In the formulae, $R'^{201}$ s each independently represents a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated.

In general, it is preferable that the aliphatic hydrocarbon group be saturated.

Examples of the cyclic hydrocarbon group as $R'^{201}$ include the same cyclic hydrocarbon group as that mentioned in $Rd^{01}$ in Formula (e1).

Chain-Like Alkyl Group which May have Substituent:

The chain-like alkyl group as $R'^{201}$ may be linear or branched.

The linear alkyl group preferably has 1 to 20 carbon atoms, more preferably 1 to 15 carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R'^{201}$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a 1-propenyl group, a 2-propenyl group (an allyl group), and a butynyl group. Examples of the branched alkenyl group include a 1-methylvinyl group, a 1-methylpropenyl group, and a 2-methylpropenyl group.

Among the above, as the chain-like alkenyl group, a linear alkenyl group is preferable, a vinyl group or a propenyl group is more preferable, and a vinyl group is particularly preferable.

Examples of the substituent in the chain-like alkyl group or alkenyl group as $R'^{201}$, include, for example, an alkoxy group, a halogen atom, a halogenated alkyl group, a hydroxyl group, a carbonyl group, a nitro group, an amino group, a cyclic group as $R'^{201}$ or the like.

As the cyclic group which may have a substituent, the chain-like alkyl group which may have a substituent, or the chain-like alkenyl group which may have a substituent, as $R'^{201}$, a group that is the same as the acid-dissociable group represented by above-described Formula (a1-r-2) can be mentioned as the cyclic group which may have a substituent or the chain-like alkyl group which may have a substituent, in addition to the groups described above.

Among them, $R^{201}$ is preferably a cyclic group which may have a substituent and more preferably a cyclic hydrocarbon group which may have a substituent. More specific examples thereof include a phenyl group, a naphthyl group, a group in which one or more hydrogen atoms have been removed from a polycycloalkane, lactone-containing cyclic groups each represented by any of General Formulae (a2-r-1) to (a2-r-7), and —$SO_2$-containing cyclic groups each represented by any of General Formulae (a5-r-1) to (a5-r-4).

In General Formula (ca-1) to (ca-5), the substituent which $R^{201}$ to $R^{207}$ and $R^{210}$ to $R^{212}$ may have is preferably, among the above, an electron-withdrawing group. The electron-withdrawing group may be one kind or two or more kinds.

Examples of the electron-withdrawing group may be an electron-withdrawing group of a monovalent substituent or may be an electron-withdrawing group of a divalent substituent. Specific examples thereof include an acyl group, a methanesulfonyl group (mesyl group), a halogen atom, a halogenated alkyl group, a halogenated alkoxy group, a halogenated aryloxy group halide, a halogenated alkylamino group, a halogenated alkylthio group, a cyano group, a nitro group, a dialkylphosphono group, a diarylphosphono group, an alkylsulfonyl group, an arylsulfonyl group, a sulfonyloxy group, an acylthio group, a sulfamoyl group, a thiocianate group, and a thiocarbonyl group.

Among the above, a fluorine atom, a fluorinated alkyl group, or a sulfonyl group is preferable, and a fluorine atom or a fluorinated alkyl group is more preferable from the viewpoint of increasing sensitivity. The fluorinated alkyl group is preferably a fluorinated alkyl group having 1 to 5 carbon atoms.

In a case where the electron-withdrawing group is a fluorine atom or a fluorinated alkyl group, the number of fluorine atoms in the cation moiety of the component (B) is preferably 1 to 9, more preferably 2 to 6, and still more preferably 3 or 4.

When the number of fluorine atoms is equal to or larger than the lower limit of the preferred range, sensitivity is good. On the other hand, in a case where the number of fluorine atoms is equal to or smaller than the upper limit of the preferred range, the solubility of the resist composition in the developing solution is maintained, and the deterioration of roughness is easily suppressed.

In General Formulae (ca-1) to (ca-5), $R^{201}$ to $R^{203}$, $R^{206}$ and $R^{207}$, and $R^{211}$ and $R^{212}$ are bonded to each other to form a ring with a sulfur atom in the formula, and these groups may be bonded to one another via a hetero atom such as a sulfur atom, an oxygen atom or a nitrogen atom, or a functional group such as a carbonyl group, —SO—, —$SO_2$—, —$SO_3$—, —COO—, —CONH—, or —N($R_N$)— (here, $R_N$ represents an alkyl group having 1 to 5 carbon atoms). As the ring to be formed, a ring containing the sulfur atom in the formula in the ring skeleton thereof is preferably a 3- to 10-membered ring and particularly preferably a 5- to 7-membered ring including the sulfur atom. Specific examples of the ring to be formed include a thiophene ring, a thiazole ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represents a hydrogen atom or an alkyl group having 1 to 5 carbon atoms and is preferably a hydrogen atom or an alkyl group having 1 to 3 carbon atoms. In a case where $R^{208}$ and $R^{209}$ each represents an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —$SO_2$— containing cyclic group which may have a substituent.

Examples of the aryl group as $R^{210}$ include an unsubstituted aryl group having 6 to 20 carbon atoms, and a phenyl group or a naphthyl group is preferable.

The alkyl group as $R^{210}$, a chain-like or cyclic alkyl group having 1 to 30 carbon atoms is preferable.

The alkenyl group as $R^{210}$ preferably has 2 to 10 carbon atoms. The —$SO_2$-containing cyclic group which may have a substituent, as $R^{210}$, is preferably a "—$SO_2$-containing polycyclic group", and more preferably a group represented by General Formula (a5-r-1).

$Y^{201}$s each independently represents an arylene group, an alkylene group, or an alkenylene group.

Examples of the arylene group as $Y^{201}$ include groups in which one hydrogen atom has been removed from an aryl group mentioned as the aromatic hydrocarbon group as $R^{101}$ in Formula (b-1) described above.

Examples of the alkylene group and alkenylene group as $Y^{201}$ include groups in which one hydrogen atom has been removed from the chain-like alkyl group or the chain-like alkenyl group as $R^{101}$ in Formula (b-1) described above.

In Formula (ca-4), x represents 1 or 2.

$W^{201}$ represents an (x+1)-valent linking group, that is, a divalent or trivalent linking group.

As the divalent linking group as $W^{201}$, a divalent hydrocarbon group which may have a substituent is preferable, and as examples thereof, the same divalent hydrocarbon groups (which may have a substituent) as those described above represented by $Ya^{21}$ in General Formula (a2-1) can be mentioned. The divalent linking group as $W^{201}$ may be linear, branched, or cyclic, and cyclic is more preferable. Among these, an arylene group having two carbonyl groups, each bonded to the terminal thereof is preferable. Examples of the arylene group include a phenylene group and a naphthylene group, and a phenylene group is particularly preferable.

Examples of the trivalent linking group as $W^{201}$ include a group in which one hydrogen atom has been removed from the above-described divalent linking group as $W^{201}$ and a group in which the divalent linking group has been bonded to another divalent linking group. The trivalent linking group as $W^{201}$ is preferably a group in which two carbonyl groups are bonded to an arylene group.

Suitable examples of the cation represented by Formula (ca-1) are as follows.

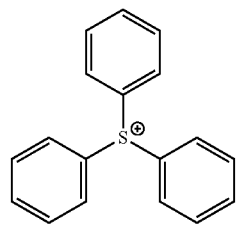

(ca-1-1)

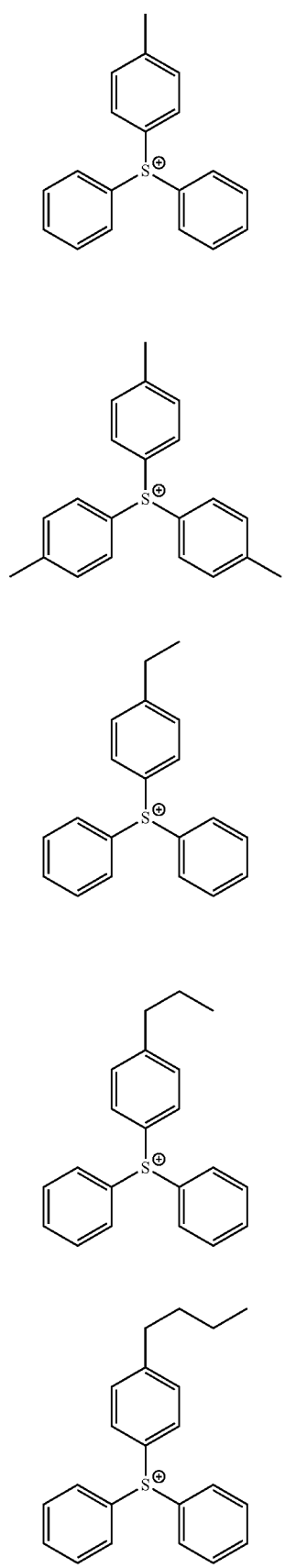
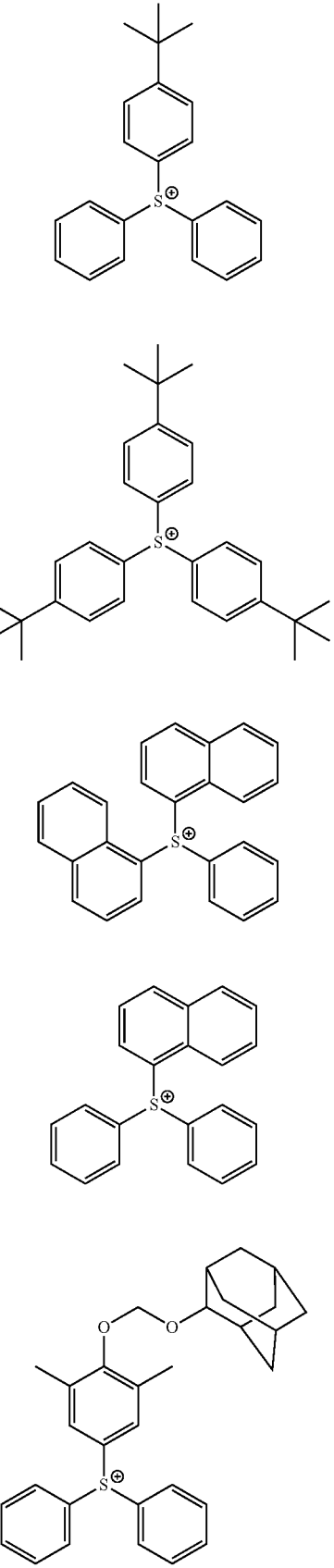

(ca-1-12)
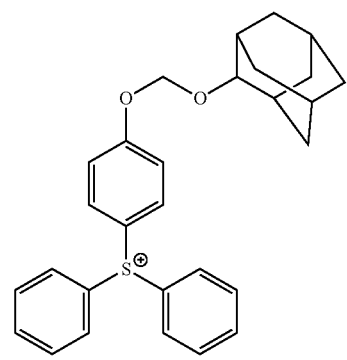
(ca-1-13)
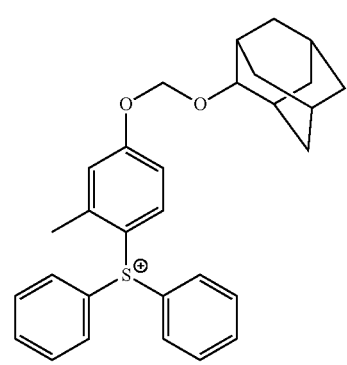
(ca-1-14)
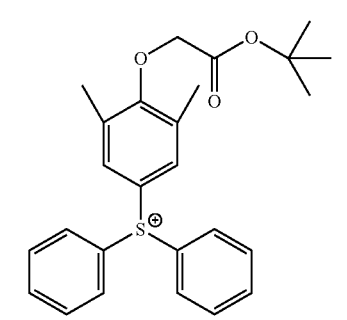
(ca-1-15)
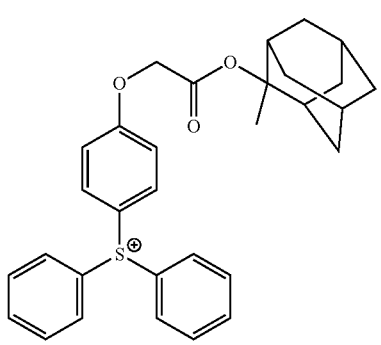
(ca-1-16)
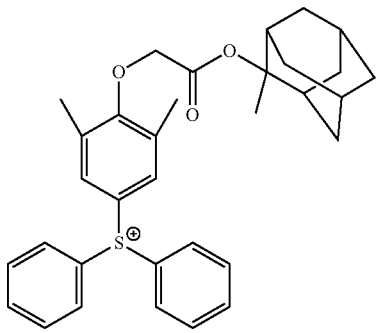
(ca-1-17)
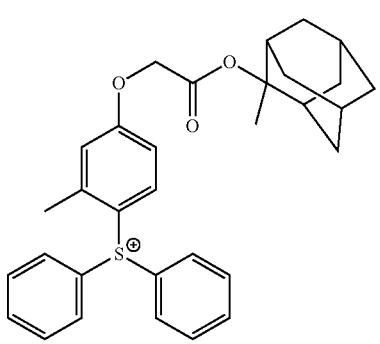
(ca-1-18)
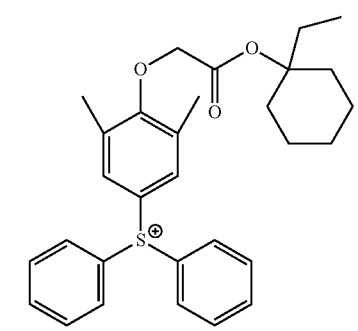
(ca-1-19)
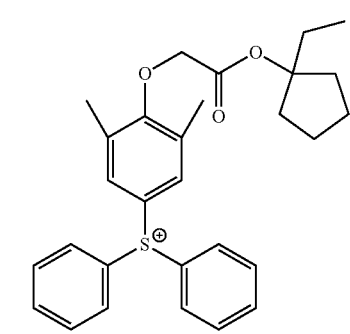
(ca-1-20)
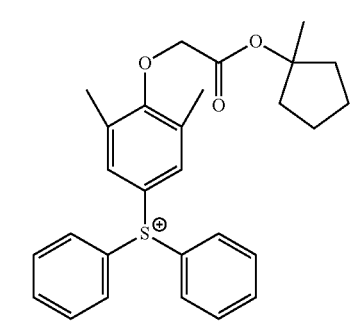

-continued
(ca-1-21)
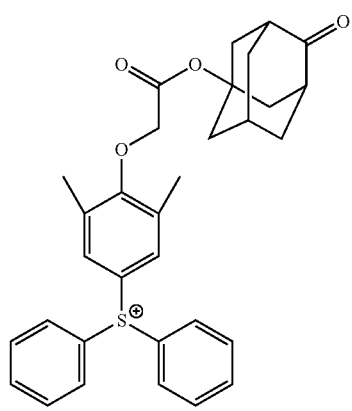
(ca-1-22)
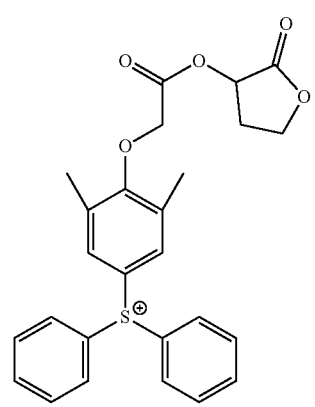
(ca-1-23)
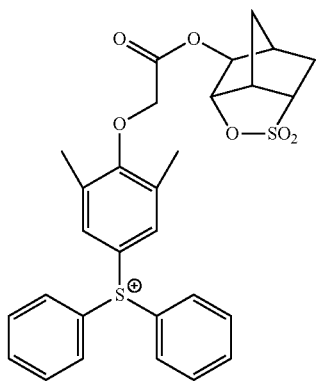
(ca-1-24)
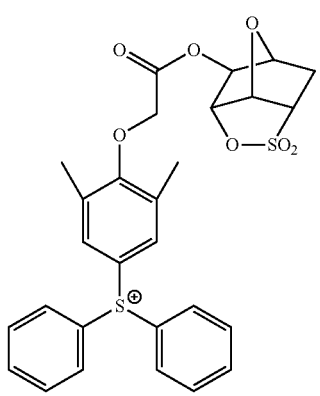
-continued
(ca-1-25)
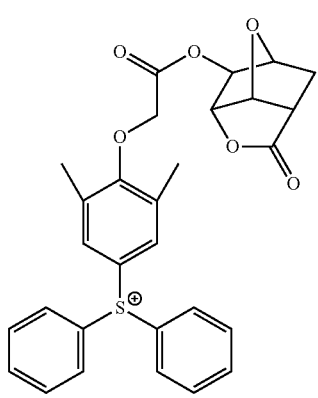
(ca-1-26)
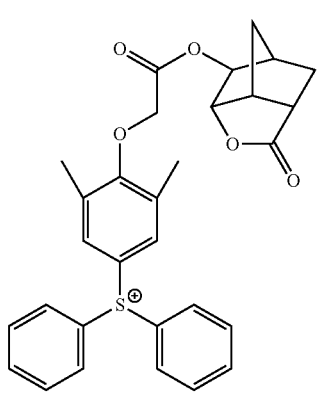
(ca-1-27)
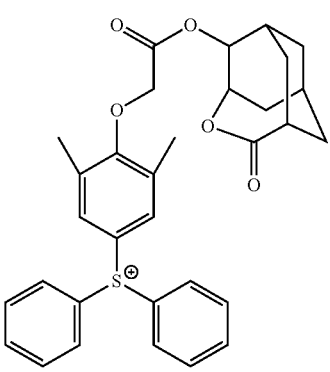
(ca-1-28)
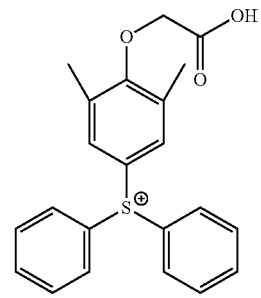

-continued
(ca-1-29)
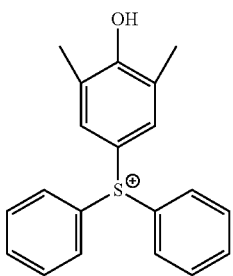
(ca-1-30)
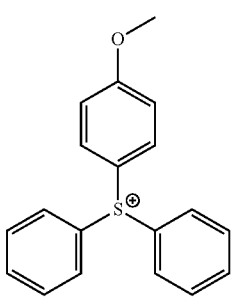
(ca-1-31)
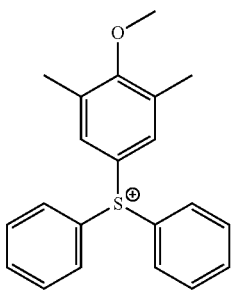
(ca-1-32)
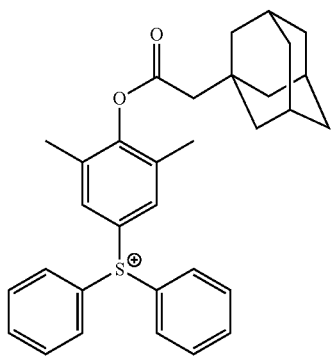
(ca-1-33)
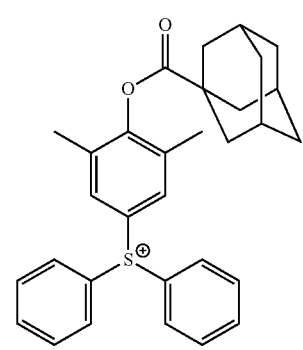
-continued
(ca-1-34)
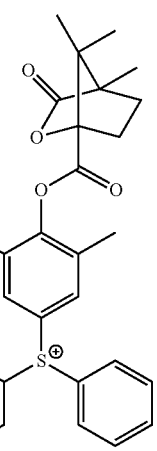
(ca-1-35)
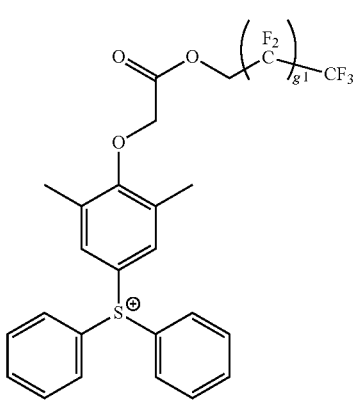
(ca-1-36)
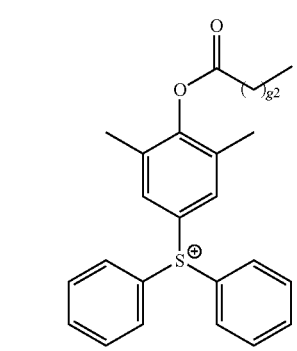
(ca-1-37)
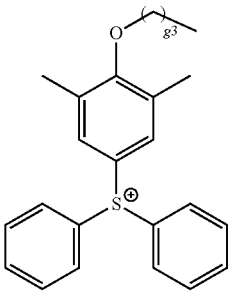

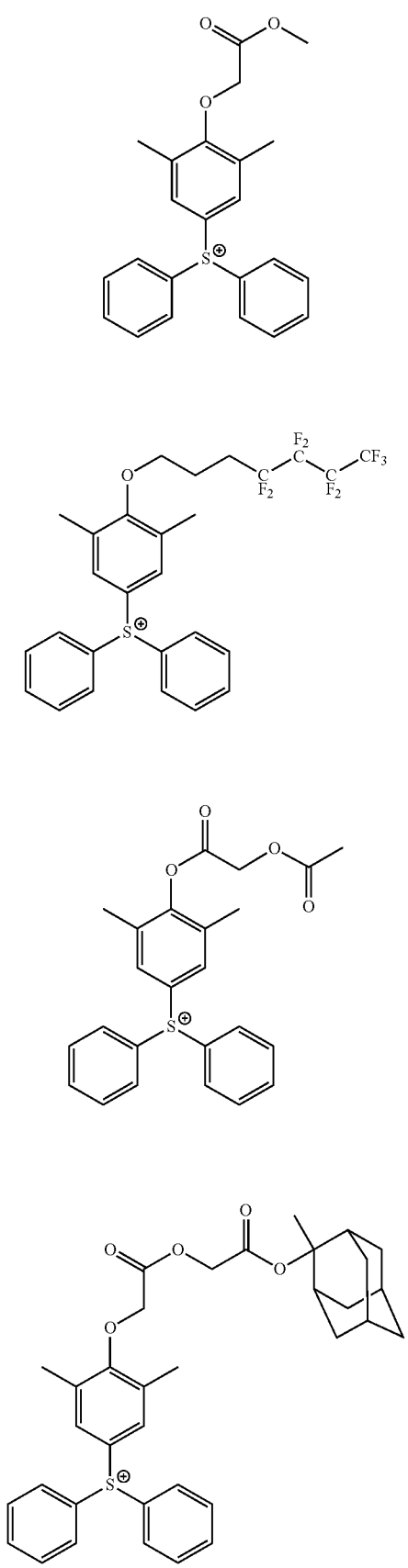
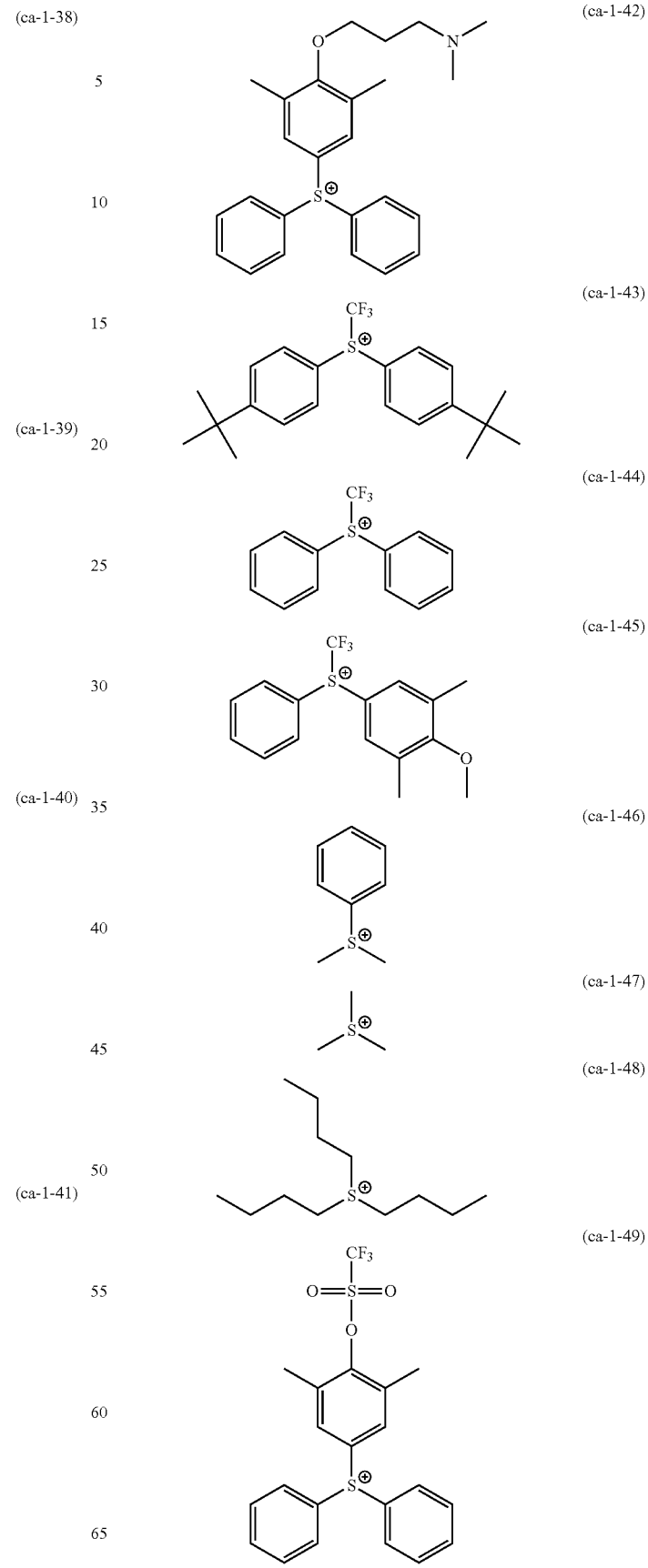

(ca-1-50)
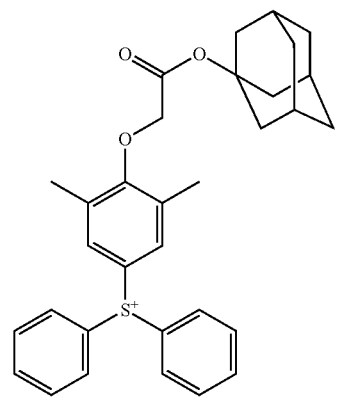
(ca-1-51)
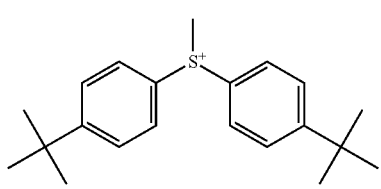
[In the formula, g1, g2, and g3 represent the numbers of repetitions, g1 is an integer of 1 to 5, g2 is an integer of 0 to 20, and g3 is an integer of 0 to 20.]
(ca-1-52)
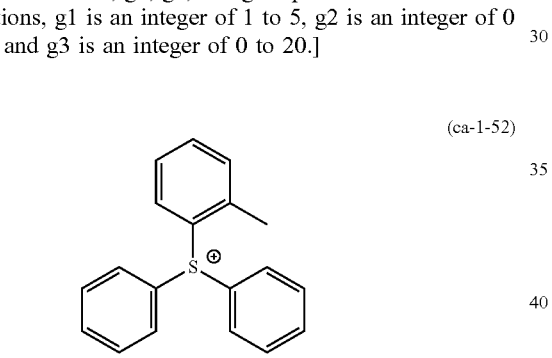
(ca-1-53)
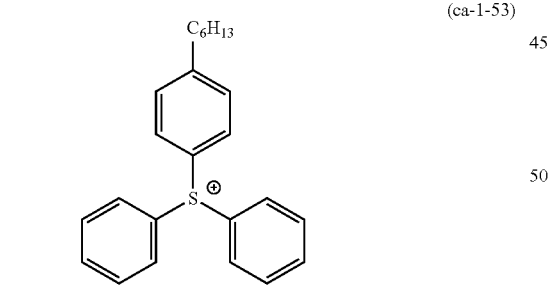
(ca-1-54)
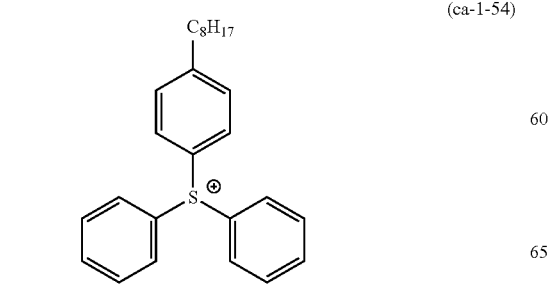
(ca-1-55)
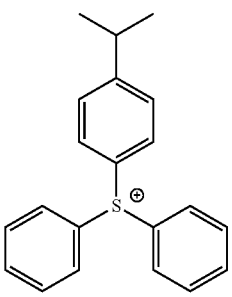
(ca-1-56)
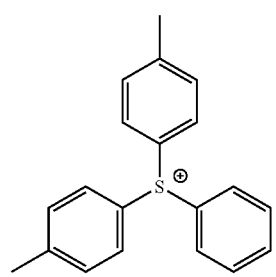
(ca-1-57)
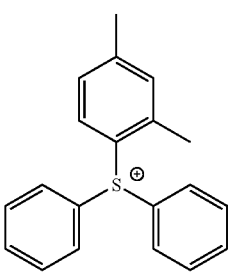
(ca-1-58)
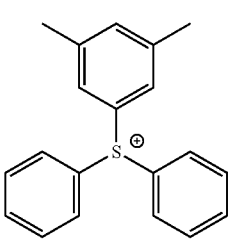
(ca-1-59)
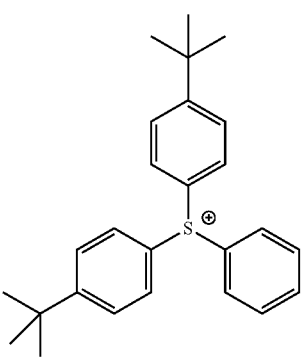

(ca-1-60)
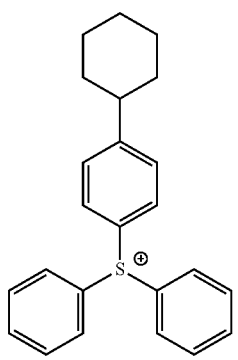
(ca-1-61)
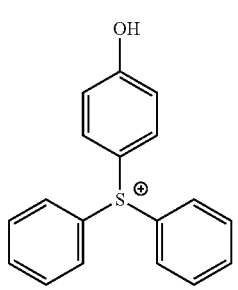
(ca-1-62)
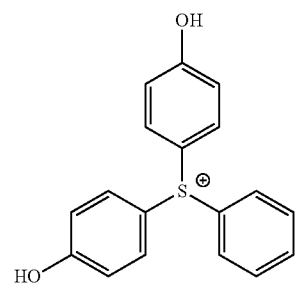
(ca-1-63)
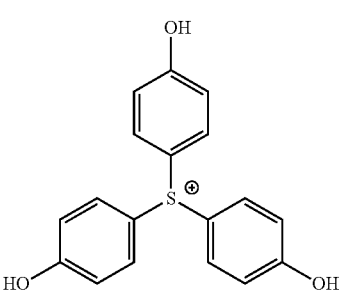
(ca-1-64)
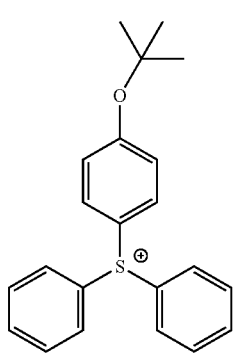
(ca-1-65)
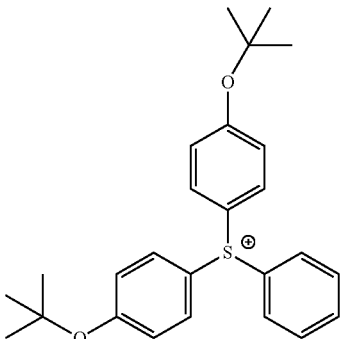
(ca-1-66)
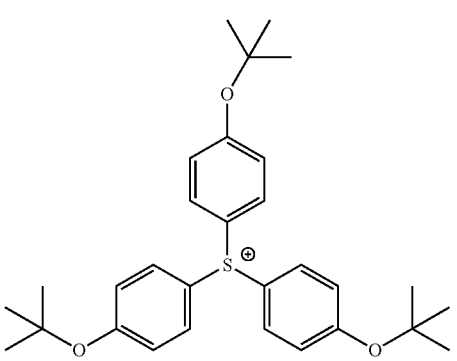
(ca-1-67)
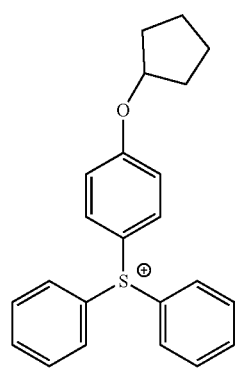
(ca-1-68)
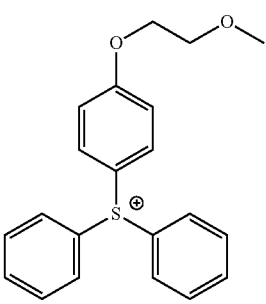

(ca-1-69) 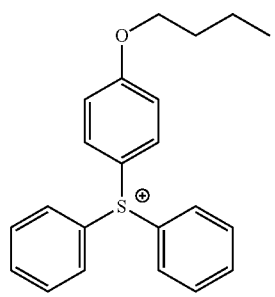
(ca-1-70) 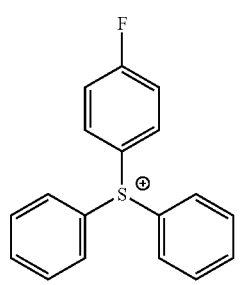
(ca-1-71) 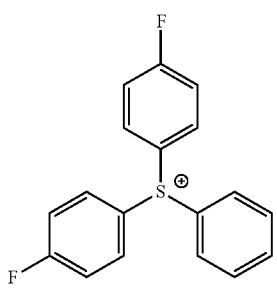
(ca-1-72) 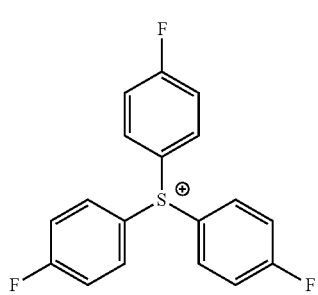
(ca-1-73) 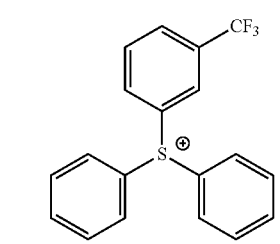
(ca-1-74) 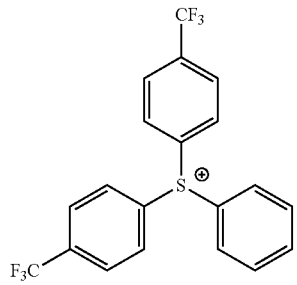
(ca-1-75) 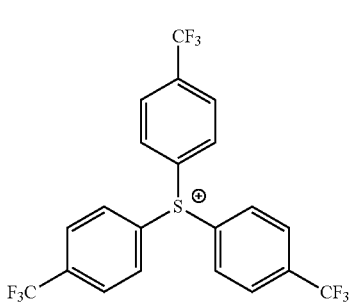
(ca-1-76) 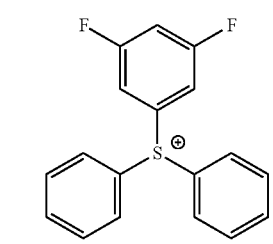
(ca-1-77) 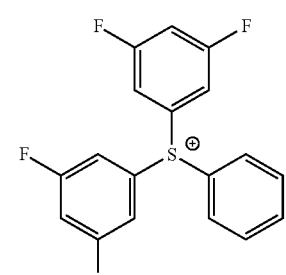
(ca-1-78) 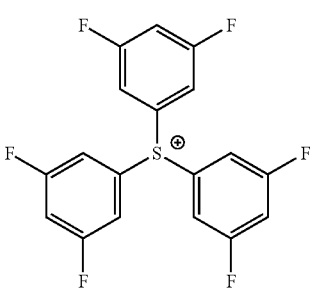

-continued
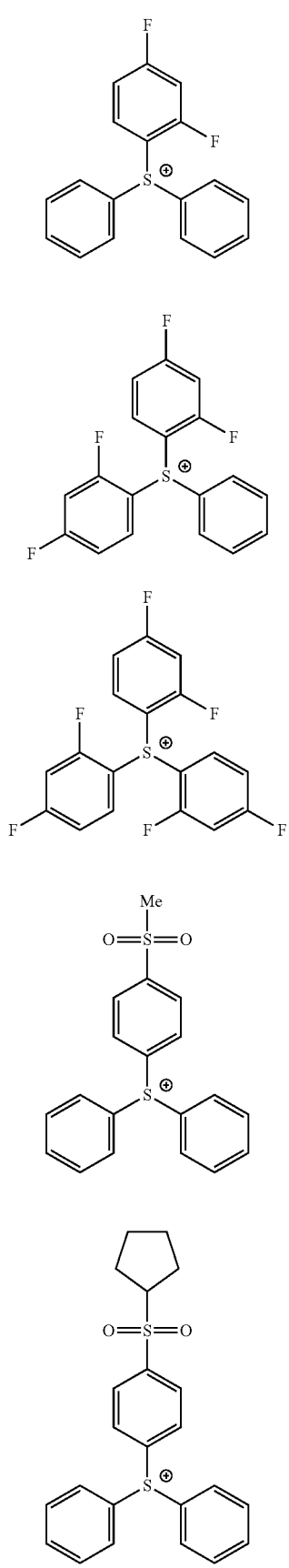
(ca-1-79)
(ca-1-80)
(ca-1-81)
(ca-1-82)
(ca-1-83)
-continued
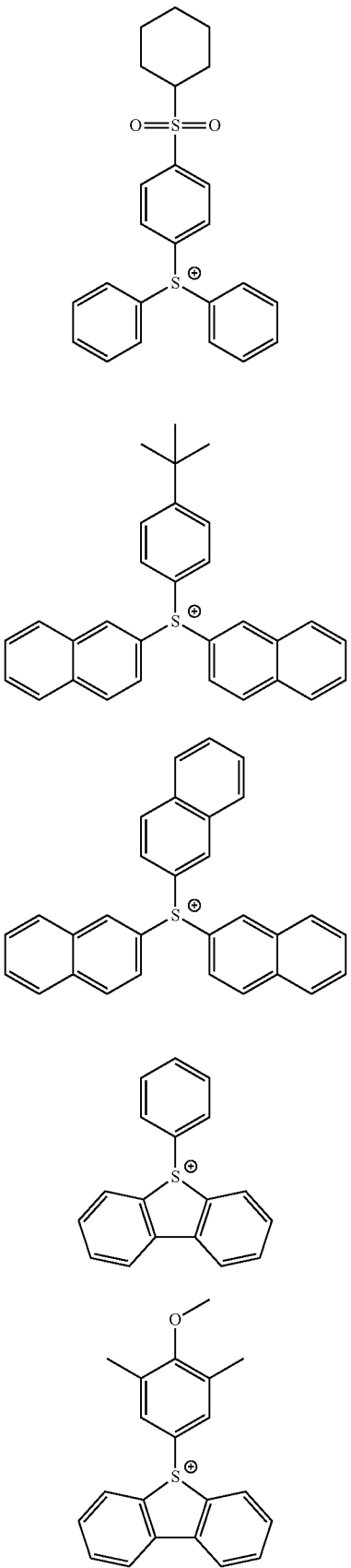
(ca-1-84)
(ca-1-85)
(ca-1-86)
(ca-1-87)
(ca-1-88)

(ca-1-89) 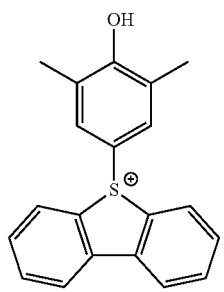
(ca-1-90) 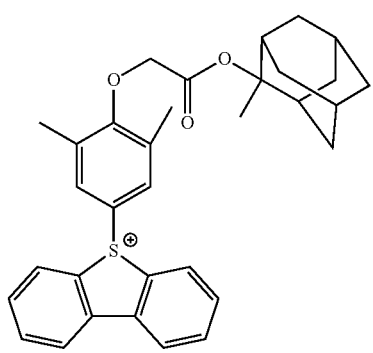
(ca-1-91) 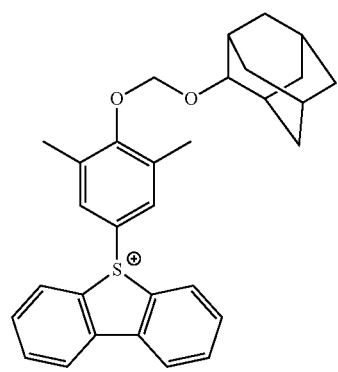
(ca-1-92) 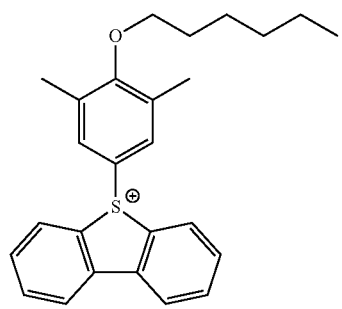
(ca-1-93) 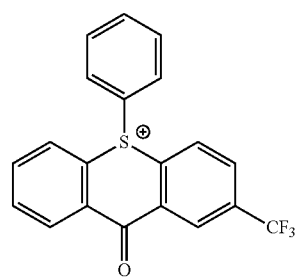
(ca-1-94) 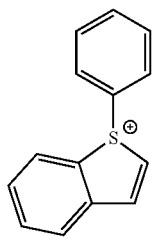
(ca-1-95) 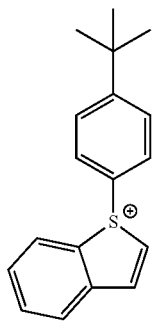
(ca-1-96) 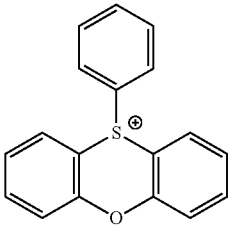
(ca-1-103) 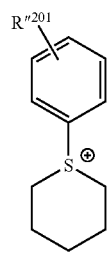
(ca-1-104) 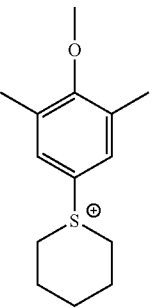

-continued
(ca-1-105)
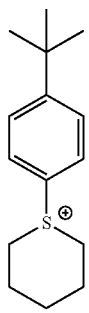
(ca-1-106)
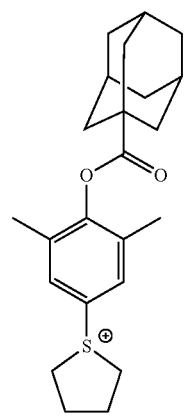
(ca-1-107)
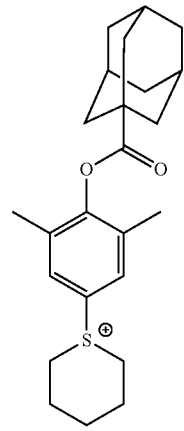
(ca-1-108)
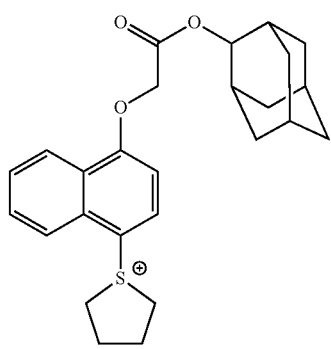
-continued
(ca-1-109)
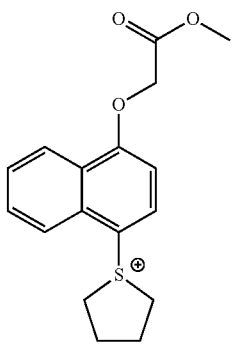
[In the formula, R″²⁰¹ represents a hydrogen atom or a substituent, and the substituent is the same as the substituent that $R^{201}$ to $R^{207}$ and $R^{210}$ to $R^{212}$ may have.]
(ca-1-110)
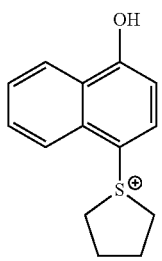
(ca-1-111)
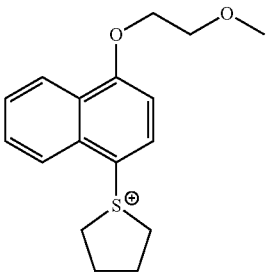
(ca-1-112)
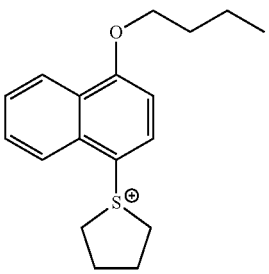
(ca-1-113)
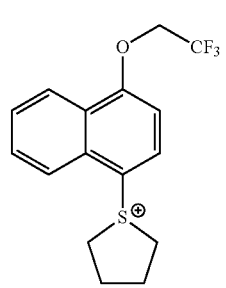

(ca-1-114)

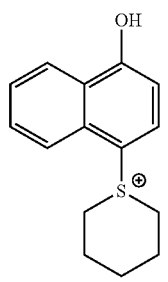

(ca-1-115)

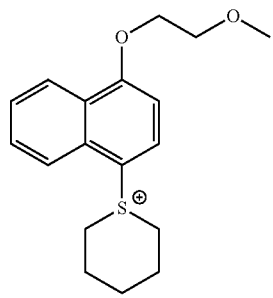

(ca-1-116)

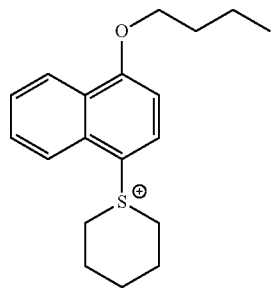

(ca-1-117)

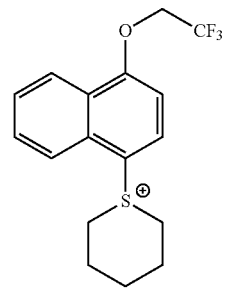

Specific examples of suitable cations represented by Formula (ca-2) include a diphenyliodonium cation and a bis(4-tert-butylphenyl)iodonium cation.

Specific examples of the suitable cations each represented by Formula (ca-3) include cations each represented by Formulae (ca-3-1) to (ca-3-6) shown below.

(ca-3-1)

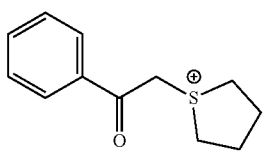

(ca-3-2)

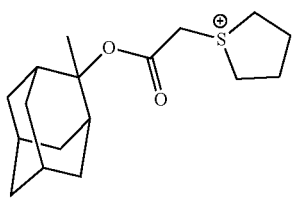

(ca-3-3)

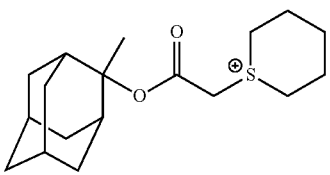

(ca-3-4)

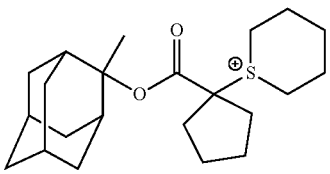

(ca-3-5)

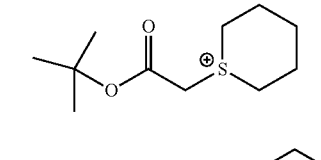

(ca-3-6)

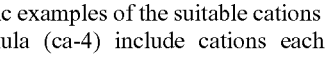

Specific examples of the suitable cations each represented by Formula (ca-4) include cations each represented by Formulae (ca-4-1) and (ca-4-2) shown below.

(ca-4-1)

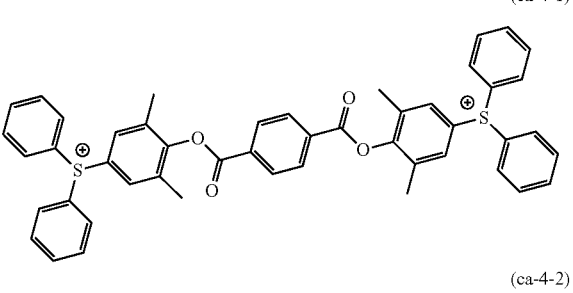

(ca-4-2)

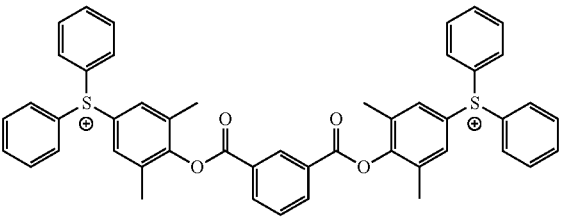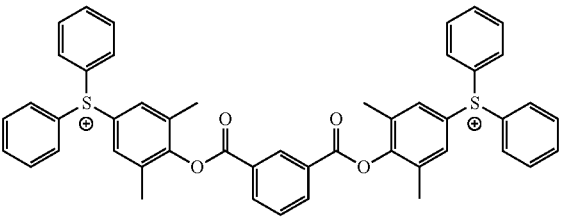

Specific examples of the suitable cations each represented by Formula (ca-5) include cations each represented by General Formulae (ca-5-1 and (ca-5-3) shown below.

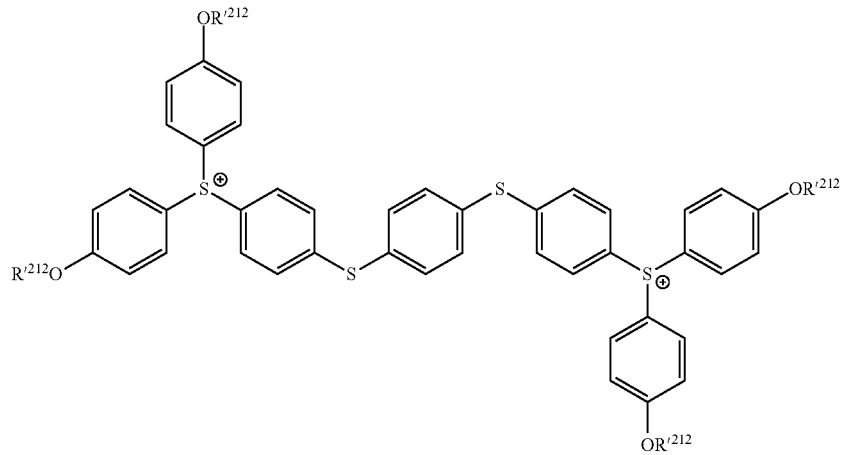
(ca-5-1)

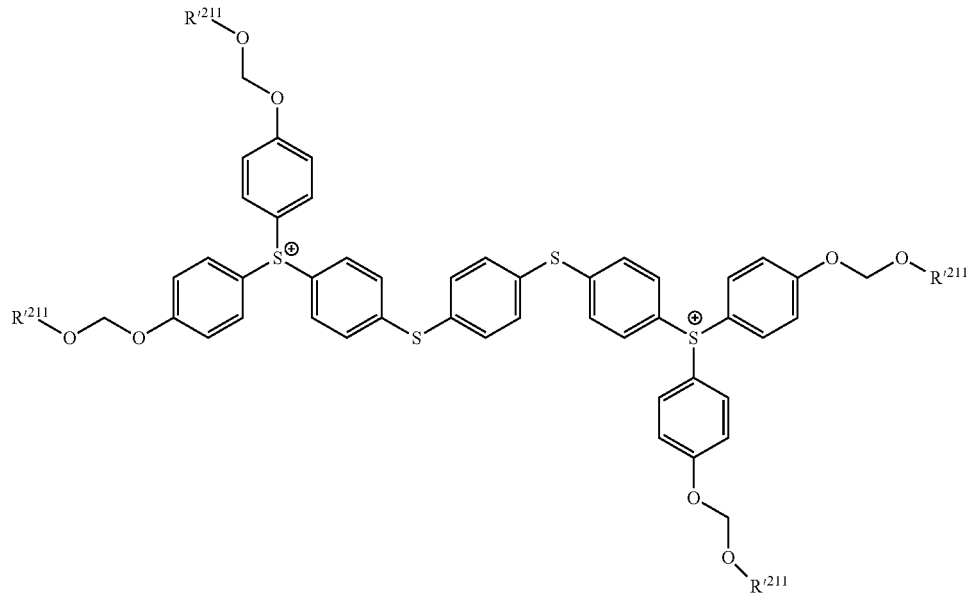
(ca-5-2)

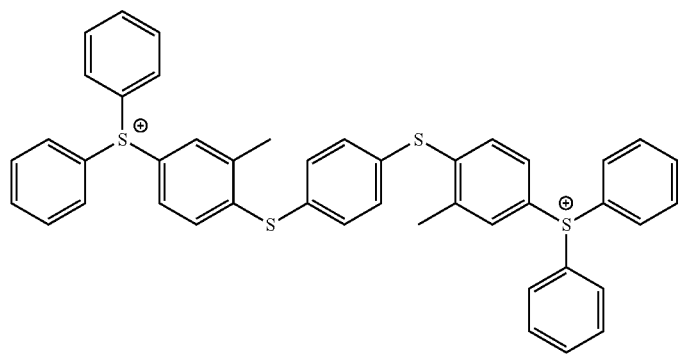
(ca-5-3)

Among the above, the cation moiety of the component (B) is preferably a cation represented by General Formula (ca-1). That is, a cation represented by any of Chemical Formulae (ca-1-1) to (ca-1-117) is preferable, and a cation represented by any one of (ca-1-1) or (ca-1-96) is more preferable.

Among the above, the component (B) is preferably a compound represented by General Formula (b-1-1).

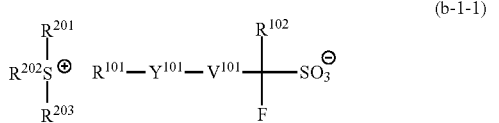

(b-1-1)

[In the formula, $R^{201}$ to $R^{203}$ each independently represents an aryl group, an alkyl group, or an alkenyl group, each of which may have a substituent. Any two of $R^{201}$ to $R^{203}$ may be bonded to each other to form a ring together with the sulfur atom in the formula. $R^{101}$ represents a cyclic group which may have a substituent, a chain-like alkyl group which may have a substituent, or a chain-like alkenyl group which may have a substituent. $R^{102}$ represents a fluorinated alkyl group having 1 to 5 carbon atoms or a fluorine atom. $Y^{101}$ represents a divalent linking group containing an oxygen atom or a single bond. $V^{101}$ represents a single bond or an oxygen atom.]

$R^{101}$, $Y^{101}$, $V^{101}$, and $R^{102}$ in Formula (b-1-1) are respectively the same as $R^{101}$, $Y^{101}$, $V^{101}$, and $R^{102}$ in Formula (b-1).

$R^{201}$ to $R^{203}$ in Formula (b-1-1) are respectively the same as $R^{201}$ to $R^{203}$ in Formula (ca-1). $R^{201}$ to $R^{203}$ each independently represents preferably an aryl group which may have a substituent. Any two of $R^{201}$ to $R^{203}$ may be bonded to each other to form a ring together with the sulfur atom in the formula.

The component (B) may be used alone or in a combination of two or more kinds thereof.

In a case where the resist composition contains the component (B), the content of the component (B) in the resist composition is preferably less than 50 parts by mass, more preferably in a range of 1 to 40 parts by mass, and still more preferably in a range of 5 to 25 parts by mass with respect to 100 parts by mass of the component (A).

In a case where the content of the component (B) is set within the preferred range described above, the solubility of the developing solution can be appropriately ensured, and thus the effects of the present invention can be more easily obtained.

<<Acid Diffusion-Controlling Agent Component (D)>>

The resist composition in the present embodiment may further contain a base component (component (D)). The component (D) functions as a quencher (an acid diffusion-controlling agent) which traps the acid generated in the resist composition upon exposure.

Examples of the component (D) include a photodecomposable base (D1) having an acid diffusion controllability (hereinafter, referred to as a "component (D1)") which is lost by the decomposition by exposure and a nitrogen-containing organic compound (D2) (hereinafter, referred to as a "component (D2)") which does not correspond to the component (D1).

In a case where a resist composition containing the component (D) is obtained, the contrast between the exposed portion and the unexposed portion of the resist film can be further improved at the time of the formation of a resist pattern.

In Regard to Component (D1)

The component (D1) is not particularly limited as long as the component is decomposed upon exposure and loses the acid diffusion controllability. The component (D1) is preferably one or more compounds selected from the group consisting of a compound represented by General Formula (d1-1) (hereinafter, referred to as a "component (d1-1)"), a compound represented by General Formula (d1-2) (hereinafter, referred to as a "component (d1-2)"), and a compound represented by General Formula (d1-3) (hereinafter, referred to as a "component (d1-3)").

At the exposed portion of the resist film, the components (d1-1) to (d1-3) are decomposed and then lose the acid diffusion controllability (basicity), and thus the components (d1-1) to (d1-3) cannot act as a quencher, whereas the components (d1-1) to (d1-3) act as a quencher at the unexposed portion of the resist film.

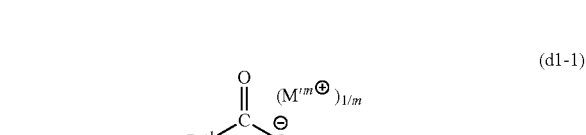

(d1-1)

(d1-2)

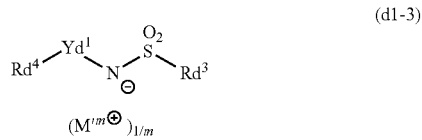

(d1-3)

[In the formulae, $Rd^1$ to $Rd^4$ represent cyclic groups which may have a substituent, chain-like alkyl groups which may have a substituent, or chain-like alkenyl groups which may have a substituent. Here, the carbon atom adjacent to the S atom as $Rd^2$ in General Formula (d1-2) has no fluorine atom bonded thereto. $Yd^1$ represents a single bond or a divalent linking group. m represents an integer of 1 or greater, and $M'^{m+}$s each independently represents an m-valent onium cation.]

{Component (d1-1)}

Anion Moiety

In Formula (d1-1), $Rd^1$ represents a cyclic group which may have a substituent, a chain-like alkyl group which may have a substituent, or a chain-like alkenyl group which may have a substituent, and examples thereof include the same group as $R^{101}$ in Formula (b-1) or the like.

Among these, $Rd^1$ is preferably an aromatic hydrocarbon group which may have a substituent, an aliphatic cyclic group which may have a substituent, or a chain-like alkyl group which may have a substituent. Examples of the substituent which these groups may have include a hydroxyl group, an oxo group, an alkyl group, an aryl group, a fluorine atom, a fluorinated alkyl group, lactone-containing cyclic groups each represented by any of General Formulae (a2-r-1) to (a2-r-7) described above, an ether bond, an ester bond, and a combination thereof. In a case where an ether bond or an ester bond is included as the substituent, the substituent may be bonded via an alkylene group, and linking groups each represented by any of Formulae (y-a1-1) to (y-a1-5) are preferable as the substituent.

Suitable examples of the aromatic hydrocarbon group include a phenyl group, a naphthyl group, and a polycyclic structure (for example, a polycyclic structure composed of a ring structure of a bicyclooctane skeleton and a ring structure other than the bicyclooctane skeleton).

The aliphatic cyclic group is preferably a group in which one or more hydrogen atoms have been removed from a polycycloalkane such as adamantane, norbornane, isobornane, tricyclodecane, or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

As $Rd^1$, a fluorinated alkyl group in which part or all of hydrogen atoms constituting a linear alkyl group have been substituted with fluorine atom(s) is preferable, and a fluorinated alkyl group in which all of the hydrogen atoms constituting a linear alkyl group have been substituted with fluorine atoms (a linear perfluoroalkyl group) is particularly preferable.

Specific examples of the preferred anion moiety for the component (d1-1) are shown below.

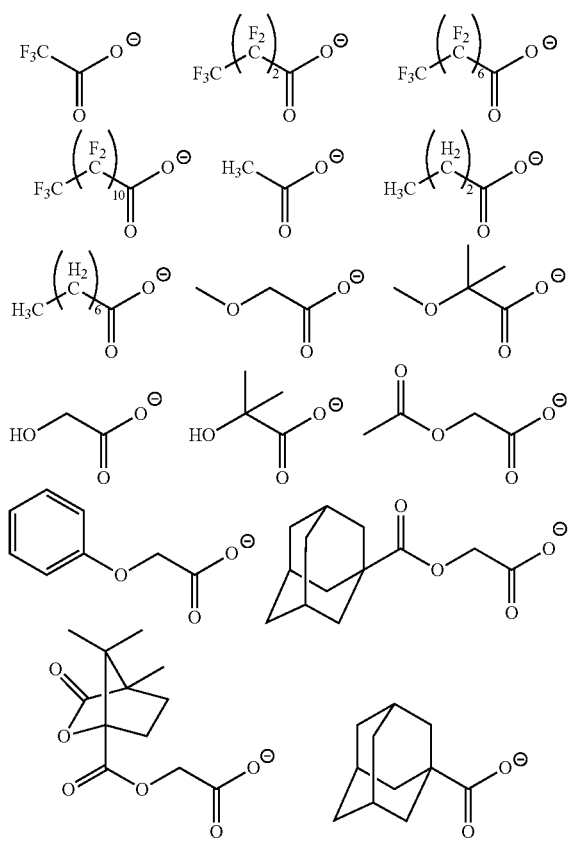

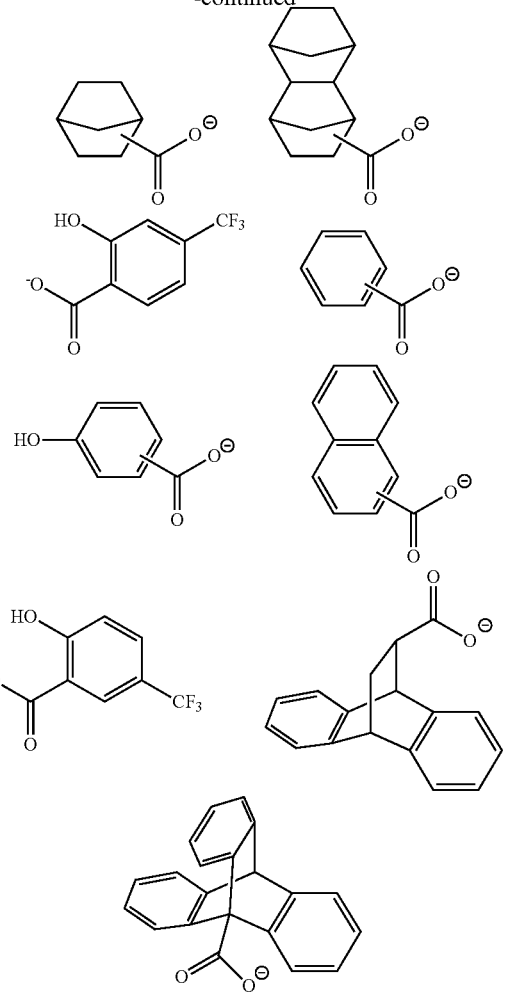

Cation Moiety

In Formula (d1-1), $M'^{m+}$ represents an m-valent onium cation.

Suitable examples of the onium cation of $M'^{m+}$ include the same cations as those each represented by General Formulae (ca-1) to (ca-5).

The component (d1-1) may be used alone or in a combination of two or more kinds thereof.

{Component (d1-2)}

Anion Moiety

In Formula (d1-2), $Rd^2$ represents a cyclic group which may have a substituent, a chain-like alkyl group which may have a substituent, or a chain-like alkenyl group which may have a substituent, and examples thereof include the same group as $R^{101}$ in Formula (b-1) or the like.

Here, the carbon atom adjacent to the S atom in $Rd^2$ has no fluorine atom bonded thereto (the carbon atom adjacent to the S atom in $Rd^2$ is not substituted with a fluorine atom). As a result, the anion of the component (d1-2) becomes an appropriately weak acid anion, thereby improving the quenching ability of the component (D1).

$Rd^2$ is preferably a chain-like alkyl group which may have a substituent or an aliphatic cyclic group which may have a substituent. The chain-like alkyl group preferably has 1 to 10 carbon atoms and more preferably 3 to 10 carbon atoms. The aliphatic cyclic group is more preferably a group (which may have a substituent) in which one or more hydrogen atoms have been removed from adamantane, norbornane, isobornane, tricyclodecane, tetracyclododecane, or the like; and a group in which one or more hydrogen atoms have been removed from camphor or the like.

The hydrocarbon group as $Rd^2$ may have a substituent. Examples of the substituent include the same substituent as that which the hydrocarbon group (an aromatic hydrocarbon group, an aliphatic cyclic group, or a chain-like alkyl group) as $Rd^1$ in Formula (d1-1) may have.

Specific examples of the preferred anion moiety for the component (d1-2) are shown below.

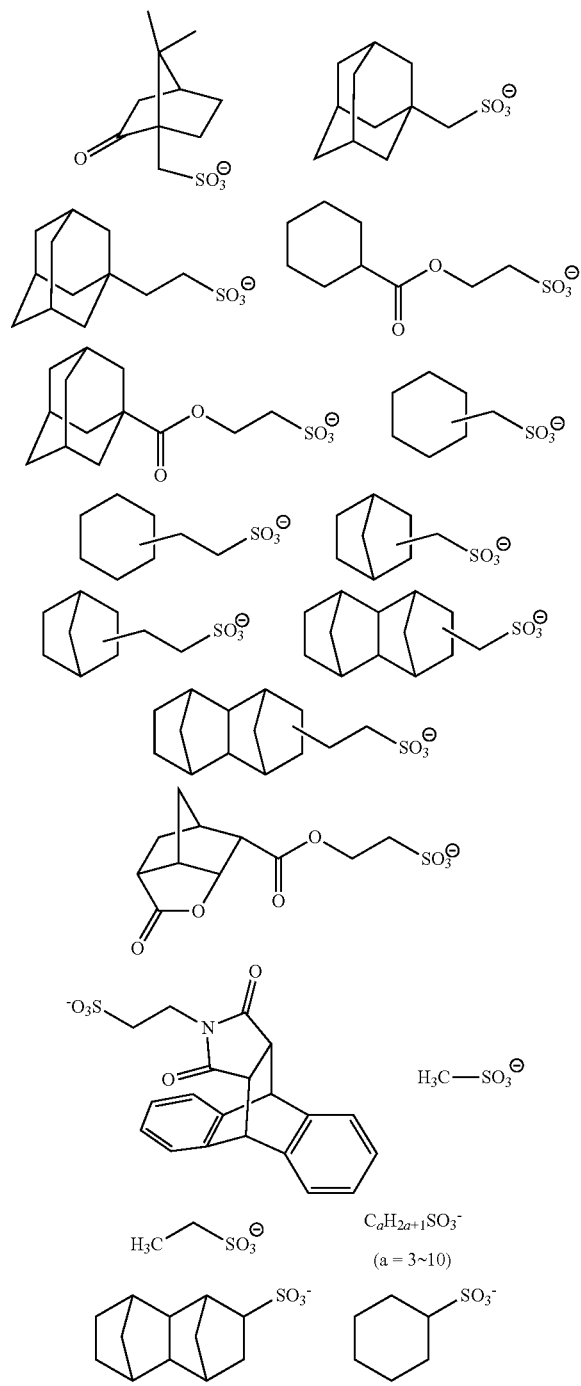

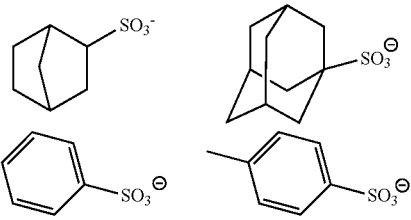

Cation Moiety

In Formula (d1-2), $M'^{m+}$ represents an m-valent onium cation and is the same as $M'^{m+}$ in Formula (d1-1).

The component (d1-2) may be used alone or in a combination of two or more kinds thereof.

{Component (d1-3)}

Anion Moiety

In Formula (d1-3), $Rd^3$ represents a cyclic group which may have a substituent, a chain-like alkyl group which may have a substituent, or a chain-like alkenyl group which may have a substituent, examples thereof include the same groups as $R^{101}$ in Formula (b-1) or the like, and a cyclic group containing a fluorine atom, a chain-like alkyl group, or a chain-like alkenyl group is preferable. Among them, a fluorinated alkyl group is preferable, and the same fluorinated alkyl group as that described above as $Rd^1$ is more preferable.

In Formula (d1-3), $Rd^4$ represents a cyclic group which may have a substituent, a chain-like alkyl group which may have a substituent, or a chain-like alkenyl group which may have a substituent, and examples thereof include the same group as $R^{101}$ in Formula (b-1) or the like.

Among them, an alkyl group which may have a substituent, an alkoxy group which may have a substituent, an alkenyl group which may have a substituent, or a cyclic group which may have a substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. A part of hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same group as $R^{101}$ in Formula (b-1) or the like, and a vinyl group, a propenyl group (an allyl group), a 1-methylpropenyl group, or a 2-methylpropenyl group is preferable. These groups may have an alkyl group having 1 to 5 carbon atoms or a halogenated alkyl group having 1 to 5 carbon atoms as a substituent.

Examples of the cyclic group as $Rd^4$ include the same group as $R^{101}$ in Formula (b-1) or the like, and an alicyclic group in which one or more hydrogen atoms have been removed from a cycloalkane such as cyclopentane, cyclohexane, adamantane, norbornane, isobornane, tricyclodecane or tetracyclododecane or an aromatic group such as a phenyl group or a naphthyl group is preferable. In a case where $Rd^4$ represents an alicyclic group, the resist composition can be satisfactorily dissolved in an organic solvent, thereby improving lithography characteristics.

In Formula (d1-3), $Yd^1$ represents a single bond or a divalent linking group. The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups are the same as those described above as the divalent hydrocarbon group which may have a substituent and the divalent linking group containing a hetero atom described above as the divalent linking group as $Ya^{x1}$ in Formula (a10-1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of the preferred anion moiety for the component (d1-3) are shown below.

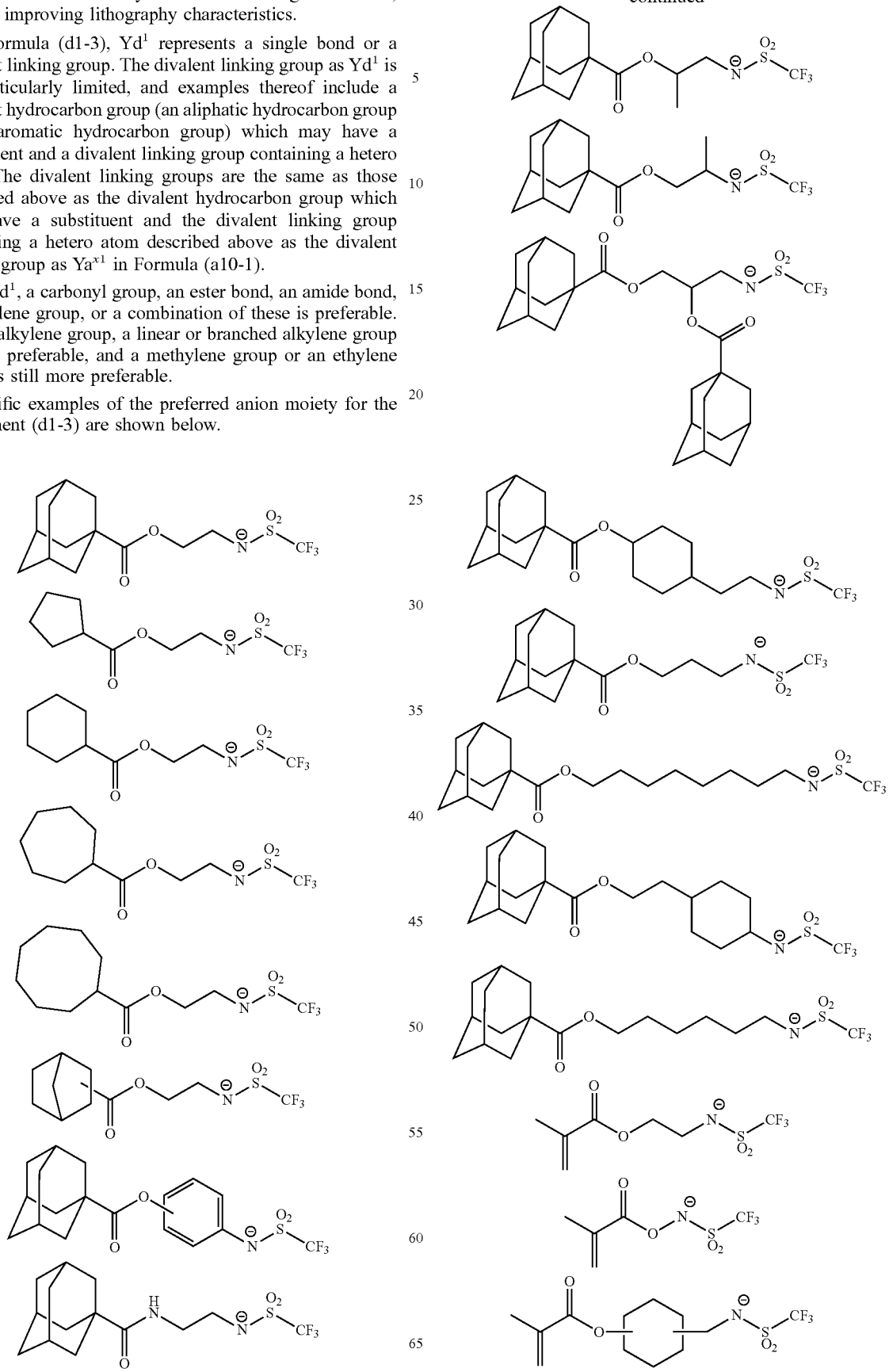

-continued

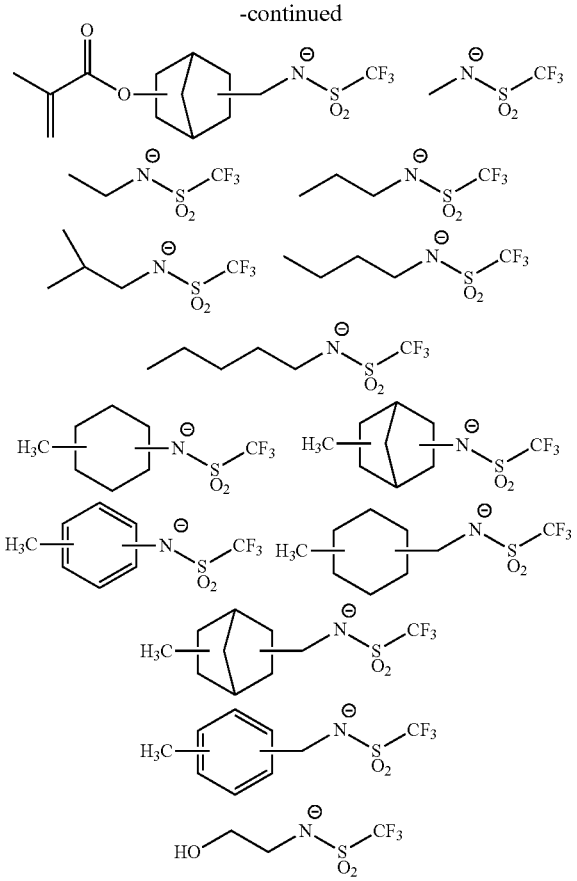

Cation Moiety

In Formula (d1-3), $M'^{m+}$ represents an m-valent onium cation and is the same as $M'^{m+}$ in Formula (d1-1).

The component (d1-3) may be used alone or in a combination of two or more kinds thereof.

As the component (D1), only one of the above-described components (d1-1) to (d-3) or a combination of two or more kinds thereof may be used.

In a case where the resist composition contains the component (D1), the content of the component (D11) in the resist composition is preferably less than 0.5 to 35 parts by mass, more preferably in a range of 1 to 25 parts by mass, still more preferably in a range of 2 to 20 parts by mass, and particularly preferably 3 to 15 parts by mass, with respect to 100 parts by mass of the component (A).

In a case where the content of the component (D1) is equal to or greater than the preferred lower limit, excellent lithography characteristics and an excellent resist pattern shape are easily obtained. On the other hand, in a case where the content of the components (D1) is equal to or less than the upper limit of the preferred range, balance with other components can be obtained, and various lithography characteristics are improved.

Method of Producing Component (D1):

The production methods of the components (d1-1) and (d1-2) are not particularly limited, and the components (d1-1) and (d1-2) can be produced by conventionally known methods.

Further, the method of producing the component (d1-3) is not particularly limited, and the component (d1-3) can be produced in the same manner as disclosed in United States patent application, Publication No. 2012-0149916.

In Regard to Component (D2)

The component (D2) is a base component and is a nitrogen-containing organic compound that acts as an acid diffusion-controlling agent in the resist composition.

The component (D2) is not particularly limited as long as it acts as an acid diffusion-controlling agent and does not correspond to the component (D1), and examples thereof include an aliphatic amine and an aromatic amine.

Among them, the aliphatic amine is preferably a secondary aliphatic amine or a tertiary aliphatic amine.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group having 12 or fewer carbon atoms (alkyl amines or alkyl alcohol amines) and cyclic amines.

Specific examples of alkyl amines and alkyl alcohol amines include monoalkyl amines such as n-hexyl amine, n-heptyl amine, n-octyl amine, n-nonyl amine, and n-decyl amine; dialkyl amines such as diethyl amine, di-n-propyl amine, di-n-heptyl amine, di-n-octyl amine, and dicyclohexyl amine; trialkyl amines such as trimethyl amine, triethyl amine, tri-n-propyl amine, tri-n-butyl amine, tri-n-pentyl amine, tri-n-hexyl amine, tri-n-heptyl amine, tri-n-octyl amine, tri-n-nonyl amine, tri-n-decyl amine, and tri-n-dodecyl amine; and alkylalcoholamines such as diethanol amine, triethanol amine, diisopropanol amine, triisopropanol amine, di-n-octanol amine, and tri-n-octanol amine. Among these, trialkyl amines of 5 to 10 carbon atoms are preferable, and tri-n-pentyl amine and tri-n-octyl amine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine. The aliphatic polycyclic amine preferably has 6 to 10 carbon atoms, and specific examples thereof include 1, 5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanol amine triacetate, and triethanol amine triacetate is preferable.

Examples of aromatic amines include 4-dimethylaminopyridine, pyrrole, indole, pyrazole, imidazole, and derivatives thereof, tribenzyl amine, an aniline compound, and N-tert-butoxycarbonylpyrrolidine.

The component (D2) may be used alone or in a combination of two or more kinds thereof. Among the above, the component (D2) is preferably an aromatic amine and more preferably an aniline compound. Examples of the aniline compound include 2,6-diisopropylaniline, N,N-dimethylaniline, N,N-dibutylaniline, and N,N-dihexylaniline.

In a case where the resist composition contains the component (D2), the component (D2) in the resist composition is typically used in a range of 0.01 to 5 parts by mass with respect to 100 parts by mass of the component (A). In a case of being set to the preferred range described above, balance with other components can be obtained, and various lithography characteristics are improved.

<<At Least One Compound (E) Selected from the Group Consisting of Organic Carboxylic Acid, Phosphorus Oxo Acid, and Derivatives Thereof>>

As long as the effects of the present invention are not impaired, the resist composition according to the present embodiment may contain at least one compound (E) (hereinafter referred to as a "component (E)") selected from the group consisting of an organic carboxylic acid other than the component (E1), and a phosphorus oxo acid and a derivative thereof.

Suitable examples of the organic carboxylic acids include acetic acid, malonic acid, citric acid, malic acid, succinic acid, benzoic acid, and salicylic acid.

Examples of phosphorus oxo acid include phosphoric acid, phosphonic acid, and phosphinic acid.

Among these, phosphonic acid is particularly preferable.

Examples of phosphorus oxo acid derivatives include esters in which a hydrogen atom in the above-described oxo acids is substituted with a hydrocarbon group.

Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition according to the present embodiment, the component (E) may be used alone or in a combination of two or more kinds thereof.

In a case where the resist composition contains the component (E), the content of the component (E) is typically in a range of 0.01 to 5 parts by mass with respect to 100 parts by mass of the component (A).

<<Fluorine Additive Component (F)>>

The resist composition according to the present embodiment may further include a fluorine additive component (hereinafter, referred to as a "component (F)") in order to impart water repellency to the resist film or to improve lithography characteristics.

As the component (F), a fluorine-containing high-molecular-weight compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be mentioned.

Specific examples of the component (F) include polymers having a constitutional unit (f1) represented by General Formula (f1-1) shown below. This polymer is preferably a polymer (homopolymer) consisting of a constitutional unit (f1) represented by Formula (f1-1) shown below; a copolymer of the constitutional unit (f1) and the constitutional unit (a1); and a copolymer of the constitutional unit (f1), a constitutional unit derived from acrylic acid or methacrylic acid, and the above-described constitutional unit (a1). As the constitutional unit (a1) to be copolymerized with the constitutional unit (f1), a constitutional unit derived from 1-ethyl-1-cyclooctyl (meth)acrylate and a constitutional unit derived from 1-methyl-1-adamantyl (meth)acrylate are preferable.

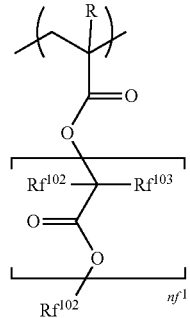

(f1-1)

[In the formula, R has the same definition as described above.

$Rf^{102}$ and $Rf^{103}$ each independently represents a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer of 0 to 5. $Rf^{101}$ represents an organic group containing a fluorine atom.]

In Formula (f1-1), R bonded to the carbon atom at the α-position has the same definition as described above. As R, a hydrogen atom or a methyl group is preferable.

In Formula (f1-1), examples of the halogen atom as $Rf^{102}$ and $Rf^{103}$ include a fluorine atom, a chlorine atom, a bromine atom, and an iodine atom, and a fluorine atom is particularly preferable. Examples of the alkyl group having 1 to 5 carbon atoms as $Rf^{102}$ and $Rf^{103}$ include those described above as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which part or all of hydrogen atoms of the above-described alkyl groups of 1 to 5 carbon atoms have been substituted with halogen atoms. Examples of the halogen atom include a fluorine atom, a chlorine atom, a bromine atom and, an iodine atom, and a fluorine atom is particularly preferable. Among these examples, as $Rf^{102}$ and $Rf^{03}$, a hydrogen atom, a fluorine atom, or an alkyl group having 1 to 5 carbon atoms is preferable, and a hydrogen atom, a fluorine atom, a methyl group, or an ethyl group is more preferable.

In Formula (f1-1), $nf^1$ represents an integer of 0 to 5, preferably an integer of 0 to 3, and more preferably an integer of 1 or 2.

In Formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and preferably has 1 to 20 carbon atoms, more preferably 1 to 15 carbon atoms, and particularly preferably 1 to 10 carbon atoms.

In addition, in the hydrocarbon group containing a fluorine atom, 25% or more of the hydrogen atoms in the hydrocarbon group are preferably fluorinated, more preferably 50% or more are fluorinated, and particularly preferably 60% or more are fluorinated since the hydrophobicity of the resist film at the time of dipping exposure increases.

Among these, as $Rf^{101}$, a fluorinated hydrocarbon group having 1 to 6 carbon atoms is more preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are still more preferable.

The weight-average molecular weight (Mw) (based on the polystyrene-equivalent value determined by gel permeation chromatography) of the component (F) is preferably in a range of 1,000 to 50,000, more preferably in a range of 5,000 to 40,000, and most preferably in a range of 10,000 to 30,000. In a case where the weight-average molecular weight is equal to or lower than the upper limit of the above-described range, the component (F) exhibits sufficiently satisfactory solubility in a solvent for a resist to be used as a resist composition. On the other hand, in a case where the weight-average molecular weight is equal to or greater than the lower limit of the above-described range, water repellency of the resist film is excellent.

Further, the dispersity (Mw/Mn) of the component (F) is preferably in a range of 1.0 to 5.0, more preferably in a range of 1.0 to 3.0, and most preferably in a range of 1.0 to 2.5.

In the resist composition according to the present embodiment, the component (F) may be used alone or in a combination of two or more kinds thereof.

In a case where the resist composition contains the component (F), the content of the component (F) is typically at a proportion of 0.5 to 10 parts by mass, with respect to 100 parts by mass of the component (A).

<<Organic Solvent Component (S)>>

The resist composition according to the present embodiment may be produced by dissolving the resist materials in an organic solvent (hereinafter, referred to as a "component (S)").

The component (S) may be any organic solvent which can dissolve the respective components to be used to obtain a uniform solution, and optional organic solvent can be suitably selected from those which are conventionally known as solvents for a chemical amplification-type resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether (such as monomethyl ether, monoethyl ether, monopropyl ether or monobutyl ether) or monophenyl ether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene and mesitylene; and dimethylsulfoxide (DMSO).

In the resist composition according to the present embodiment, the component (S) may be used alone or as a mixed solvent of two or more kinds thereof. Among these, PGMEA, PGME, γ-butyrolactone, EL, and cyclohexanone are preferable.

Further, a mixed solvent obtained by mixing PGMEA with a polar solvent is also preferable as the component (S). The blending ratio (mass ratio) of the mixed solvent can be suitably determined, taking into consideration the compatibility of the PGMEA with the polar solvent, but is preferably in the range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME, and cyclohexanone is also preferable.

Further, as the component (S), a mixed solvent of at least one selected from PGMEA and EL and γ-butyrolactone is also preferable. In this case, as the mixing ratio, the mass ratio of the former to the latter is preferably in a range of 70:30 to 95:5.

The amount of the component (S) to be used is not particularly limited and is suitably set, depending on the thickness of a film to be coated, to a concentration at which the component (S) can be applied onto a substrate or the like. Generally, the component (S) is used such that the concentration of the solid content of the resist composition is in the range of 0.1% to 20% by mass and preferably 0.2% to 15% by mass.

As desired, other miscible additives can also be added to the resist composition according to the present embodiment. For example, for improving the performance of the resist film, an additive resin, a dissolution inhibitor, a plasticizer, a stabilizer, a colorant, a halation prevention agent, and a dye can be suitably contained therein.

After dissolving the resist material in the component (S), the resist composition according to the present embodiment may be subjected to removal of impurities and the like by using a porous polyimide film, a porous polyamideimide film, or the like. For example, the resist composition may be filtered using a filter made of a porous polyimide film, a filter made of a porous polyamideimide film, or a filter made of a porous polyimide film and a porous polyamideimide film. Examples of the porous polyimide film and the porous polyamideimide film include those described in Japanese Unexamined Patent Application, First Publication No. 2016-155121.

The resist composition according to the present embodiment described above contains the compound (E1) represented by General Formula (e1). Since the component (E1) has a carboxy group and a triple bond, acidity is appropriately controlled. As a result, it is possible to improve lithography characteristics such as roughness and a pattern shape.

(Method of Forming Resist Pattern) The method of forming a resist pattern according to the present embodiment is a method including a step of forming a resist film on a support using the resist composition according to the embodiment described above, a step of exposing the resist film, and a step of developing the exposed resist film to form a resist pattern.

Examples of one embodiment of such a method of forming a resist pattern include a method of forming a resist pattern performed as described below.

First, the resist composition of the above-described embodiment is applied onto a support with a spinner or the like, and a baking (post-apply baking (PAB)) treatment is performed, for example, at a temperature condition of 80° C. to 150° C. for 40 to 120 seconds, preferably for 60 to 90 seconds to form a resist film.

Following the selective exposure performed on the resist film by, for example, exposure through a mask (mask pattern) having a predetermined pattern formed on the mask by using an exposure apparatus such as an electron beam lithography apparatus or an EUV lithography apparatus, or direct irradiation of the resist film for drawing with an electron beam without using a mask pattern, baking treatment (post-exposure baking (PEB)) is performed, for example, under a temperature condition of 80° C. to 150° C. for 40 to 120 seconds and preferably 60 to 90 seconds.

Next, the resist film is subjected to a developing treatment. The developing treatment is performed using an alkali developing solution in a case of an alkali developing process, and a developing solution containing an organic solvent (organic developing solution) in a case of a solvent developing process.

After the developing treatment, it is preferable to conduct a rinse treatment. As the rinse treatment, water rinsing using pure water is preferable in a case of an alkali developing process, and rinsing using a rinse liquid containing an organic solvent is preferable in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, baking treatment (post-baking) can be performed following the developing treatment.

In this manner, a resist pattern can be formed.

The support is not specifically limited and a conventionally known support can be used.

For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any support having the above-described substrate on which an inorganic and/or organic film is provided may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, the multilayer resist method is a method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be performed using radiation such as an ArF excimer laser, a KrF excimer laser, an $F_2$ excimer laser, extreme ultraviolet (EUV) rays, vacuum ultraviolet (VUV) rays, electron beams (EB), X-rays, or soft X-rays. The resist composition is highly useful for a KrF excimer laser, an ArF excimer laser, EB, or EUV, more useful for an ArF excimer laser, EB or EUV, and particularly useful for EB or EUV. That is, the method of forming a resist pattern according to the present embodiment is a particularly useful method in a case where the step of exposing the resist film includes an operation of exposing the resist film to extreme ultraviolet (EUV) rays or electron beams (EB).

The exposure of the resist film can be a general exposure (dry exposure) performed in air or an inert gas such as nitrogen, or liquid immersion exposure (liquid immersion lithography).

In liquid immersion lithography, the region between the resist film and the lens at the lowermost position of the lithography apparatus is pre-filled with a solvent (liquid immersion medium) that has a larger refractive index than the refractive index of air, and the exposure (dipping exposure) is performed in this state.

As the liquid immersion medium, a solvent that exhibits a refractive index larger than the refractive index of air but smaller than the refractive index of the resist film to be exposed is preferable. The refractive index of the solvent is not particularly limited as long as it satisfies the above-described requirements.

Examples of the solvent which exhibits a refractive index that is larger than the refractive index of air but smaller than the refractive index of the resist film include water, fluorine-based inert liquids, silicone-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, and the boiling point is preferably in a range of 70 to 180° C. and more preferably in a range of 80° to 160° C. A fluorine-based inert liquid having a boiling point in the above-described range is advantageous in that removing the medium used in the liquid immersion after the exposure can be performed by a simple method.

As a fluorine-based inert liquid, a perfluoroalkyl compound in which all of the hydrogen atoms of the alkyl group are substituted with fluorine atoms is particularly preferable. Examples of these perfluoroalkyl compounds include perfluoroalkyl ether compounds and perfluoroalkyl amine compounds.

Specifically, an example of a suitable perfluoroalkyl ether compound is perfluoro(2-butyl-tetrahydrofuran) (boiling point of 102° C.), and an example of a suitable perfluoroalkyl amine compound is perfluorotributyl amine (boiling point of 174° C.).

As the liquid immersion medium, water is preferable in terms of cost, safety, environment, and versatility.

As an example of the alkali developing solution used for a developing treatment in an alkali developing process, a 0.1 to 10% by mass aqueous solution of tetramethylammonium hydroxide (TMAH) can be mentioned.

The organic solvent contained in the organic developing solution, which is used for a developing treatment in a solvent developing process, may be any organic solvent as long as it can dissolve the component (A) (component (A) before exposure) and can be suitably selected from the conventionally known organic solvents. Specific examples of the organic solvent include polar solvents such as a ketone-based solvent, an ester-based solvent, an alcohol-based solvent, a nitrile-based solvent, an amide-based solvent, and an ether-based solvent, and hydrocarbon-based solvents.

A ketone-based solvent is an organic solvent containing C—C(=O)—C in the structure thereof. An ester-based solvent is an organic solvent containing C—C(=O)—O—C in the structure thereof. An alcohol-based solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile-based solvent is an organic solvent containing a nitrile group in the structure thereof. An amide-based solvent is an organic solvent containing an amide group in the structure thereof. An ether-based solvent is an organic solvent containing C—O—C in the structure thereof.

Some organic solvents have a plurality of the functional groups which characterize the above-described solvents in the structure thereof.

In such a case, the organic solvent can be classified as any type of solvent having a characteristic functional group. For example, diethylene glycol monomethyl ether can be classified as an alcohol-based solvent or an ether-based solvent.

A hydrocarbon-based solvent consists of a hydrocarbon which may be halogenated and does not have any substituent other than a halogen atom. Examples of the halogen atom include a fluorine atom, a chlorine atom, a bromine atom, and an iodine atom, and a fluorine atom is preferable.

Among the above, as the organic solvent contained in the organic developing solution, a polar solvent is preferable, and a ketone-based solvent, an ester-based solvent, or a nitrile-based solvent is preferable.

Examples of ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylenecarbonate, γ-butyrolactone and methyl amyl ketone (2-heptanone). Among these examples, the ketone-based solvent is preferably methyl amyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, the ester-based solvent is preferably butyl acetate.

Examples of the nitrile-based solvent include acetonitrile, propionitrile, valeronitrile, and butyronitrile.

As desired, the organic developing solution may have a conventionally known additive blended. Examples of the additive include surfactants. The surfactant is not particularly limited, and for example, an ionic or non-ionic fluorine and/or a silicone-based surfactant can be used. As the surfactant, a non-ionic surfactant is preferable, and a non-ionic fluorine surfactant or a non-ionic silicone-based surfactant is more preferable.

In a case where a surfactant is blended, the amount of the surfactant to be blended is typically 0.001% to 5% by mass, preferably 0.005% to 2% by mass, and more preferably 0.01% to 0.5% by mass with respect to the total amount of the organic developing solution.

The developing treatment can be performed by a conventionally known developing method. Examples thereof include a method in which the support is immersed in the developing solution for a predetermined time (a dip method), a method in which the developing solution is cast upon the surface of the support by surface tension and maintained for a predetermined period (a puddle method), a method in which the developing solution is sprayed onto the surface of the support (spray method), and a method in which a developing solution is continuously ejected from a developing solution-ejecting nozzle and applied to a support which is scanned at a constant rate while being rotated at a constant rate (dynamic dispense method).

As the organic solvent contained in the rinse liquid used in the rinse treatment after the developing treatment in a case of a solvent developing process, an organic solvent hardly dissolving the resist pattern can be suitably selected and used, among the organic solvents mentioned as organic solvents that are used for the organic developing solution. In general, at least one kind of solvent selected from the group consisting of a hydrocarbon-based solvent, a ketone-based solvent, an ester-based solvent, an alcohol-based solvent, an amide-based solvent, and an ether-based solvent is used. Among these, at least one kind of solvent selected from the group consisting of a hydrocarbon-based solvent, a ketone-based solvent, an ester-based solvent, an alcohol-based solvent, and an amide-based solvent is preferable, at least one kind of solvent selected from the group consisting of an alcohol-based solvent and an ester-based solvent is more preferable, and an alcohol-based solvent is particularly preferable.

The alcohol-based solvent used for the rinse liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed thereto. However, in consideration of the development characteristics, the amount of water to be blended in the rinse liquid is preferably 30% by mass or less, more preferably 10% by mass or less, still more preferably 5% by mass or less, and most preferably 3% by mass or less with respect to the total amount of the rinse liquid.

A conventionally known additive can be blended with the rinse liquid as necessary. Examples of the additive include surfactants. As the surfactant, the same surfactant as those described above can be mentioned, a non-ionic surfactant is preferable, and a non-ionic fluorine surfactant or a non-ionic silicone-based surfactant is more preferable.

In a case where a surfactant is blended, the amount of the surfactant to be blended is typically 0.001% to 5% by mass, preferably 0.005% to 2% by mass, and more preferably 0.01% to 0.5% by mass with respect to the total amount of the rinse liquid.

The rinse treatment using a rinse liquid (washing treatment) can be performed by a conventionally known rinse method. Examples of the rinse treatment method include a method in which the rinse liquid is continuously applied to the support while rotating it at a constant rate (rotational coating method), a method in which the support is immersed in the rinse liquid for a predetermined time (dip method), and a method in which the rinse liquid is sprayed onto the surface of the support (spray method).

According to the method of forming a resist pattern according to the present embodiment described above, since the resist composition according to the first embodiment described above is used, it is possible to form a resist pattern excellent in lithography characteristics such as roughness and a pattern shape.

EXAMPLES

Hereinafter, the present invention will be described in more detail based on Examples, but the present invention is not limited to these Examples.

<Preparation of Resist Composition>

Examples 1 to 9 and Comparative Examples 1 to 4

Each of the components shown in Tables 1 and 2 was mixed and dissolved to prepare a resist composition of each Example.

TABLE 1

|  | Component (A) | Component (B) | Component (D) | Component (E1) | Component (E) | Component (S) |
|---|---|---|---|---|---|---|
| Example 1 | (A)-1 [100] | (B)-1 [17.8] | (D)-1 [4.0] | (E1)-1 [5.1] | — | (S)-1 [6,400] |
| Example 2 | (A)-1 [100] | (B)-1 [17.8] | (D)-1 [4.0] | (E1)-2 [5.9] | — | (S)-1 [6,400] |
| Example 3 | (A)-1 [100] | (B)-1 [17.8] | (D)-1 [4.0] | (E1)-3 [5.3] | — | (S)-1 [6,400] |
| Example 4 | (A)-1 [100] | (B)-2 [18.5] | (D)-1 [4.0] | (E1)-1 [5.1] | — | (S)-1 [6,400] |
| Example 5 | (A)-1 [100] | (B)-2 [18.5] | (D)-1 [4.0] | (E1)-2 [5.9] | — | (S)-1 [6,400] |
| Example 6 | (A)-1 [100] | (B)-2 [18.5] | (D)-1 [4.0] | (E1)-3 [5.3] | — | (S)-1 [6,400] |
| Example 7 | (A)-2 [100] | (B)-1 [17.8] | (D)-1 [4.0] | (E1)-1 [5.1] | — | (S)-1 [6,400] |
| Example 8 | (A)-2 [100] | (B)-1 [17.8] | (D)-1 [4.0] | (E1)-3 [5.3] | — | (S)-1 [6,400] |
| Example 9 | (A)-2 [100] | (B)-2 [18.5] | (D)-1 [4.0] | (E1)-3 [5.3] | — | (S)-1 [6,400] |

TABLE 2

|  | Component (A) | Component (B) | Component (D) | Component (E1) | Component (E) | Component (S) |
|---|---|---|---|---|---|---|
| Comparative Example 1 | (A)-1 [100] | (B)-1 [17.8] | (D)-1 [4.0] | — | (E)-1 [5.0] | (S)-1 [6,400] |
| Comparative Example 2 | (A)-1 [100] | (B)-2 [18.5] | (D)-1 [4.0] | — | (E)-1 [5.0] | (S)-1 [6,400] |
| Comparative Example 3 | (A)-2 [100] | (B)-1 [17.8] | (D)-1 [4.0] | — | (E)-1 [5.0] | (S)-1 [6,400] |
| Comparative Example 4 | (A)-2 [100] | (B)-2 [18.5] | (D)-1 [4.0] | — | (E)-1 [5.0] | (S)-1 [6,400] |

In Tables 1 and 2, each abbreviation has the following meaning. The numerical values in the brackets are blending amounts (parts by mass).

(A)-1: a high-molecular-weight compound represented by Chemical Formula (A-1). The standard polystyrene-equivalent weight-average molecular weight (Mw) determined by GPC measurement and the molecular weight dispersity (Mw/Mn) are respectively 6,700 and 1.61. The copolymer compositional ratio (the ratio (molar ratio) among constitutional units in the structural formula) determined by $^{13}$C-NMR is 1/m=55/45.

(A)-2: a high-molecular-weight compound represented by Chemical Formula (A-2). The standard polystyrene-equivalent weight-average molecular weight (Mw) determined by GPC measurement and the molecular weight dispersity (Mw/Mn) are respectively 6,500 and 1.65. The copolymer compositional ratio (the ratio (molar ratio) among constitutional units in the structural formula) determined by $^{13}$C-NMR is 1/m=55/45.

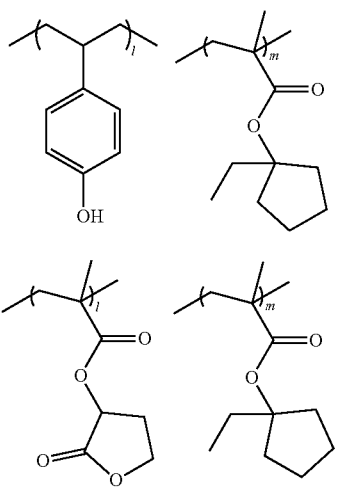

(B)-1 and (B)-2: Compounds respectively represented by Chemical Formulae (B-1 and (B-2) described below.

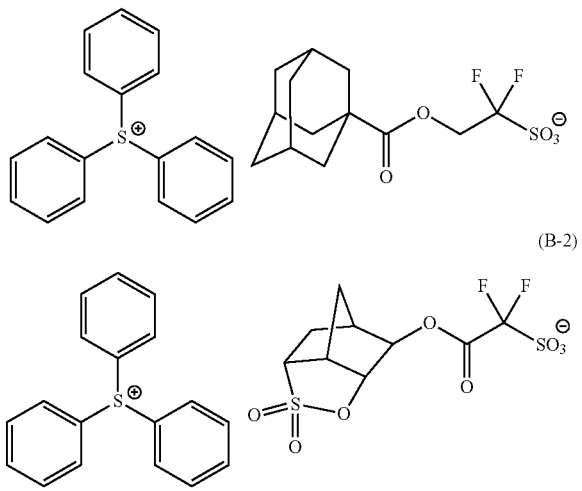

(D)-1: A compound represented by Chemical Formula (D-1).

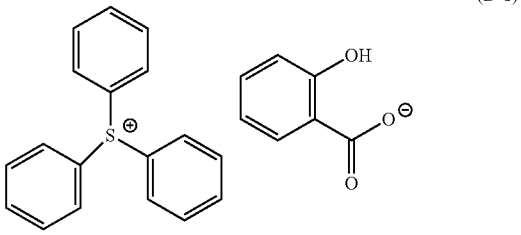

(E1)-1 to 3: Compounds respectively represented by Chemical Formulae (E1-1) to (E1-3).

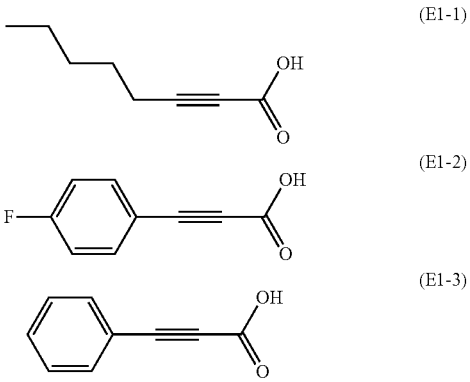

(E)-1: A compound represented by Chemical Formula (E-1).

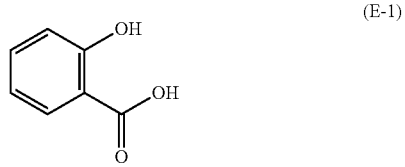

(S)-1: a mixed solvent of propylene glycol monomethyl ether acetate/propylene glycol monomethyl ether=60/40 (mass ratio)

<Formation of Resist Pattern>

Next, the resist composition of each Example was applied onto an 8-inch silicon substrate which had been subjected to a hexamethyldisilazane (HMDS) treatment using a spinner, the coated wafer was subjected to a post-apply baking (PAB) treatment on a hot plate at a temperature of 110° C. for 60 seconds so that the coated wafer was dried to form a resist film having a film thickness of 30 nm.

Next, drawing (exposure) was performed on the resist film by using an electron beam lithography apparatus JEOL-JBX-9300FS (manufactured by JEOL Ltd.), with the target size being set to a line width of 50 nm of a 1:1 line-and-space pattern (hereinafter, referred to as "LS pattern"), at an accelerating voltage of 100 kV, and the post-exposure baking (PEB) treatment was performed at 90° C. for 60 seconds.

Subsequently, alkali development was performed at 23° C. for 60 seconds using a 2.38% by mass tetramethylammonium hydroxide (TMAH) aqueous solution "NMD-3" (trade name, manufactured by TOKYO OHKA KOGYO CO., LTD.). Thereafter, rinsing was performed with pure water for 60 seconds. As a result, a 1:1 LS pattern having a line width of 50 nm was formed.

[Evaluation of Optimum Exposure Amount (Eop)]

According to <Formation of resist pattern> described above, an optimum exposure amount Eop ($\mu C/cm^2$) for forming the LS pattern having the target size (line width of 50 nm) was determined. The results are shown in Tables 3 and 4 as "Eop ($\mu C/cm^2$)".

[Evaluation of Linewise Roughness (LWR)]

3σ of the LS pattern formed in <Formation of resist pattern>, which is a scale indicating LWR, was determined. The results are shown in Tables 3 and 4 as "LWR (nm)".

"3σ" is a triple value of the standard deviation determined from measurement results obtained by measuring 400 line positions in the longitudinal direction of the line with a scanning electron microscope (accelerating voltage: 800V, trade name: S-9380, manufactured by Hitachi High-Tech Corporation). It shows a triple value (3a) (unit: nm) of (σ).

The smaller the value of 36, the smaller the roughness in the line side wall, which means an LS pattern having a more uniform width was obtained.

[Evaluation of LS Pattern Shape]

The LS pattern shape formed in <Formation of resist pattern> was observed using a length measurement SEM (scanning electron microscope, accelerating voltage: 800V, trade name: SU-8000, manufactured by Hitachi High-Tech Corporation) and evaluated based on the following evaluation criteria. The results are shown in Tables 3 to 4 as "Pattern shape".

Evaluation Criteria
A: Rectangular and highly vertical.
B: Rectangular but less vertical than A.
C: T-top shape (the top of the pattern is overhanging)

TABLE 3

| | PAB (° C.) | PEB (° C.) | Eop [$\mu C/m^2$] | LWR (nm) | Pattern shape |
|---|---|---|---|---|---|
| Example 1 | 110 | 90 | 115 | 4.8 | B |
| Example 2 | 110 | 90 | 110 | 4.6 | A |
| Example 3 | 110 | 90 | 105 | 4.4 | B |
| Example 4 | 110 | 90 | 115 | 4.7 | B |
| Example 5 | 110 | 90 | 110 | 4.1 | B |
| Example 6 | 110 | 90 | 110 | 4.3 | A |
| Example 7 | 110 | 90 | 120 | 4.9 | B |
| Example 8 | 110 | 90 | 115 | 4.6 | B |
| Example 9 | 110 | 90 | 120 | 4.7 | B |

TABLE 4

| | PAB (° C.) | PEB (° C.) | Eop [$\mu C/m^2$] | LWR (nm) | Pattern shape |
|---|---|---|---|---|---|
| Comparative Example 1 | 110 | 90 | 115 | 5.7 | C |
| Comparative Example 2 | 110 | 90 | 120 | 5.9 | C |
| Comparative Example 3 | 110 | 90 | 120 | 5.6 | C |
| Comparative Example 4 | 110 | 90 | 110 | 5.8 | C |

From the results shown in Tables 3 and 4, it can be confirmed that the resist compositions of Examples can form a resist pattern excellent in roughness reduction and pattern shape in forming the resist pattern, as compared with the resist compositions of Comparative Examples. While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates an acid upon exposure and whose solubility in a developing solution is changed by action of an acid, the resist composition comprising:
a base material component (A) whose solubility in a developing solution is changed by action of an acid; and
a compound (E1) represented by General Formula (e1),

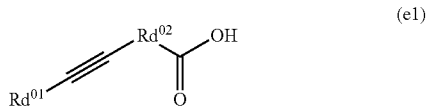

(e1)

wherein $Rd^{o1}$ represents a monovalent organic group having 2 to 15 carbon atoms; and $Rd^{o2}$ represents a single bond or a divalent linking group.

2. The resist composition according to claim 1, wherein $Rd^{o1}$ in General Formula (e1) represents a cyclic hydrocarbon group which may have a substituent.

3. The resist composition according to claim 1, wherein $Rd^{o2}$ in General Formula (e1) represents a single bond.

4. A method of forming a resist pattern, comprising:
forming a resist film on a support using the resist composition according to claim 1;
exposing the resist film; and
developing the exposed resist film to form a resist pattern.

5. The resist composition according to 1, wherein the base material component (A) has a constitutional unit (a1) that includes an acid-decomposable group having a polarity which is increased by action of an acid.

6. A resist composition which generates an acid upon exposure and whose solubility in a developing solution is changed by action of an acid, the resist composition comprising:
a base material component (A) whose solubility in a developing solution is changed by action of an acid; and
a compound (E1) represented by General Formula (e1),

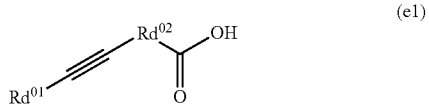

(e1)

wherein $Rd^{o1}$ represents a cyclic hydrocarbon group which may have a substituent; and $Rd^{o2}$ represents a single bond or a divalent linking group.

* * * * *